United States Patent
Fujita et al.

(10) Patent No.: US 12,426,354 B2
(45) Date of Patent: *Sep. 23, 2025

(54) FIELD EFFECT TRANSISTORS WITH REDUCED GATE FRINGE AREA AND METHOD OF MAKING THE SAME

(71) Applicant: SANDISK TECHNOLOGIES, INC., Milpitas, CA (US)

(72) Inventors: Takahito Fujita, Yokkaichi (JP); Kiyokazu Shishido, Yokkaichi (JP); Hiroyuki Ogawa, Nagoya (JP)

(73) Assignee: Sandisk Technologies, Inc., Milpitas, CA (US)

( * ) Notice: Subject to any disclaimer, the term of this patent is extended or adjusted under 35 U.S.C. 154(b) by 980 days.

This patent is subject to a terminal disclaimer.

(21) Appl. No.: 17/529,802

(22) Filed: Nov. 18, 2021

(65) Prior Publication Data

US 2023/0111003 A1  Apr. 13, 2023

Related U.S. Application Data

(63) Continuation-in-part of application No. 17/496,099, filed on Oct. 7, 2021, now Pat. No. 11,710,740.

(51) Int. Cl.
   *H10D 84/83*  (2025.01)
   *H01L 21/762*  (2006.01)
   *H10D 30/01*  (2025.01)

(52) U.S. Cl.
   CPC ....... *H10D 84/83* (2025.01); *H01L 21/76224* (2013.01); *H10D 30/0227* (2025.01)

(58) Field of Classification Search
   CPC .............. H10D 30/601; H10D 64/021; H10D 30/0212; H10D 64/518; H10D 64/662;
   (Continued)

(56) References Cited

U.S. PATENT DOCUMENTS 9,859,422 B2   1/2018   Nishikawa et al.
10,115,735 B2  10/2018  Amano et al.
(Continued)

FOREIGN PATENT DOCUMENTS

KR   10-2016-0044406 A   4/2016
WO   WO2018-160239 A1    9/2018

OTHER PUBLICATIONS

USPTO Office Communication, Notice of Allowance and Fee(s) Due for U.S. Appl. No. 17/496,122, mailed Sep. 18, 2023, 21 pages.
(Continued)

*Primary Examiner* — Fernando L Toledo
*Assistant Examiner* — Adam S Bowen
(74) *Attorney, Agent, or Firm* — THE MARBURY LAW GROUP PLLC

(57) ABSTRACT

A semiconductor structure includes at least two field effect transistors. A gate strip including a plurality of gate dielectrics and a gate electrode strip can be formed over a plurality of semiconductor active regions. Deep source/drain regions are formed by implanting dopants into semiconductor active regions without implanting the dopants into inter-electrode regions of a shallow trench isolation structure. The gate strip is divided into gate stacks prior to or after formation of the deep source/drain regions.

20 Claims, 35 Drawing Sheets

(58) Field of Classification Search
CPC ............. H10D 84/0151; H10D 84/038; H10D 84/0147
See application file for complete search history.

(56) References Cited

U.S. PATENT DOCUMENTS

| | | | |
|---|---|---|---|
| 10,224,407 | B2 | 3/2019 | Chowdhury et al. |
| 10,256,099 | B1 | 4/2019 | Akaiwa et al. |
| 10,355,017 | B1 | 7/2019 | Nakatsuji et al. |
| 10,355,100 | B1 | 7/2019 | Ueda et al. |
| 10,770,459 | B2 | 9/2020 | Iwata et al. |
| 10,910,020 | B1 | 2/2021 | Kodate et al. |
| 11,004,974 | B1 | 5/2021 | Takimoto |
| 2010/0314690 | A1 | 12/2010 | Chung et al. |
| 2015/0076616 | A1 | 3/2015 | Jeong et al. |
| 2016/0351709 | A1 | 12/2016 | Nishikawa et al. |
| 2018/0247954 | A1 | 8/2018 | Amano et al. |
| 2018/0248013 | A1 | 8/2018 | Chowdhury et al. |
| 2018/0331118 | A1 | 11/2018 | Amano |
| 2019/0296012 | A1 | 9/2019 | Iwata et al. |
| 2020/0091157 | A1* | 3/2020 | Nakatsuji ............ H10D 84/0144 |
| 2021/0280686 | A1 | 9/2021 | Amano et al. |

OTHER PUBLICATIONS

U.S. Appl. No. 16/901,091, filed Jun. 15, 2020, SanDisk Technologies, LLC.
U.S. Appl. No. 17/007,761, filed Aug. 28, 2020, SanDisk Technologies, LLC.
U.S. Appl. No. 17/007,823, filed Aug. 31, 2020, SanDisk Technologies, LLC.
U.S. Appl. No. 17/063,084, filed Oct. 5, 2020, SanDisk Technologies, LLC.
U.S. Appl. No. 17/063,145, filed Oct. 5, 2020, SanDisk Technologies, LLC.
U.S. Appl. No. 17/063,182, filed Oct. 5, 2020, SanDisk Technologies, LLC.
U.S. Appl. No. 17/188,271, filed Mar. 1, 2021, SanDisk Technologies, LLC.
U.S. Appl. No. 17/316,015, filed May 10, 2021, SanDisk Technologies, LLC.
U.S. Appl. No. 17/316,079, filed May 10, 2021, SanDisk Technologies, LLC.
U.S. Appl. No. 17/348,305, filed Jun. 15, 2021, SanDisk Technologies, LLC.
U.S. Appl. No. 17/348,328, filed Jun. 15, 2021, SanDisk Technologies, LLC.
U.S. Appl. No. 17/362,121, filed Jun. 29, 2021, SanDisk Technologies, LLC.
U.S. Appl. No. 17/474,699, filed Sep. 14, 2021, SanDisk Technologies, LLC.
U.S. Appl. No. 17/474,760, filed Sep. 14, 2021, SanDisk Technologies, LLC.
U.S. Appl. No. 17/496,099, filed Oct. 7, 2021, SanDisk Technologies, LLC.
U.S. Appl. No. 17/496,122, filed Oct. 7, 2021, SanDisk Technologies, LLC.
ISR—Notification of Transmittal of The International Search Report and Written Opinion of the International Searching Authority for International Patent Application No. PCT/US2022/29016, mailed Apr. 24, 2023, 11 pages.

* cited by examiner

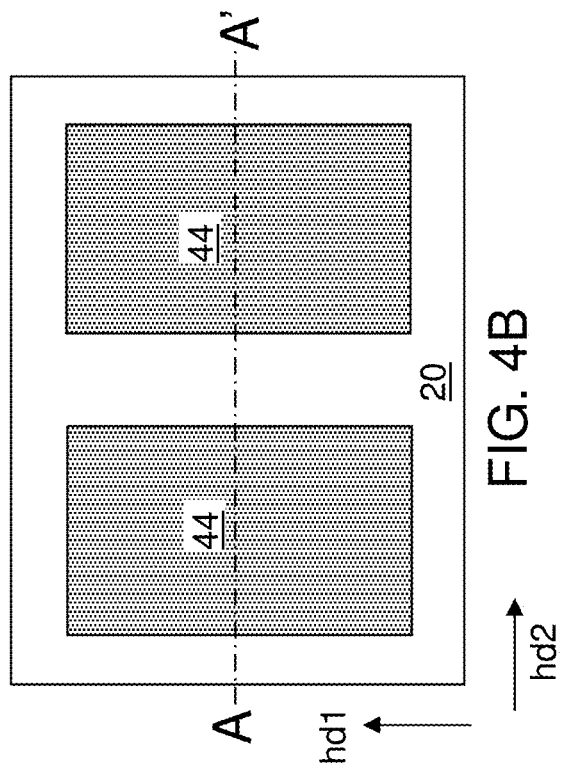
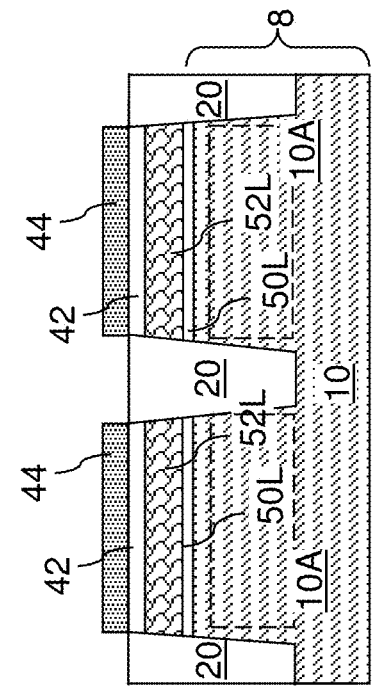
FIG. 3A
FIG. 3B
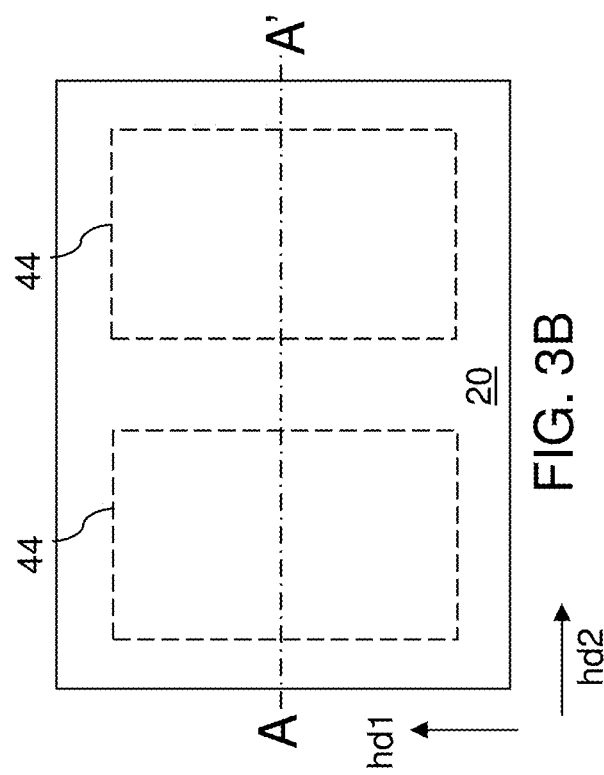
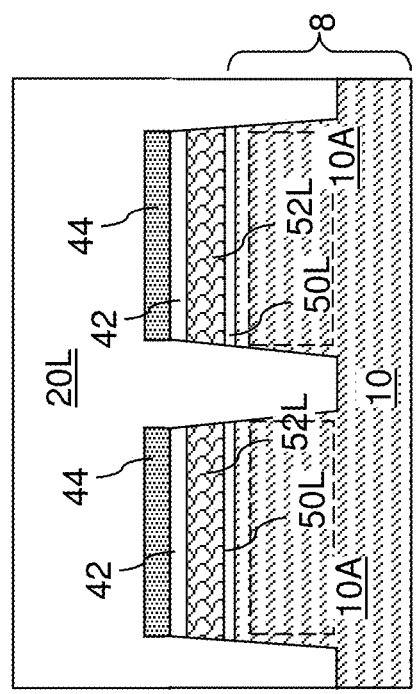
FIG. 4A
FIG. 4B

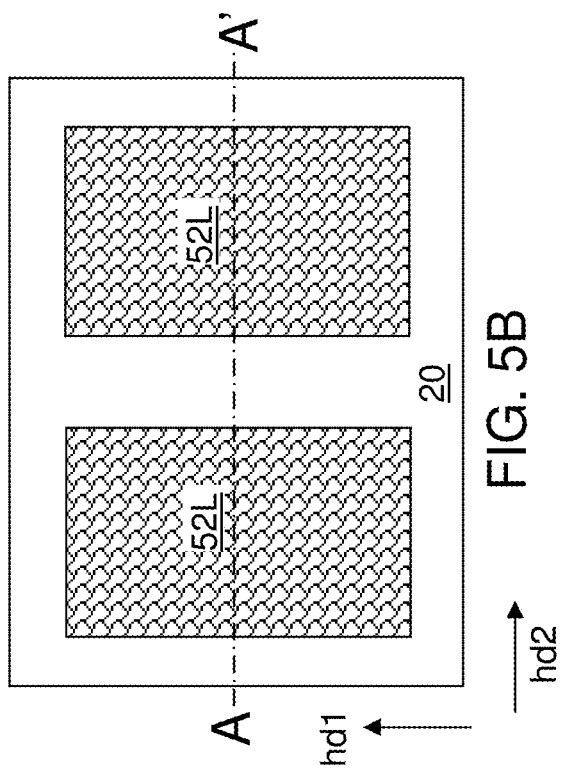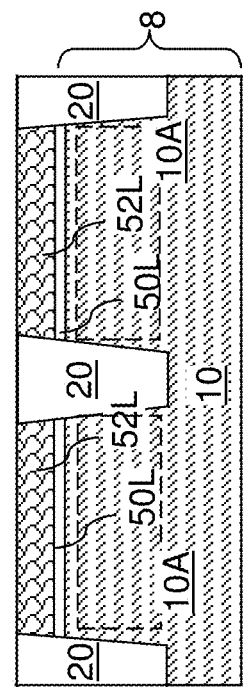
FIG. 5B
FIG. 6B
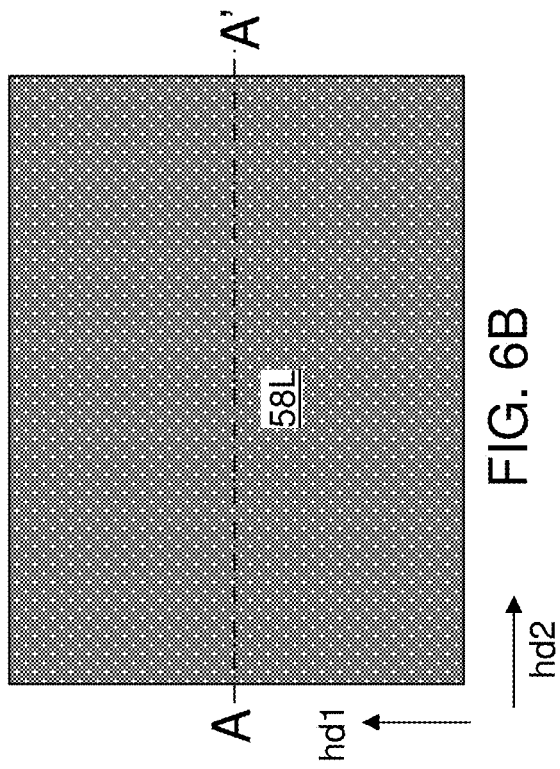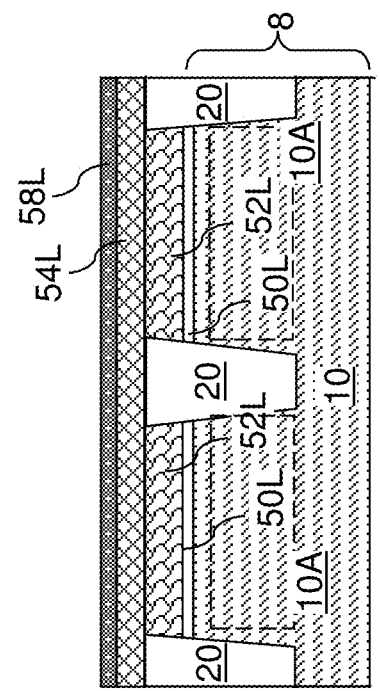
FIG. 5A
FIG. 6A

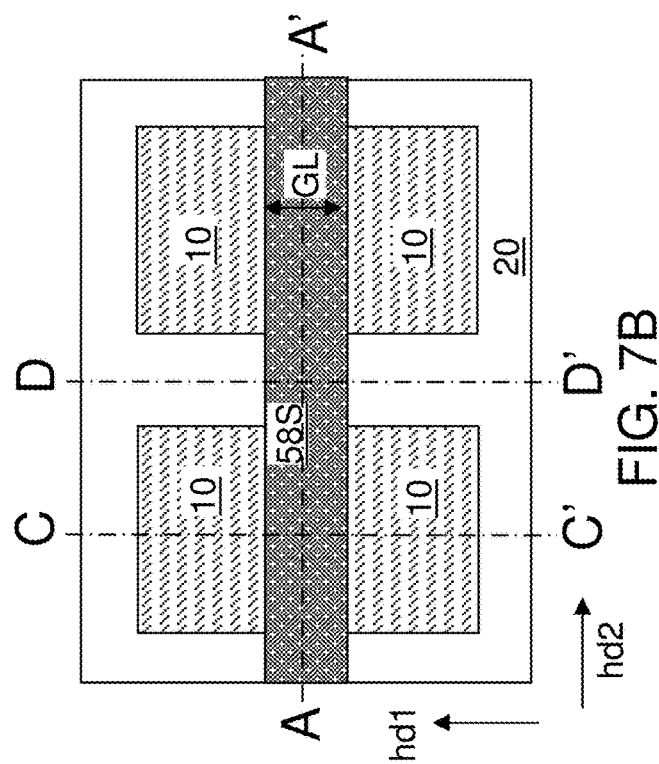
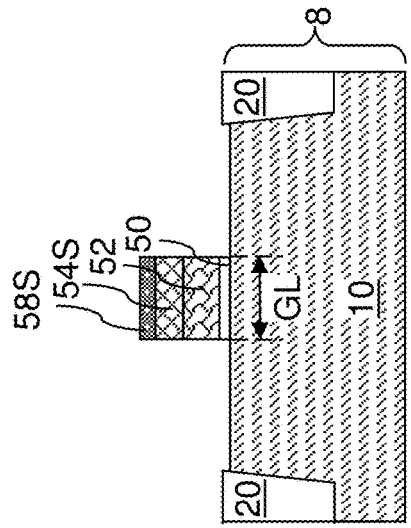
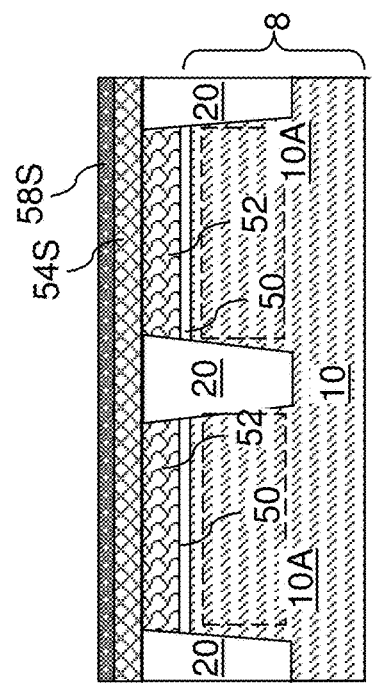
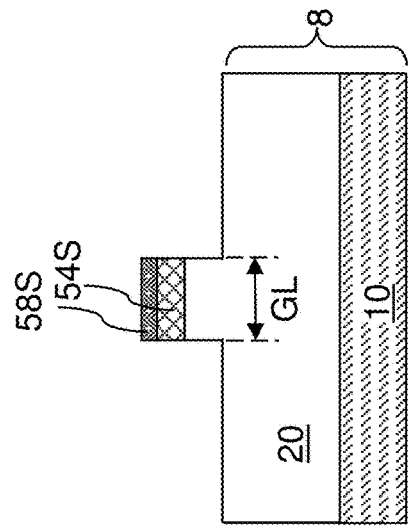

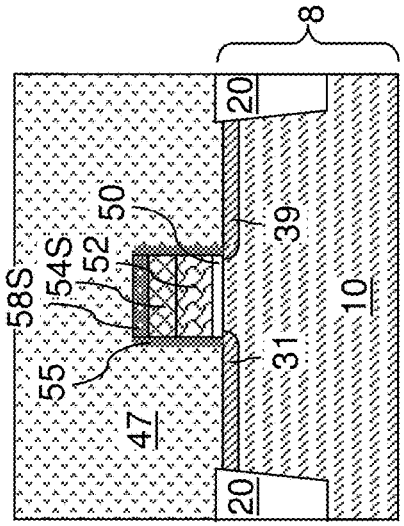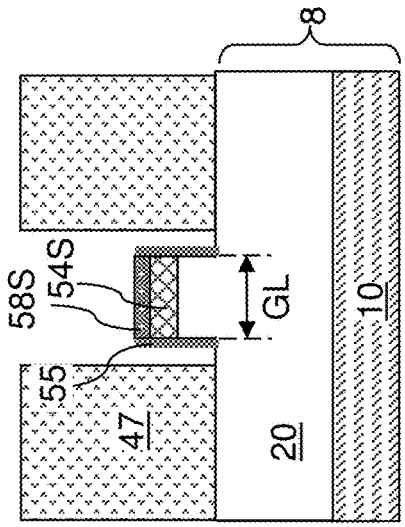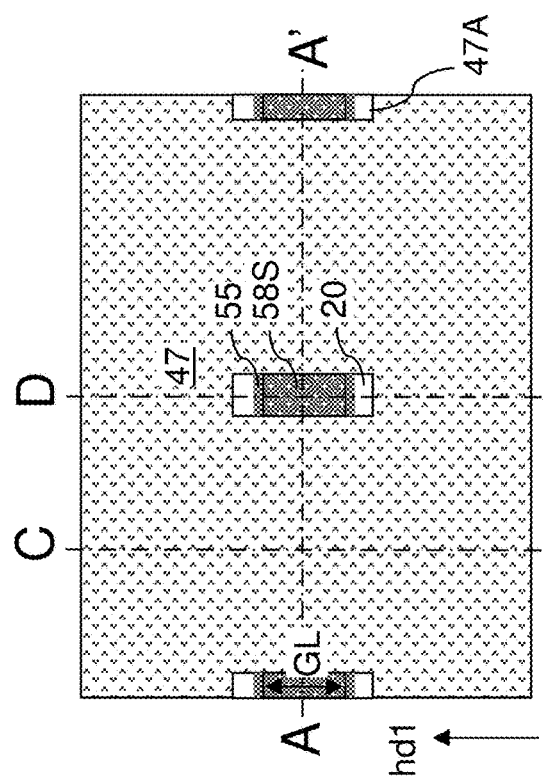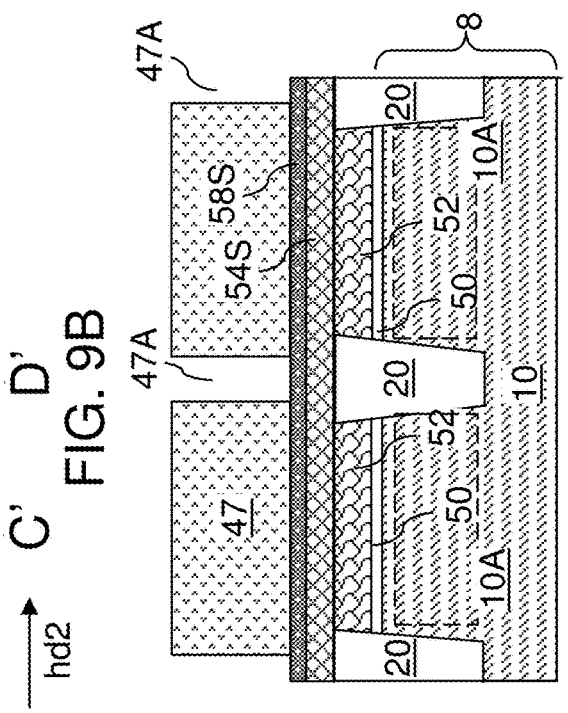

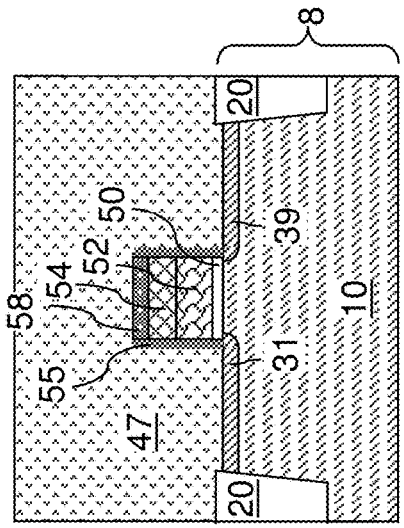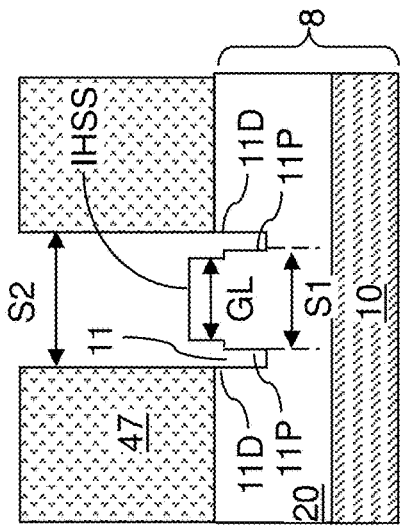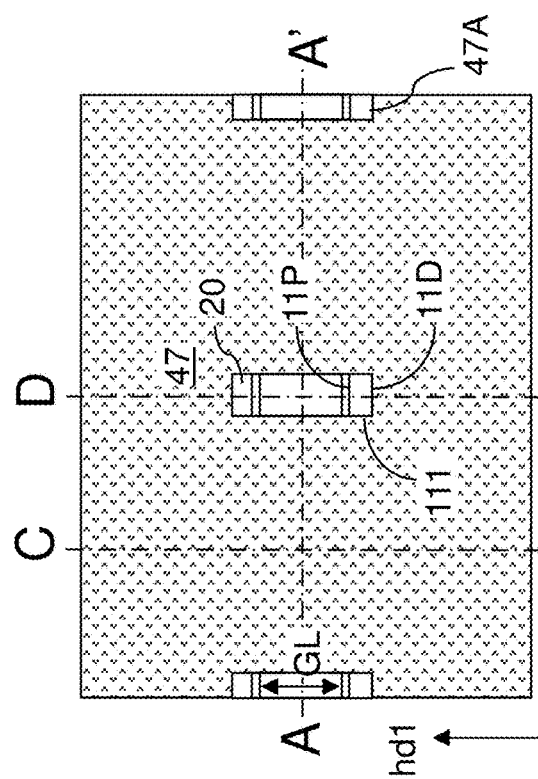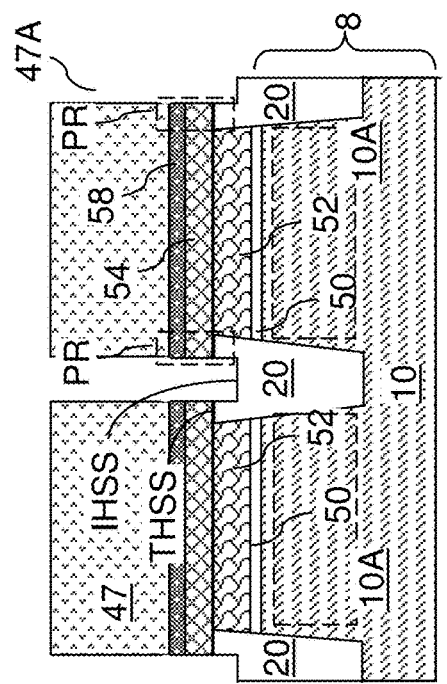

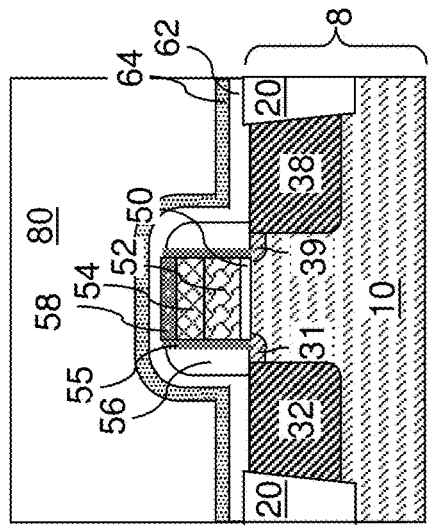
FIG. 13C
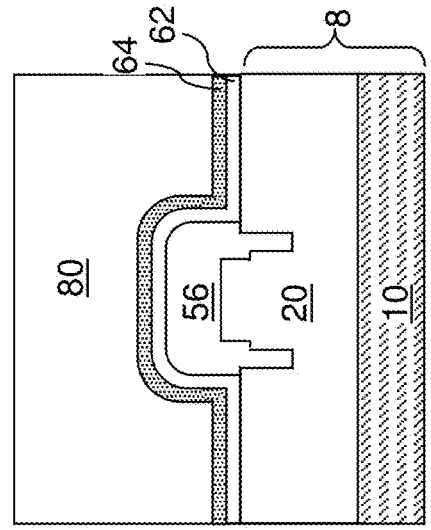
FIG. 13D
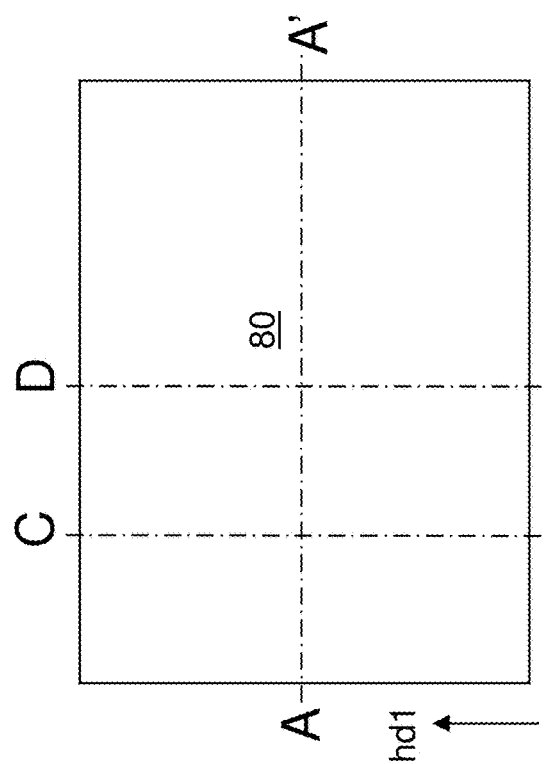
FIG. 13B
FIG. 13A
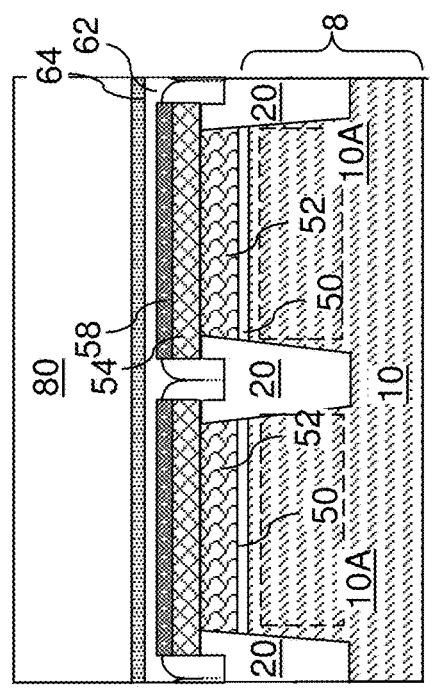

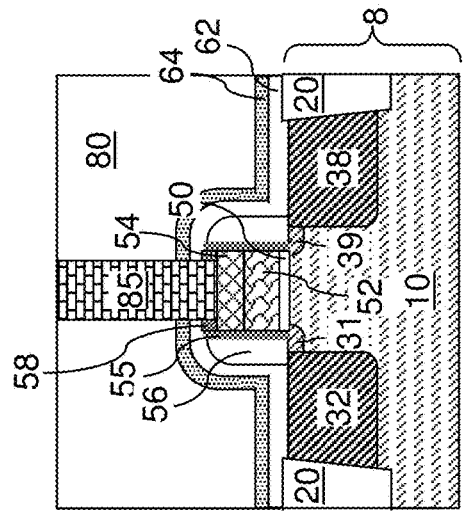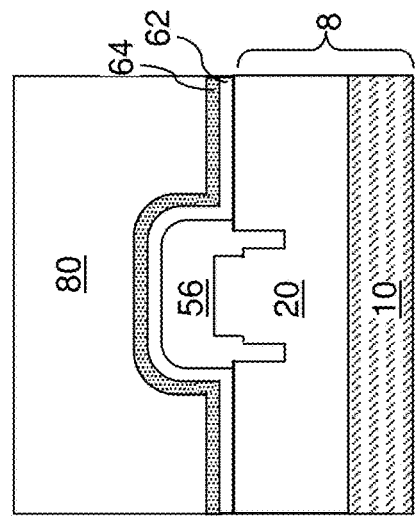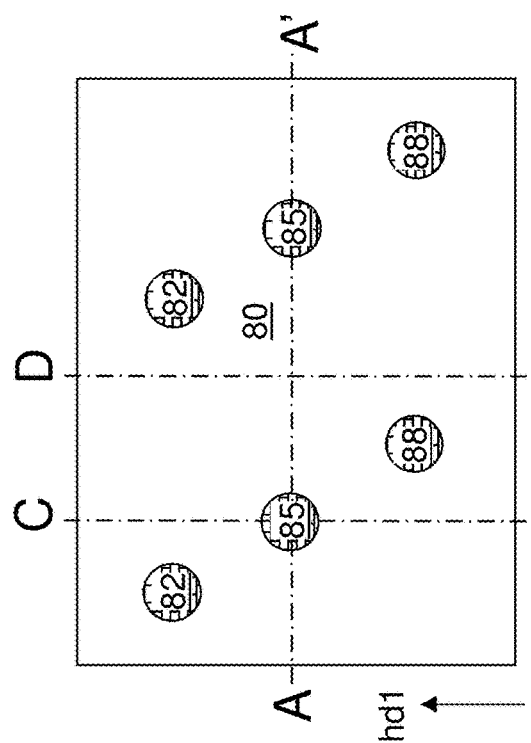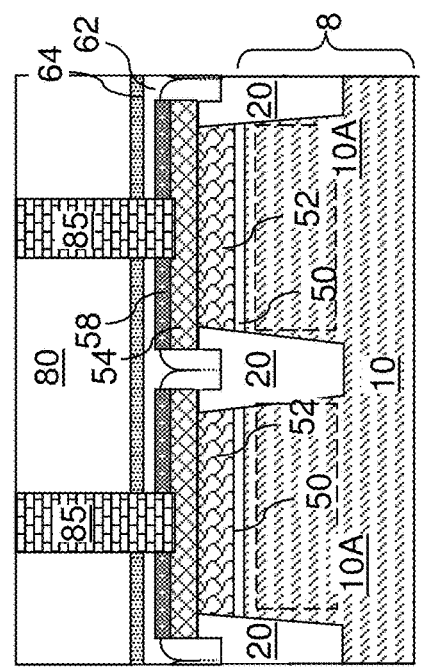
FIG. 14C
FIG. 14D
FIG. 14B
FIG. 14A

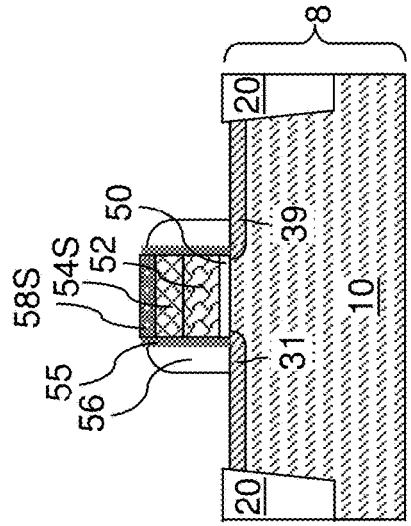
FIG. 15C
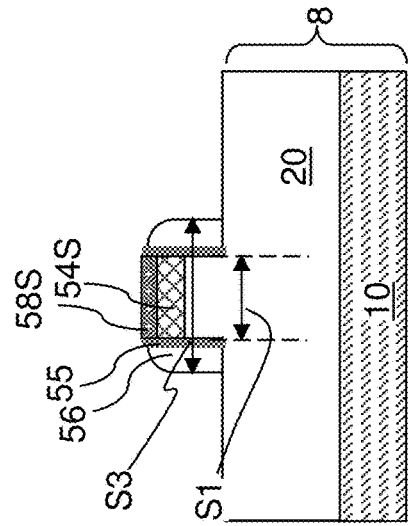
FIG. 15D
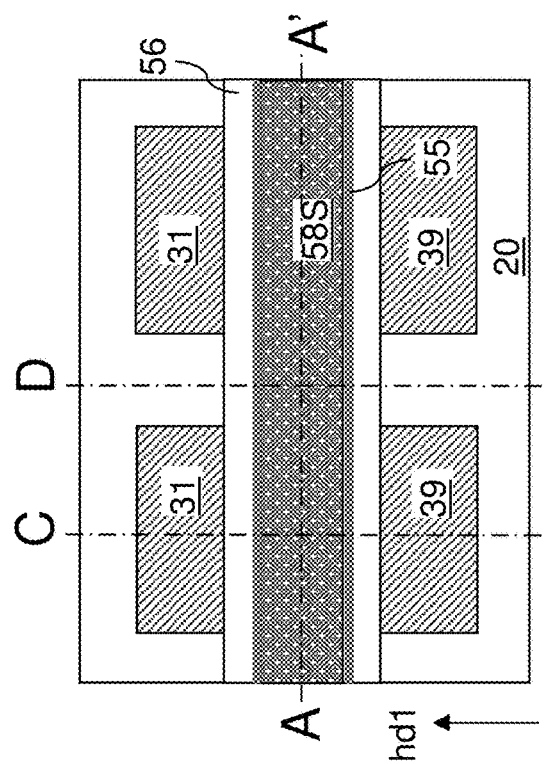
FIG. 15B
FIG. 15A
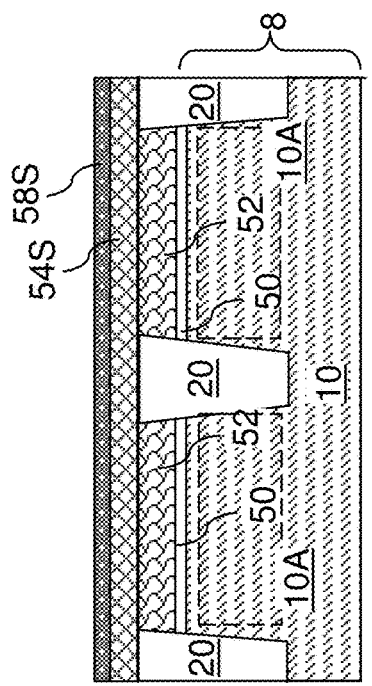

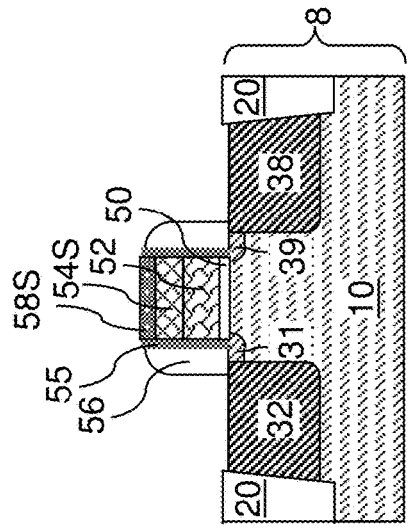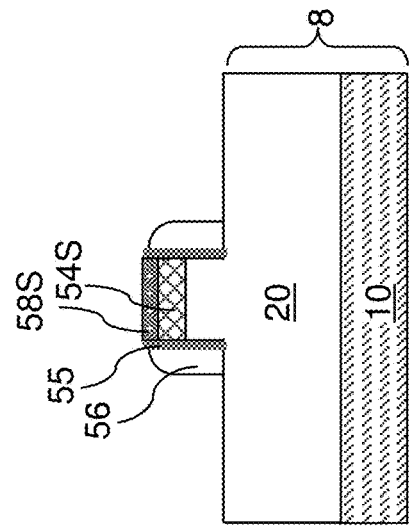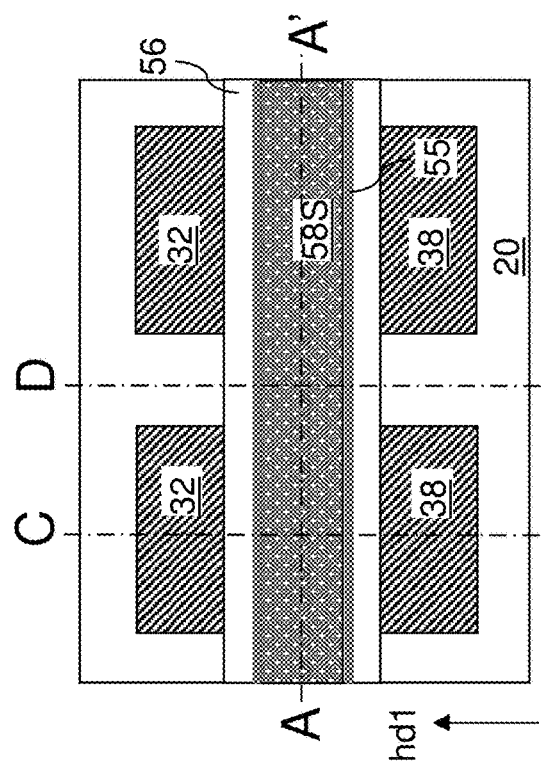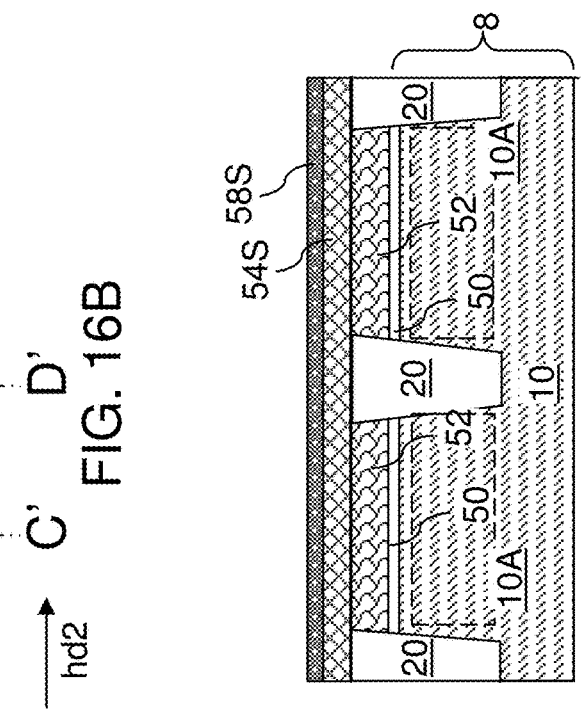
FIG. 16C
FIG. 16D
FIG. 16B
FIG. 16A

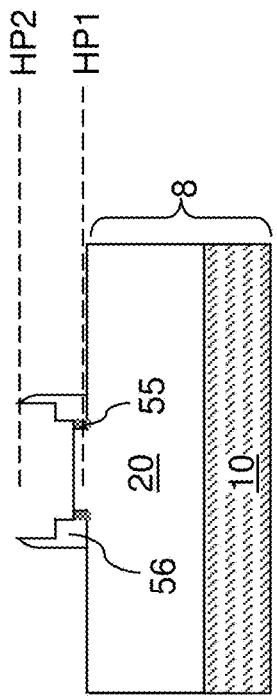
FIG. 19C
FIG. 19D
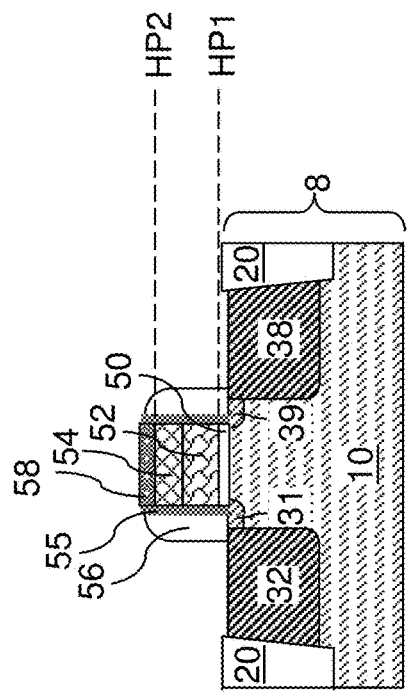
FIG. 19B
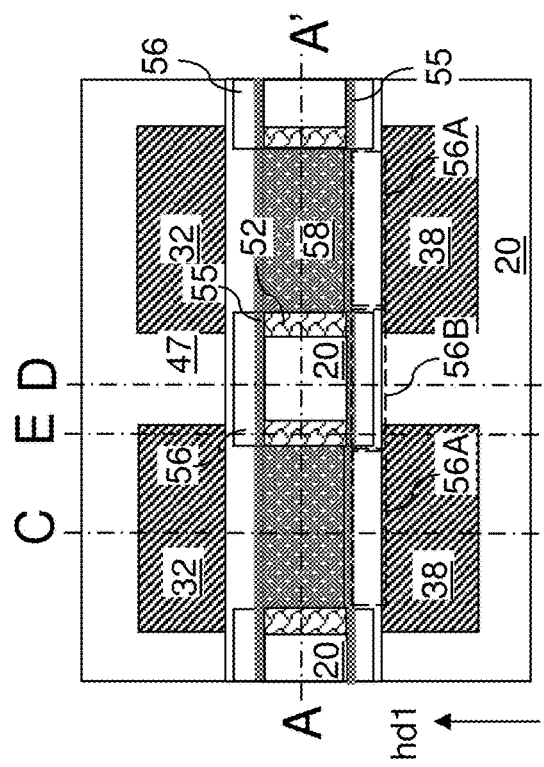
FIG. 19A

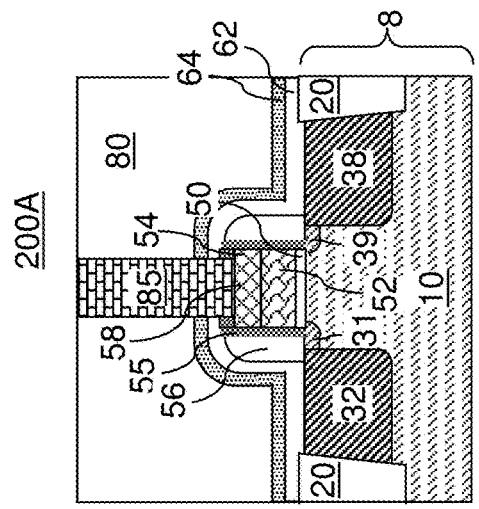
FIG. 20C
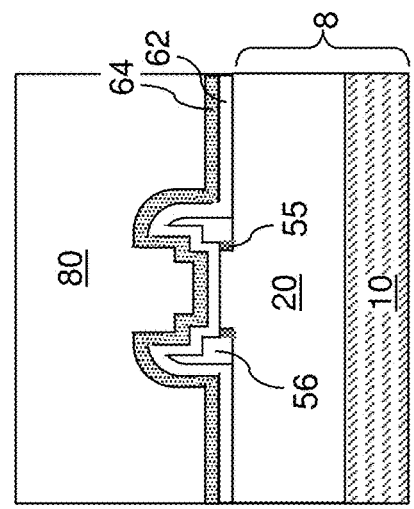
FIG. 20D
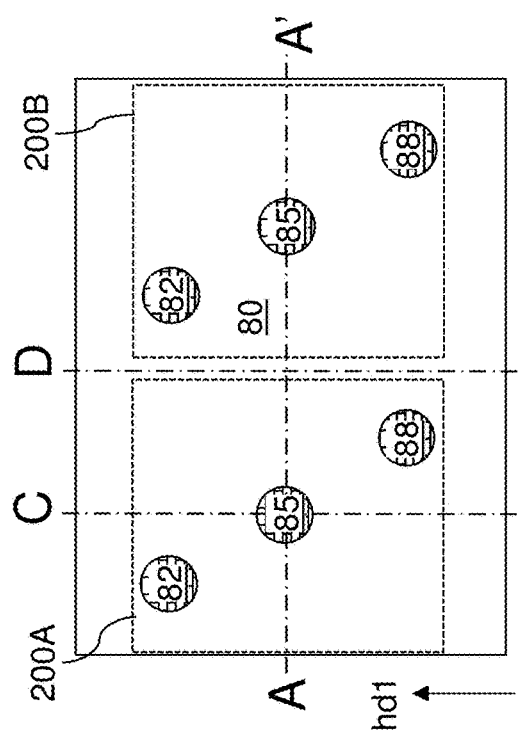
FIG. 20B
FIG. 20A
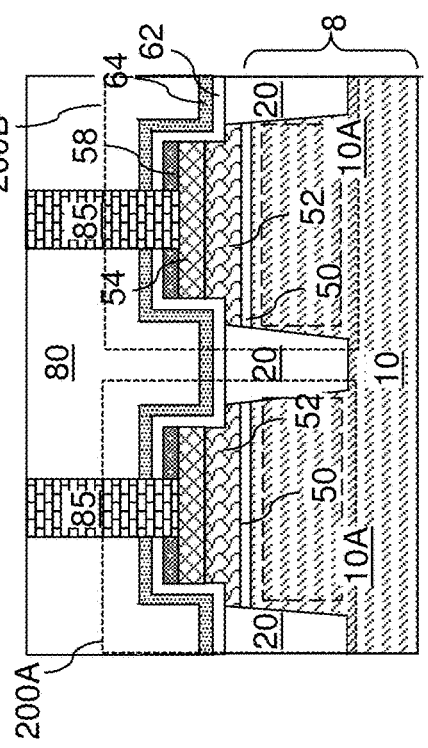

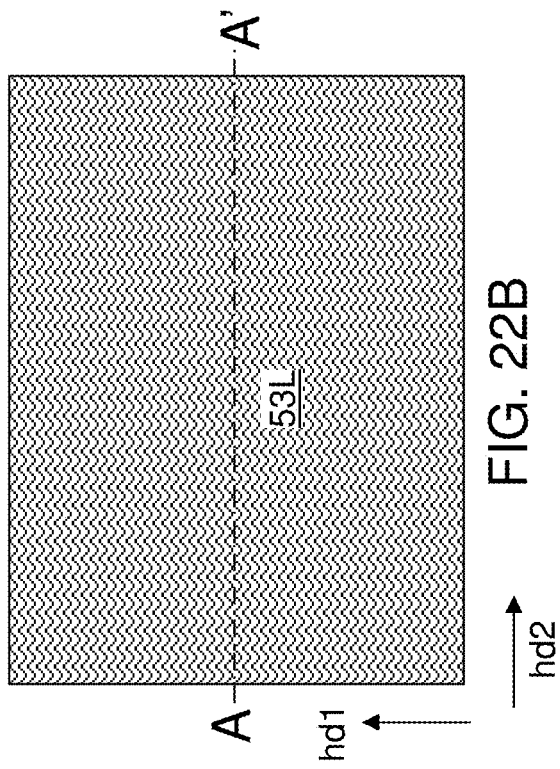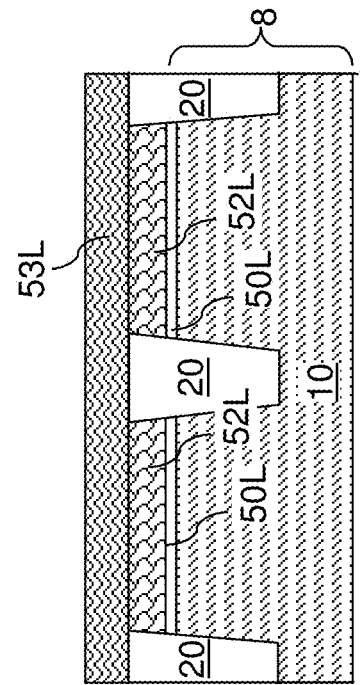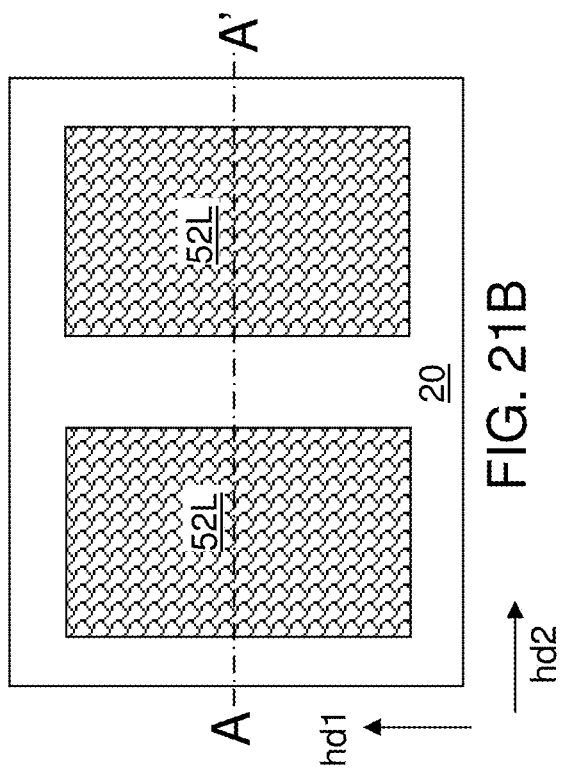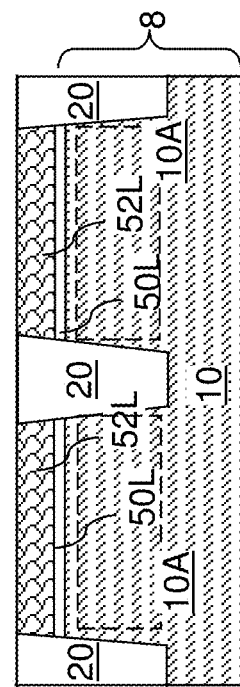

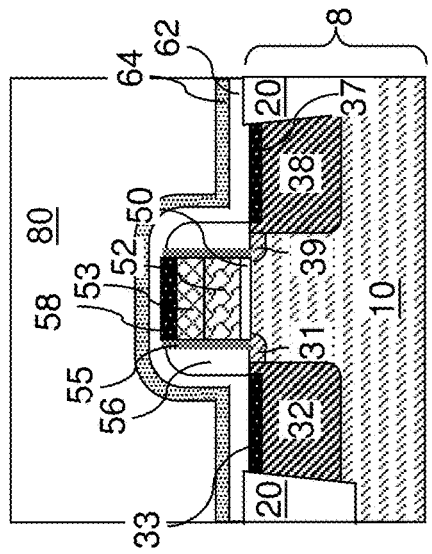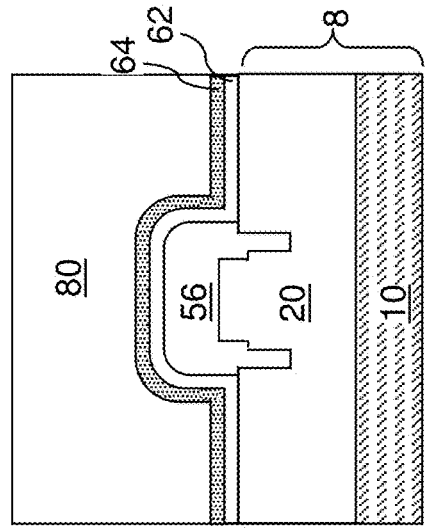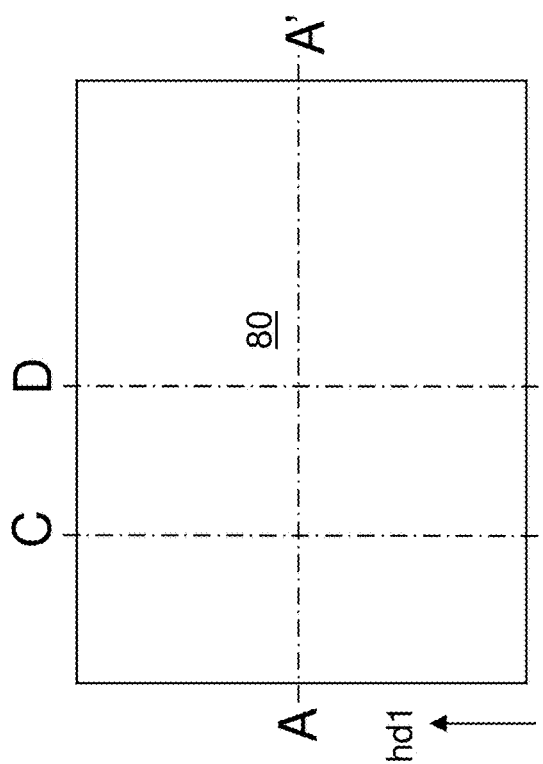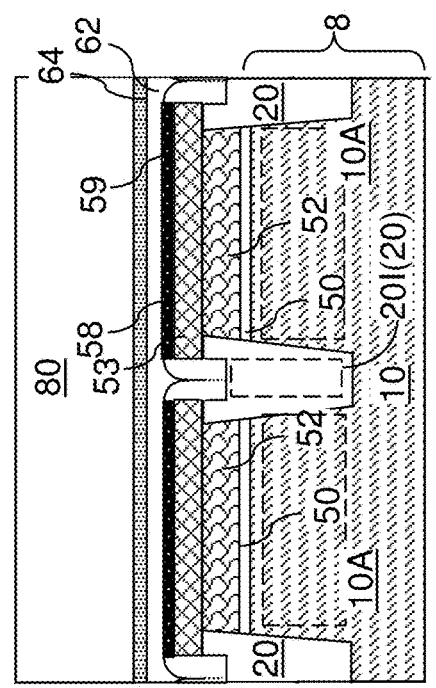

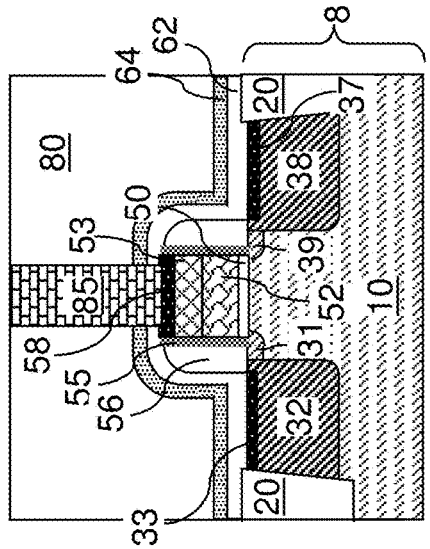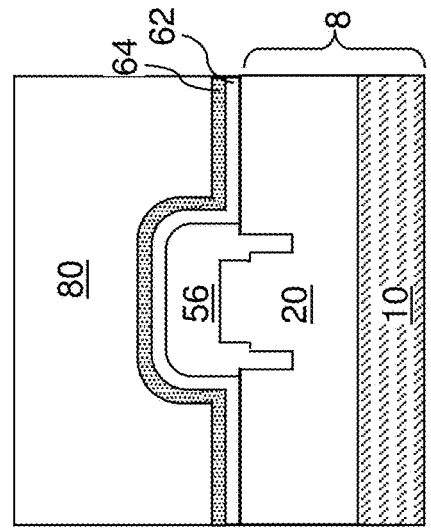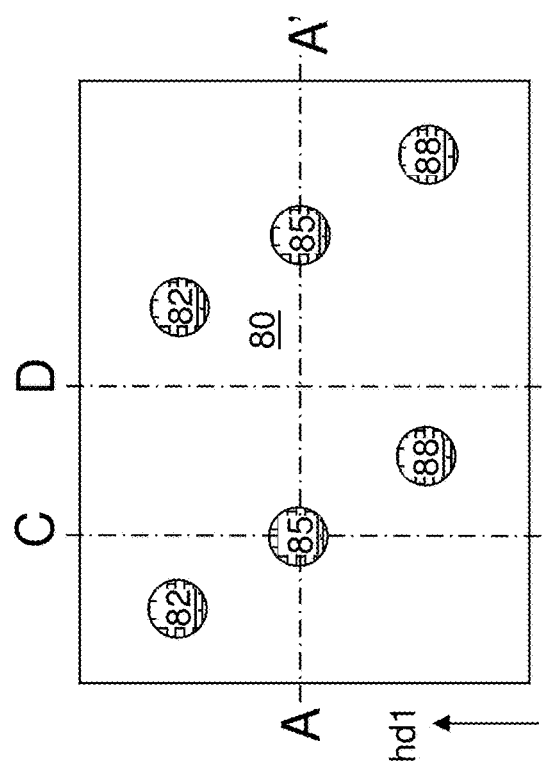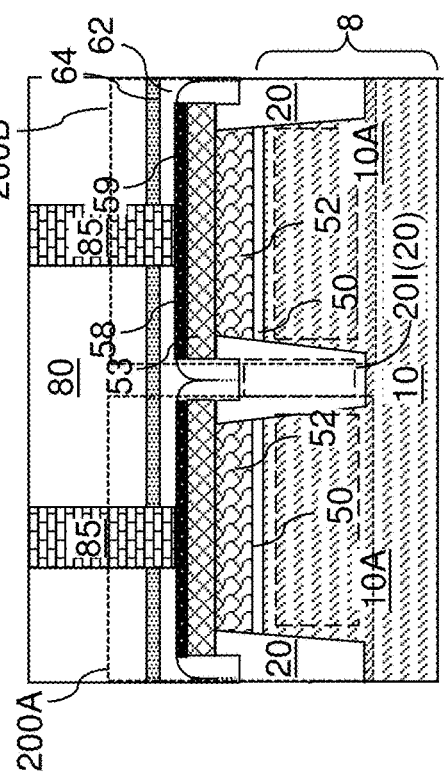

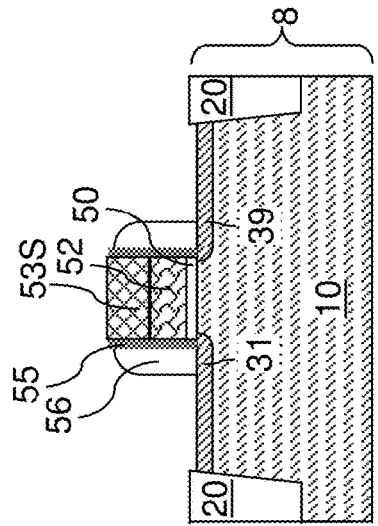
FIG. 30C
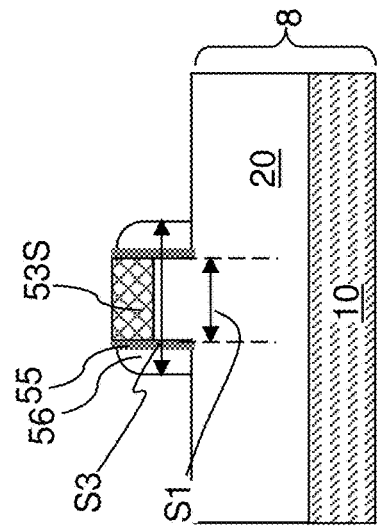
FIG. 30D
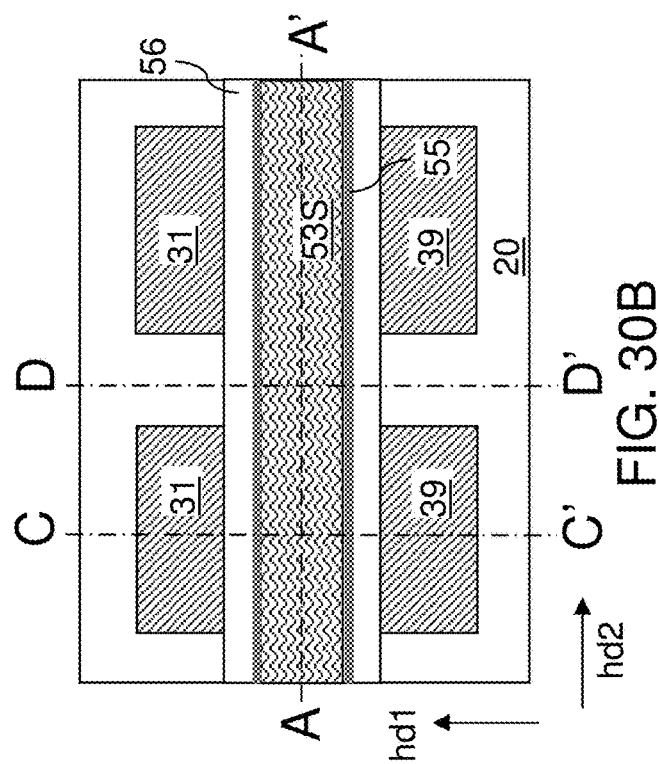
FIG. 30B
FIG. 30A
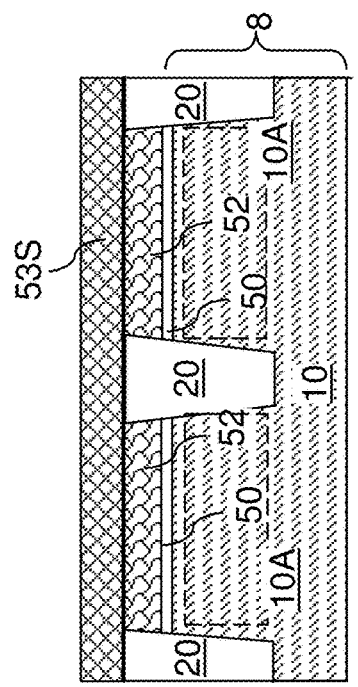

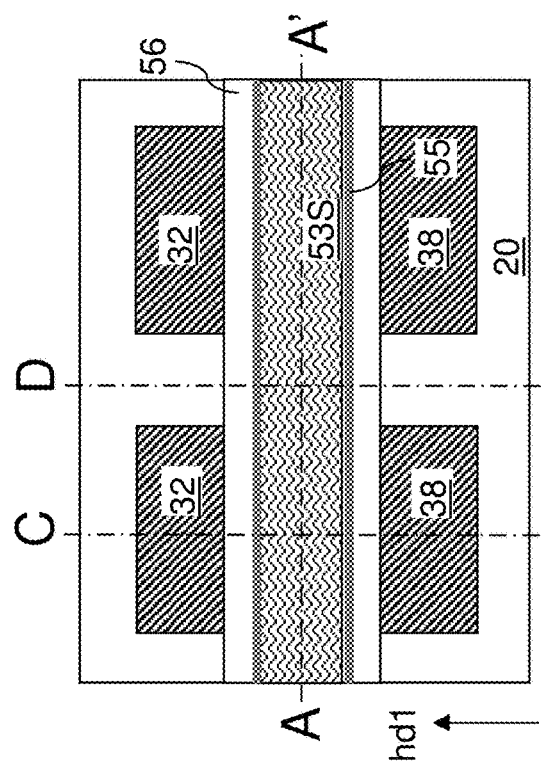
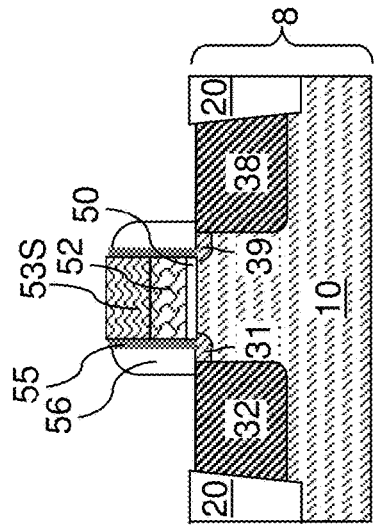
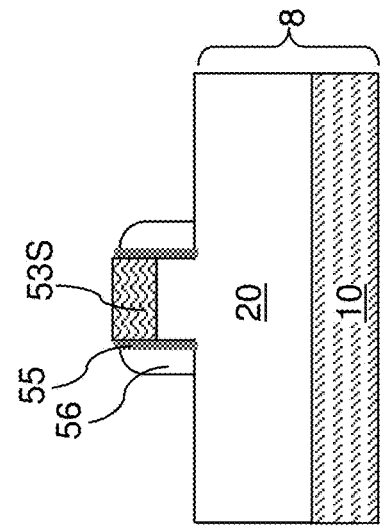
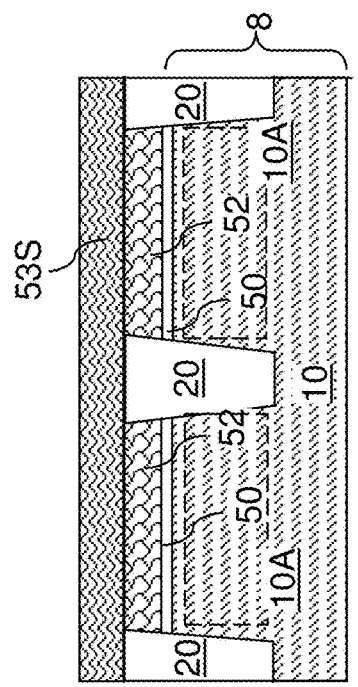

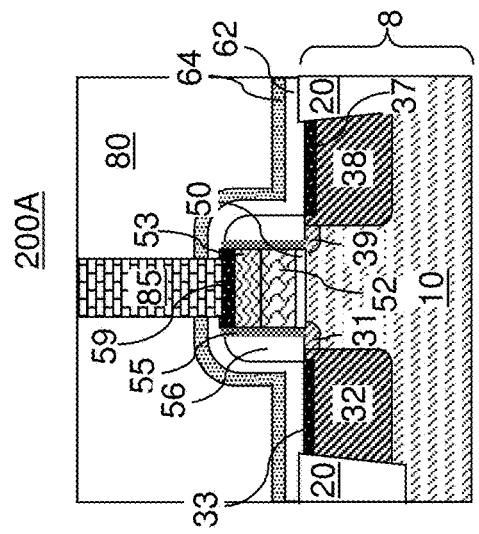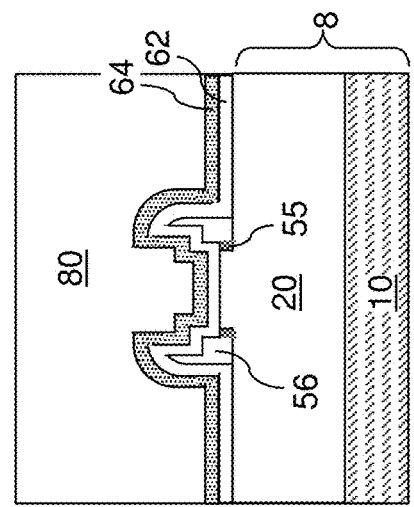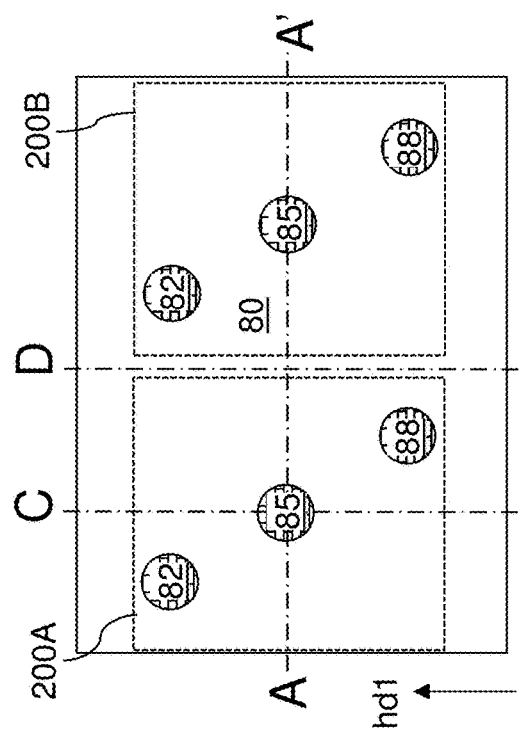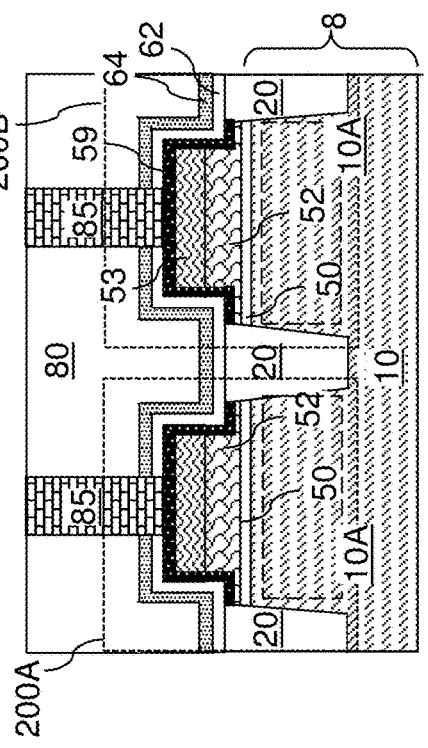

FIELD EFFECT TRANSISTORS WITH REDUCED GATE FRINGE AREA AND METHOD OF MAKING THE SAME

RELATED APPLICATIONS

This application is a continuation-in-part application of U.S. application Ser. No. 17/496,099 filed on Oct. 7, 2021, the entire contents of which are incorporated herein by reference.

FIELD

The present disclosure relates generally to the field of semiconductor devices and specifically to field effect transistors with reduced gate fringe area and methods of making the same.

BACKGROUND

Prior art high voltage field effect transistors often suffer from surface breakdown voltage. Such transistors often have a complex extended low doped drain (LDD) structure to improve surface breakdown characteristics at the expense of process complexity and increased cost.

SUMMARY

According to an aspect of the present disclosure, a semiconductor structure is provided, which comprises: first and second field effect transistors, wherein each of the first and second field effect transistors comprises: a semiconductor active region including a source region, a channel region, and a drain region arranged along a first horizontal direction; a gate dielectric contacting a top surface of the channel region; a gate electrode overlying the gate dielectric and comprising a semiconductor gate electrode portion and a gate silicide region; and a dielectric gate spacer laterally surrounding the gate electrode; and a shallow trench isolation structure which laterally surrounds each of the semiconductor active regions of the first and second two field effect transistors, wherein the shallow trench isolation structure comprises two via cavities that are laterally spaced apart along the first horizontal direction; and the dielectric gate spacers of the first and the second field effect transistors contain downward-protruding portions which fill the two via cavities in the shallow trench isolation structure.

According to another aspect of the present disclosure, a semiconductor structure is provided, which comprises: first and second field effect transistors, wherein each of the first and second field effect transistors comprises: a semiconductor active region including a source region, a channel region, and a drain region arranged along a first horizontal direction; a gate dielectric contacting a top surface of the channel region; a gate electrode overlying the gate dielectric and comprising a semiconductor gate electrode portion and a gate silicide region; and a pair of dielectric gate spacers located on opposite sides of the gate electrode; and a shallow trench isolation structure which laterally surrounds each of the semiconductor active regions of the first and second two field effect transistors, wherein each of the pair of dielectric gate spacers comprises: over-active-region gate spacer portions overlying the semiconductor active regions; and inter-active-region gate spacer portions overlying portions of the shallow trench isolation structure and comprising stepped sidewalls.

According to yet another aspect of the present disclosure, a method of forming a semiconductor device is provided, which comprises: forming a shallow trench isolation structure in an upper region of a semiconductor substrate that has a doping of a first conductivity type, wherein the shallow trench isolation structure laterally surrounds a plurality of semiconductor active regions that are patterned portions of the semiconductor substrate; forming a gate strip comprising a vertical stack of a plurality of gate dielectrics and a gate electrode strip over the plurality of semiconductor active regions, wherein the gate strip continuously extends as a single continuous structure over each of the plurality of semiconductor active regions and covers inter-electrode regions of the shallow trench isolation structure; forming source/drain extension regions by implanting dopants of a second conductivity type into surface portions of the plurality of semiconductor active regions that are not masked by the gate strip after formation of the gate strip; forming deep source/drain regions by implanting additional dopants of the second conductivity type into portions of the plurality of semiconductor active regions without implanting the additional dopants of the second conductivity type into the inter-electrode regions of the shallow trench isolation structure; and dividing the gate strip into the gate stacks by removing portions of the gate strip that are overlie the inter-electrode regions of the shallow trench isolation structure after forming the source/drain extension regions and prior to or after forming the deep source/drain regions.

According to an aspect of the present disclosure, a semiconductor structure comprises first and second field effect transistors and a shallow trench isolation structure. Each of the first and second field effect transistors comprises a semiconductor active region including a source region, a channel region, and a drain region arranged along a first horizontal direction, a gate dielectric contacting a top surface of the channel region, a gate electrode overlying the gate dielectric, and a dielectric gate spacer laterally surrounding the gate electrode. The shallow trench isolation structure laterally surrounds each of the semiconductor active regions of the first and second two field effect transistors. The shallow trench isolation structure has a planar top surface between two via cavities extending in the first horizontal direction and located in an inter-gate region between the gate electrodes of the first and second field effect transistors, and the dielectric gate spacers of the first and the second field effect transistors contain downward-protruding portions which fill the two via cavities in the shallow trench isolation structure.

According to another aspect of the present disclosure, a field effect transistor comprises a semiconductor active region including a source region, a channel region, and a drain region arranged along a first horizontal direction, a gate dielectric contacting a top surface of the channel region, a gate electrode having four sides overlying the gate dielectric, a dielectric gate spacer laterally surrounding the gate electrode on the four sides, and dielectric offset spacers located only on two sides of the gate electrode which extend in a second horizontal direction which is perpendicular to the first horizontal direction. The gate dielectric spacers physically contact the dielectric offset spacers over the two sides of the gate electrode which extend in the second horizontal direction, and the gate dielectric spacers physically contact another two sides of the gate electrode which extend in the first horizontal direction.

According to another aspect of the present disclosure, a method of forming a semiconductor device comprises forming a shallow trench isolation structure in an upper region of a semiconductor substrate that has a doping of a first conductivity type, wherein the shallow trench isolation structure laterally surrounds a plurality of semiconductor active regions that are patterned portions of the semiconductor substrate, have lengthwise edges that are parallel to a first horizontal direction, and are laterally spaced apart along a second horizontal direction that is perpendicular to the first horizontal direction, forming a gate strip comprising a vertical stack of a plurality of gate dielectrics and a gate electrode strip over the plurality of semiconductor active regions, wherein the gate strip continuously extends as a single continuous structure over each of the plurality of semiconductor active regions and over portions of the shallow trench isolation structure located between the plurality of semiconductor active regions, forming source/drain extension regions by implanting dopants of a second conductivity type into surface portions of the plurality of semiconductor active regions that are not masked by the gate strip after formation of the gate strip, and dividing the gate strip into the gate stacks by removing portions of the gate strip that are located within areas of the shallow trench isolation structure after forming the source/drain extension regions.

According to yet another aspect of the present disclosure, a semiconductor structure comprises first and second field effect transistors and a shallow trench isolation structure. Each of the first and second field effect transistors comprises a semiconductor active region including a source region, a channel region, and a drain region arranged along a first horizontal direction, a gate dielectric contacting a top surface of the channel region, a gate electrode overlying the gate dielectric, and a pair of dielectric gate spacers located on opposite sides of the gate electrode. The shallow trench isolation structure laterally surrounds each of the semiconductor active regions of the first and second two field effect transistors. Each of the pair of dielectric gate spacers comprises over-active-region gate spacer portions overlying the semiconductor active regions and comprising straight inner sidewalls that are perpendicular to the first horizontal direction; and inter-active-region gate spacer portions overlying portions of the shallow trench isolation structure and comprising stepped sidewalls including a lower straight sidewall segment adjoined to a respective pair of straight inner sidewalls, an upper straight sidewall segment that is laterally offset from the lower straight sidewall segment, and a connecting surface that is adjoined to a top edge of the lower straight sidewall segment and to a bottom edge of the upper straight sidewall segment.

According to still another aspect of the present disclosure, a method of forming a semiconductor device is provided, which comprises: forming a shallow trench isolation structure in an upper region of a semiconductor substrate that has a doping of a first conductivity type, wherein the shallow trench isolation structure laterally surrounds a plurality of semiconductor active regions that are patterned portions of the semiconductor substrate, have lengthwise edges that are parallel to a first horizontal direction, and are laterally spaced apart along a second horizontal direction that is perpendicular to the first horizontal direction; forming a gate strip over the plurality of semiconductor active regions, wherein the gate strip comprises a plurality of gate dielectrics and a gate electrode strip; forming a dielectric gate spacer around the gate strip; forming deep source/drain regions by implanting dopants of a second conductivity type that is an opposite of the first conductivity type into portions of the plurality of semiconductor active regions that are not masked by the gate strip and the dielectric gate spacer; and dividing the gate electrode strip into a plurality of gate electrodes that are laterally spaced apart along the second horizontal direction and overlies a respective one of the plurality of semiconductor active regions after forming the deep source/drain regions.

BRIEF DESCRIPTION OF THE DRAWINGS

FIG. 3A is a vertical cross-sectional view of the first exemplary structure after deposition of a dielectric fill material layer according to an embodiment of the present disclosure.

FIG. 3B is a top-down view of the first exemplary structure of FIG. 3A. The vertical plane A-A' is the plane of the vertical cross-section of FIG. 3A.

FIG. 4A is a vertical cross-sectional view of the first exemplary structure after deposition of a shallow trench isolation structure according to an embodiment of the present disclosure.

FIG. 4B is a top-down view of the first exemplary structure of FIG. 4A. The vertical plane A-A' is the plane of the vertical cross-section of FIG. 4A.

FIG. 5A is a vertical cross-sectional view of the first exemplary structure after removal of the silicon nitride capping layer and the silicon oxide capping layer according to an embodiment of the present disclosure.

FIG. 5B is a top-down view of the first exemplary structure of FIG. 5A. The vertical plane A-A' is the plane of the vertical cross-section of FIG. 5A.

FIG. 6A is a vertical cross-sectional view of the first exemplary structure after formation of a metallic gate electrode material layer and a gate cap dielectric layer according to an embodiment of the present disclosure.

FIG. 6B is a top-down view of the first exemplary structure of FIG. 6A. The vertical plane A-A' is the plane of the vertical cross-section of FIG. 6A.

FIG. 7A is a vertical cross-sectional view of the first exemplary structure after formation of a gate strip according to an embodiment of the present disclosure.

FIG. 7B is a top-down view of the first exemplary structure of FIG. 7A. The vertical plane A-A' is the plane of the vertical cross-section of FIG. 7A.

FIG. 7C is a vertical cross-sectional view of the first exemplary structure along the vertical plane C-C' of FIG. 7B.

FIG. 7D is a vertical cross-sectional view of the first exemplary structure along the vertical plane D-D' of FIG. 7B.

FIG. 9A is a vertical cross-sectional view of the first exemplary structure after application and patterning of a photoresist layer according to an embodiment of the present disclosure.

FIG. 9B is a top-down view of the first exemplary structure of FIG. 9A. The vertical plane A-A' is the plane of the vertical cross-section of FIG. 9A.

FIG. 9C is a vertical cross-sectional view of the first exemplary structure along the vertical plane C-C' of FIG. 9B.

FIG. 9D is a vertical cross-sectional view of the first exemplary structure along the vertical plane D-D' of FIG. 9B.

FIG. 10A is a vertical cross-sectional view of the first exemplary structure after patterning the gate strip into gate stacks according to an embodiment of the present disclosure.

FIG. 10B is a top-down view of the first exemplary structure of FIG. 10A. The vertical plane A-A' is the plane of the vertical cross-section of FIG. 10A.

FIG. 10C is a vertical cross-sectional view of the first exemplary structure along the vertical plane C-C' of FIG. 10B.

FIG. 10D is a vertical cross-sectional view of the first exemplary structure along the vertical plane D-D' of FIG. 10B.

FIG. 13A is a vertical cross-sectional view of the first exemplary structure after formation of dielectric liners and a contact-level dielectric layer according to an embodiment of the present disclosure.

FIG. 13B is a top-down view of the first exemplary structure of FIG. 13A. The vertical plane A-A' is the plane of the vertical cross-section of FIG. 13A.

FIG. 13C is a vertical cross-sectional view of the first exemplary structure along the vertical plane C-C' of FIG. 13B.

FIG. 13D is a vertical cross-sectional view of the first exemplary structure along the vertical plane D-D' of FIG. 13B.

FIG. 14A is a vertical cross-sectional view of the first exemplary structure after formation of contact via structures according to an embodiment of the present disclosure.

FIG. 14B is a top-down view of the first exemplary structure of FIG. 14A. The vertical plane A-A' is the plane of the vertical cross-section of FIG. 14A.

FIG. 14C is a vertical cross-sectional view of the first exemplary structure along the vertical plane C-C' of FIG. 14B.

FIG. 14D is a vertical cross-sectional view of the first exemplary structure along the vertical plane D-D' of FIG. 14B.

FIG. 15A is a vertical cross-sectional view of a second exemplary structure after formation of a dielectric gate spacer according to an embodiment of the present disclosure.

FIG. 15B is a top-down view of the second exemplary structure of FIG. 15A. The vertical plane A-A' is the plane of the vertical cross-section of FIG. 15A.

FIG. 15C is a vertical cross-sectional view of the second exemplary structure along the vertical plane C-C' of FIG. 15B.

FIG. 15D is a vertical cross-sectional view of the second exemplary structure along the vertical plane D-D' of FIG. 15B.

FIG. 16A is a vertical cross-sectional view of the second exemplary structure after formation of deep source/drain regions according to an embodiment of the present disclosure.

FIG. 16B is a top-down view of the second exemplary structure of FIG. 16A. The vertical plane A-A' is the plane of the vertical cross-section of FIG. 16A.

FIG. 16C is a vertical cross-sectional view of the second exemplary structure along the vertical plane C-C' of FIG. 16B.

FIG. 16D is a vertical cross-sectional view of the second exemplary structure along the vertical plane D-D' of FIG. 16B.

FIG. 19A is a vertical cross-sectional view of the second exemplary structure after removal of the photoresist layer according to an embodiment of the present disclosure.

FIG. 19B is a top-down view of the second exemplary structure of FIG. 19A. The vertical plane A-A' is the plane of the vertical cross-section of FIG. 19A.

FIG. 19C is a vertical cross-sectional view of the second exemplary structure along the vertical plane C-C' of FIG. 19B.

FIG. 19D is a vertical cross-sectional view of the second exemplary structure along the vertical plane D-D' of FIG. 19B.

FIG. 20A is a vertical cross-sectional view of the second exemplary structure after formation of dielectric liners, a contact-level dielectric layer, and contact via structures according to an embodiment of the present disclosure.

FIG. 20B is a top-down view of the second exemplary structure of FIG. 20A. The vertical plane A-A' is the plane of the vertical cross-section of FIG. 20A.

FIG. 20C is a vertical cross-sectional view of the second exemplary structure along the vertical plane C-C' of FIG. 20B.

FIG. 20D is a vertical cross-sectional view of the second exemplary structure along the vertical plane D-D' of FIG. 20B.

FIG. 21A is a vertical cross-sectional view of a third exemplary structure after formation of a gate dielectric layer, a first semiconductor gate electrode material layer, and a shallow trench isolation structure according to an embodiment of the present disclosure.

FIG. 21B is a top-down view of the third exemplary structure of FIG. 21A. The vertical plane A-A' is the plane of the vertical cross-section of FIG. 21A.

FIG. 22A is a vertical cross-sectional view of the third exemplary structure after formation of a second semiconductor gate electrode material layer according to an embodiment of the present disclosure.

FIG. 22B is a top-down view of the third exemplary structure of FIG. 22A. The vertical plane A-A' is the plane of the vertical cross-section of FIG. 22A.

FIG. 28A is a vertical cross-sectional view of the third exemplary structure after formation of dielectric liners and a contact-level dielectric layer according to an embodiment of the present disclosure.

FIG. 28B is a top-down view of the third exemplary structure of FIG. 28A. The vertical plane A-A' is the plane of the vertical cross-section of FIG. 28A.

FIG. 28C is a vertical cross-sectional view of the third exemplary structure along the vertical plane C-C' of FIG. 28B.

FIG. 28D is a vertical cross-sectional view of the third exemplary structure along the vertical plane D-D' of FIG. 28B.

FIG. 29A is a vertical cross-sectional view of the third exemplary structure after formation of contact via structures according to an embodiment of the present disclosure.

FIG. 29B is a top-down view of the third exemplary structure of FIG. 29A. The vertical plane A-A' is the plane of the vertical cross-section of FIG. 29A.

FIG. 29C is a vertical cross-sectional view of the third exemplary structure along the vertical plane C-C' of FIG. 29B.

FIG. 29D is a vertical cross-sectional view of the third exemplary structure along the vertical plane D-D' of FIG. 29B.

FIG. 30A is a vertical cross-sectional view of a fourth exemplary structure after formation of a dielectric gate spacer according to an embodiment of the present disclosure.

FIG. 30B is a top-down view of the fourth exemplary structure of FIG. 30A. The vertical plane A-A' is the plane of the vertical cross-section of FIG. 30A.

FIG. 30C is a vertical cross-sectional view of the fourth exemplary structure along the vertical plane C-C' of FIG. 30B.

FIG. 30D is a vertical cross-sectional view of the fourth exemplary structure along the vertical plane D-D' of FIG. 30B.

FIG. 31A is a vertical cross-sectional view of the fourth exemplary structure after formation of deep source/drain regions according to an embodiment of the present disclosure.

FIG. 31B is a top-down view of the fourth exemplary structure of FIG. 31A. The vertical plane A-A' is the plane of the vertical cross-section of FIG. 31A.

FIG. 31C is a vertical cross-sectional view of the fourth exemplary structure along the vertical plane C-C' of FIG. 31B.

FIG. 31D is a vertical cross-sectional view of the fourth exemplary structure along the vertical plane D-D' of FIG. 31B.

FIG. 34A is a vertical cross-sectional view of the fourth exemplary structure after formation of silicide regions according to an embodiment of the present disclosure.

FIG. 34B is a top-down view of the fourth exemplary structure of FIG. 34A. The vertical plane A-A' is the plane of the vertical cross-section of FIG. 34A.

FIG. 34C is a vertical cross-sectional view of the fourth exemplary structure along the vertical plane C-C' of FIG. 34B.

FIG. 34D is a vertical cross-sectional view of the fourth exemplary structure along the vertical plane D-D' of FIG. 34B.

FIG. 35A is a vertical cross-sectional view of the fourth exemplary structure after formation of dielectric liners, a contact-level dielectric layer, and contact via structures according to an embodiment of the present disclosure.

FIG. 35B is a top-down view of the fourth exemplary structure of FIG. 35A. The vertical plane A-A' is the plane of the vertical cross-section of FIG. 35A.

FIG. 35C is a vertical cross-sectional view of the fourth exemplary structure along the vertical plane C-C' of FIG. 35B.

FIG. 35D is a vertical cross-sectional view of the fourth exemplary structure along the vertical plane D-D' of FIG. 35B.

FIG. 35E is a vertical cross-sectional view of an alternative fourth exemplary structure after formation of contact via structures according to an alternative embodiment of the present disclosure.

DETAILED DESCRIPTION

Figure 2B:
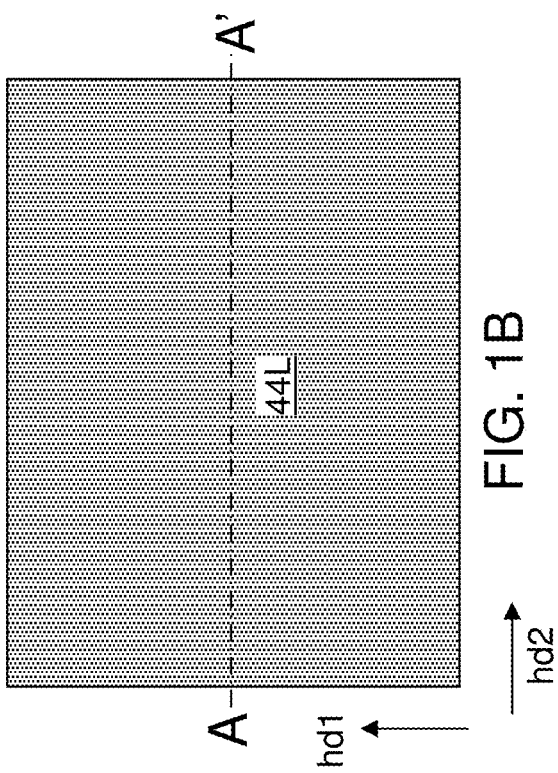
FIG. 2B is a top-down view of the first exemplary structure of FIG. 2A. The vertical plane A-A' is the plane of the vertical cross-section of FIG. 2A.

Embodiments of the present disclosure are directed to field effect transistors with reduced gate fringe area and methods of making the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material", "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "field effect transistor" refers to any semiconductor device having a semiconductor channel through which electrical current flows with a current density modulated by an external electrical field. As used herein, a "channel region" refers to a semiconductor region in which mobility of charge carriers is affected by an applied electrical field. A "gate electrode" refers to a conductive material portion that controls electron mobility in the channel region by application of an electrical field. A "source region" refers to a doped semiconductor region that supplies charge carriers that flow through the channel region. A "drain region" refers to a doped semiconductor region that receives charge carriers supplied by the source region and passes through the channel region. A "source/drain region" refers to a source region of a field effect transistor or a drain region of a field effect transistor. A "source extension region" refers to a doped semiconductor region having a lesser dopant concentration than, and having a same type of doping as, a source region and including a portion disposed between the source region and the channel region. A "drain extension region" refers to a doped semiconductor region having a lesser dopant concentration than, and having a same type of doping as, a drain region and including a portion disposed between the drain region and the channel region. A "source/drain extension region" refers to a source extension region or a drain extension region.

Figure 1B:
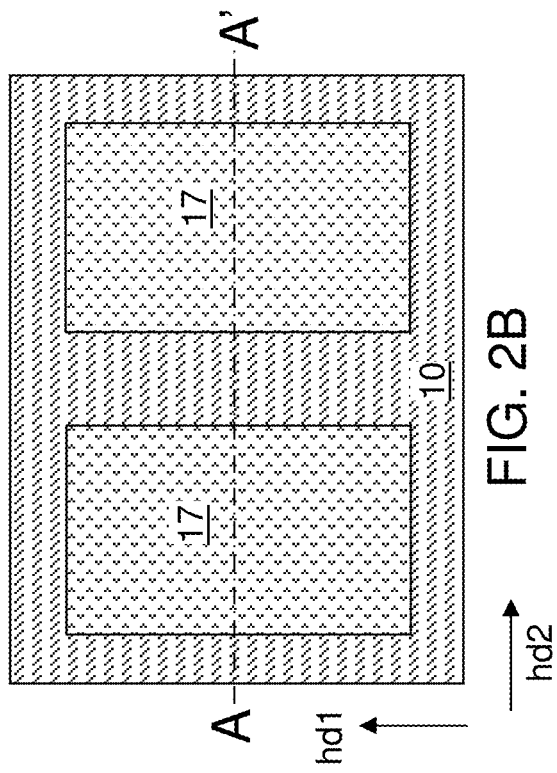
FIG. 1B is a top-down view of the first exemplary structure of FIG. 1A. The vertical plane A-A' is the plane of the vertical cross-section of FIG. 1A.
Figure 1A:
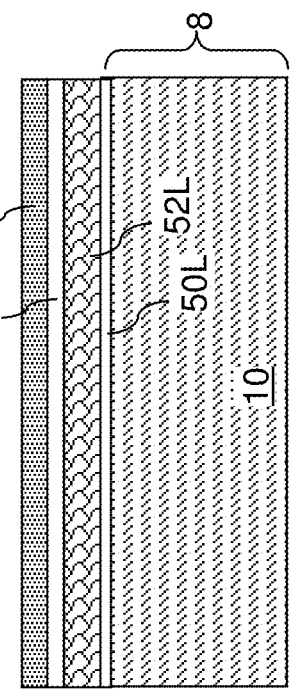
FIG. 1A is a vertical cross-sectional view of a first exemplary structure after formation of a gate dielectric layer, a semiconductor gate electrode material layer, a silicon oxide capping layer, and a silicon nitride capping layer according to an embodiment of the present disclosure.
Figure 8C:
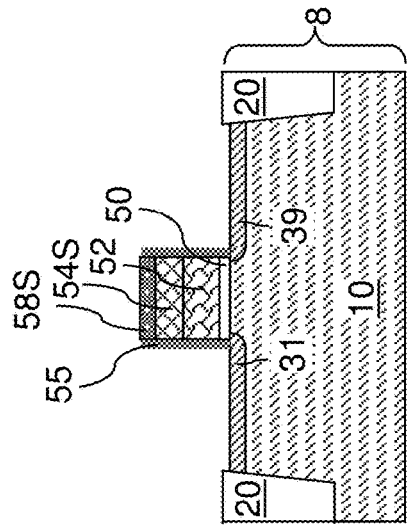
FIG. 8C is a vertical cross-sectional view of the first exemplary structure along the vertical plane C-C' of FIG. 8B.
Figure 8D:
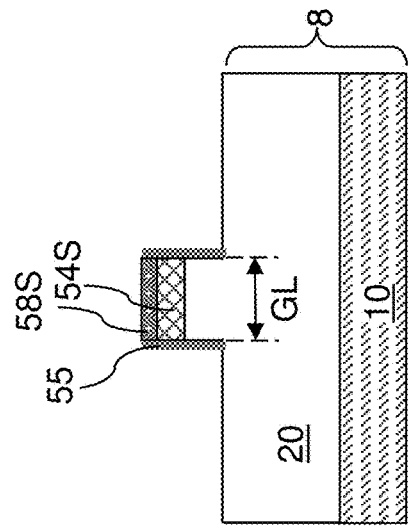
FIG. 8D is a vertical cross-sectional view of the first exemplary structure along the vertical plane D-D' of FIG. 8B.
Figure 8B:
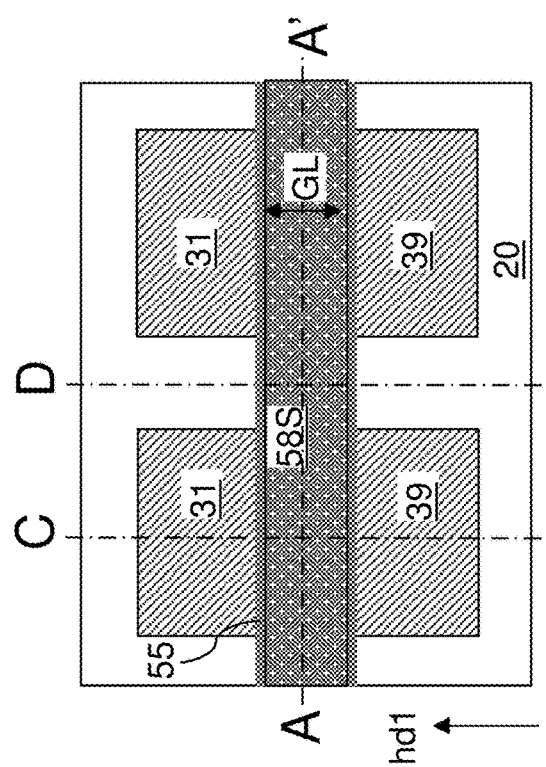
FIG. 8B is a top-down view of the first exemplary structure of FIG. 8A. The vertical plane A-A' is the plane of the vertical cross-section of FIG. 8A.
Figure 8A:
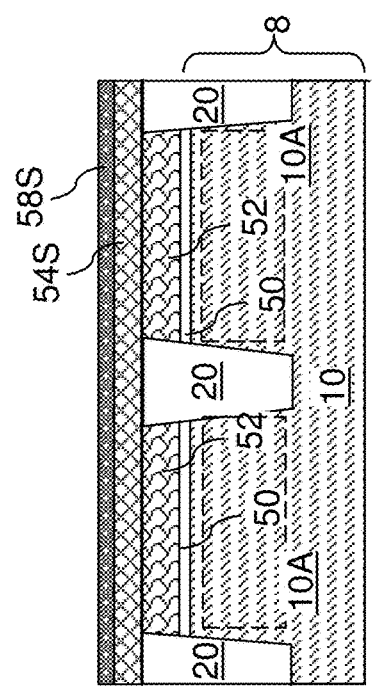
FIG. 8A is a vertical cross-sectional view of the first exemplary structure after formation of an offset spacer and source/drain extension regions according to an embodiment of the present disclosure.
Figure 11C:
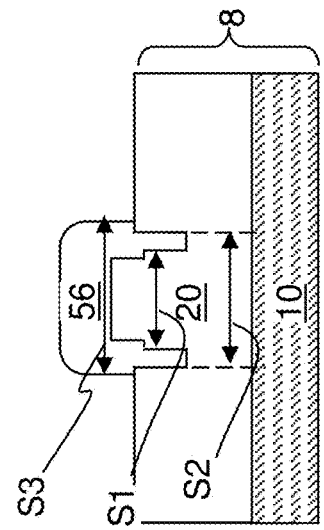
FIG. 11C is a vertical cross-sectional view of the first exemplary structure along the vertical plane C-C' of FIG. 11B.
Figure 11D:
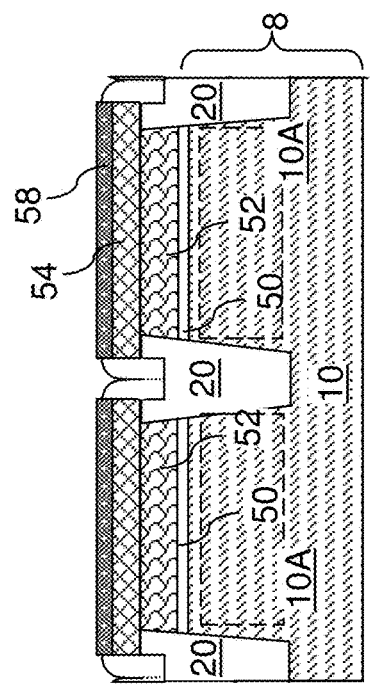
FIG. 11D is a vertical cross-sectional view of the first exemplary structure along the vertical plane D-D' of FIG. 11B.
Figure 11B:
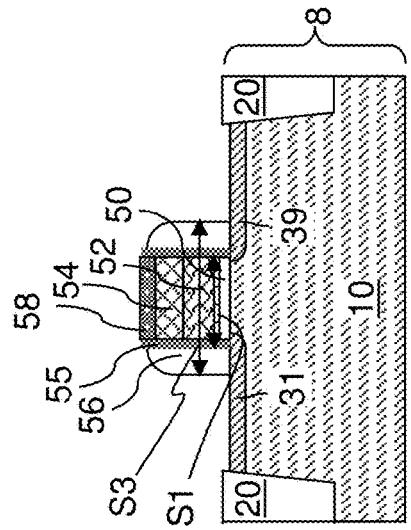
FIG. 11B is a top-down view of the first exemplary structure of FIG. 11A. The vertical plane A-A' is the plane of the vertical cross-section of FIG. 11A.
Figure 11A:
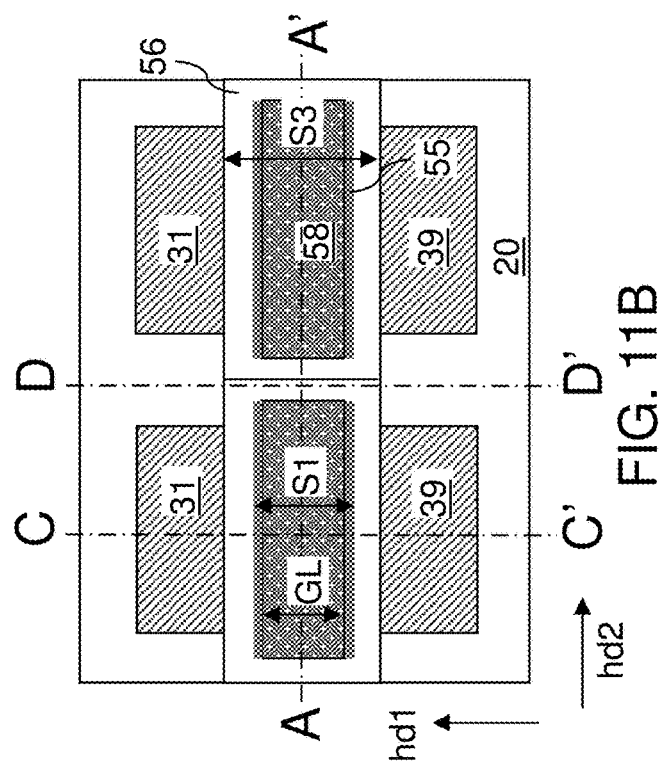
FIG. 11A is a vertical cross-sectional view of the first exemplary structure after formation of dielectric gate spacers according to an embodiment of the present disclosure.
Figure 12C:
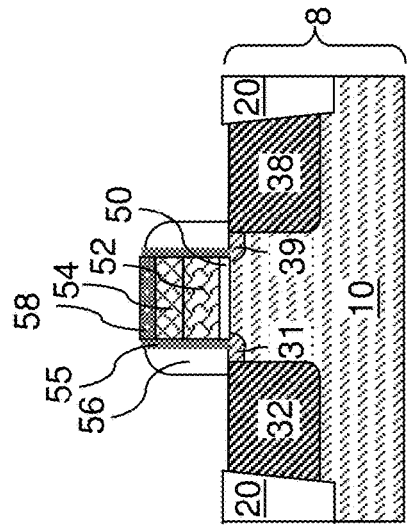
FIG. 12C is a vertical cross-sectional view of the first exemplary structure along the vertical plane C-C' of FIG. 12B.
Figure 12D:
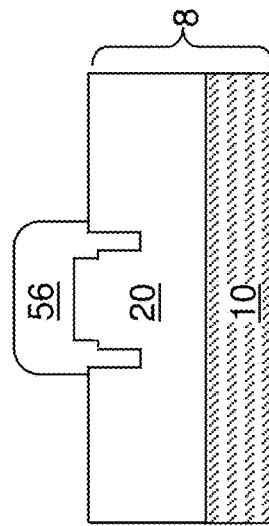
FIG. 12D is a vertical cross-sectional view of the first exemplary structure along the vertical plane D-D' of FIG. 12B.
Figure 12B:
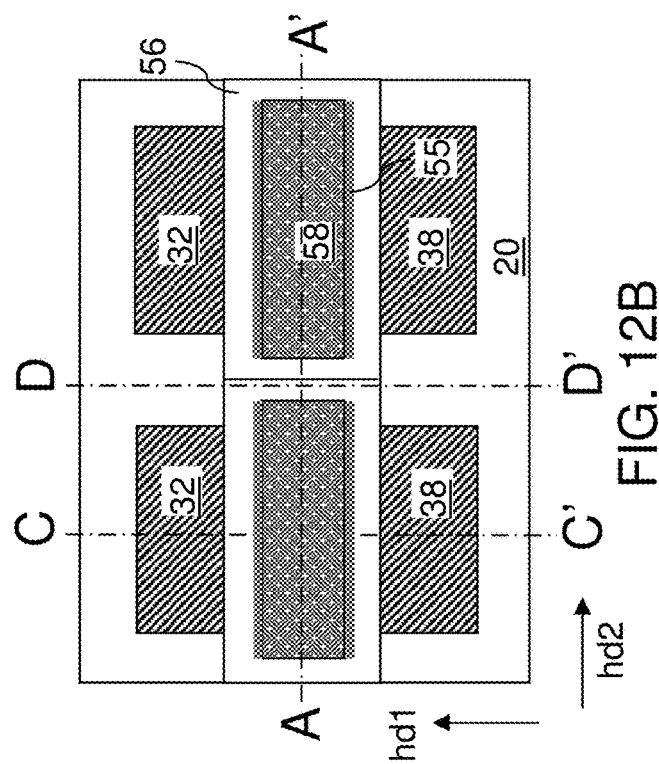
FIG. 12B is a top-down view of the first exemplary structure of FIG. 12A. The vertical plane A-A' is the plane of the vertical cross-section of FIG. 12A.
Figure 12A:
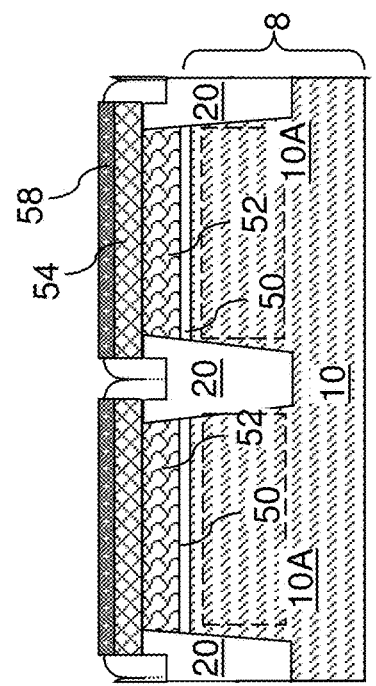
FIG. 12A is a vertical cross-sectional view of the first exemplary structure after formation of deep source/drain regions according to an embodiment of the present disclosure.
Figure 17C:
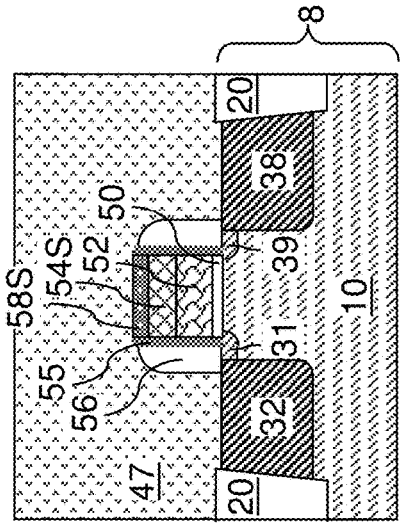
FIG. 17C is a vertical cross-sectional view of the second exemplary structure along the vertical plane C-C' of FIG. 17B.
Figure 17D:
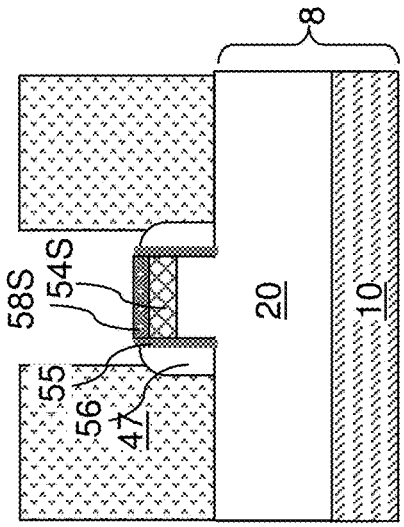
FIG. 17D is a vertical cross-sectional view of the second exemplary structure along the vertical plane D-D' of FIG. 17B.
Figure 17B:
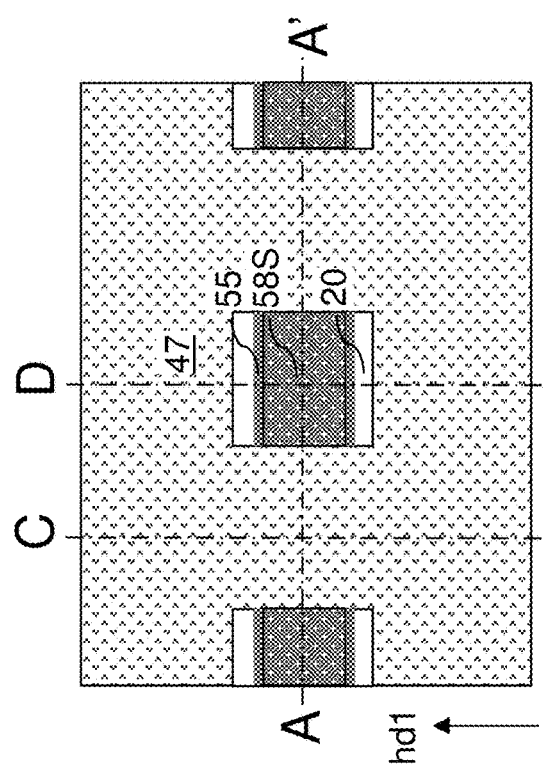
FIG. 17B is a top-down view of the second exemplary structure of FIG. 17A. The vertical plane A-A' is the plane of the vertical cross-section of FIG. 17A.
Figure 17A:
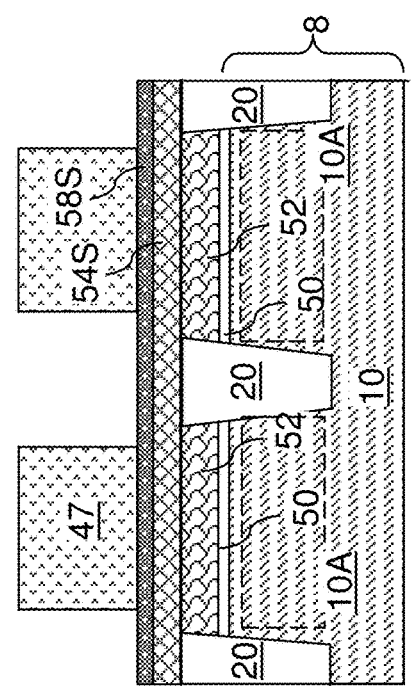
FIG. 17A is a vertical cross-sectional view of the second exemplary structure after application and patterning of a photoresist layer according to an embodiment of the present disclosure.

Referring to FIGS. 1A and 1B, a first exemplary structure according to a first embodiment of the present disclosure is illustrated. The first exemplary structure includes stacks of a gate dielectric layer 50L, a semiconductor gate electrode material layer 52L, a silicon oxide capping layer 42, and a silicon nitride capping layer 44 that are formed over a semiconductor substrate 8.

The semiconductor substrate 8 includes a semiconductor material layer 10. The semiconductor substrate 8 may optionally include at least one additional material layer at a bottom portion thereof. In one embodiment, the semiconductor substrate 8 can be a bulk semiconductor substrate consisting of the semiconductor material layer 10 (e.g., single crystal silicon wafer), or can be a semiconductor-on-insulator (SOI) substrate including a buried insulator layer (such as a silicon oxide layer) underlying the semiconductor material layer 10, and a handle substrate underlying the buried insulator layer. Alternatively, the semiconductor material layer 10 may comprise an epitaxial semiconductor (e.g., single crystal silicon) layer deposited on a semiconductor substrate (e.g., silicon wafer) 8 or may comprise a doped well (e.g., doped silicon well) in the upper portions of the semiconductor substate (e.g., silicon wafer) 8.

The semiconductor material layer 10 can include a lightly doped semiconductor material portion (e.g., silicon portion) on which at least one field effect transistor can be formed. In one embodiment, the entirety of the semiconductor material in the semiconductor material layer 10 may include the lightly doped semiconductor material. In another embodiment, the lightly doped semiconductor material can be a semiconductor well embedded within another semiconductor material having a different dopant concentration and optionally, a doping of the opposite conductivity type. The dopant concentration of the lightly doped semiconductor material portion may be optimized for a body region of the at least one field effect transistor to be subsequently formed. For example, the lightly doped semiconductor material portion may include electrical dopants at an atomic concentration in a range from $1.0 \times 10^{14}/cm^3$ to $1.0 \times 10^{18}/cm^3$, such as from $1.0 \times 10^{15}/cm^3$ to $1.0 \times 10^{17}/cm^3$, although lesser and greater atomic concentrations can also be employed. The conductivity type of the portion of the semiconductor material layer 10 to be subsequently employed as a body region of a field effect transistor is herein referred to as a first conductivity type, which may be p-type for an n-type field effect transistor or n-type for a p-type field effect transistor.

The semiconductor material of the semiconductor material layer 10 can be an elemental semiconductor material (such as silicon) or an alloy of at least two elemental semiconductor materials (such as a silicon-germanium alloy), or can be a compound semiconductor material (such as a III-V compound semiconductor material or a II-VI compound semiconductor material), or can be an organic semiconductor material. The thickness of the semiconductor material layer 10 can be in a range from 0.5 mm to 2 mm in case the semiconductor material layer 10 is a bulk semiconductor substrate. In case the semiconductor material layer 10 is a semiconductor-on-insulator substrate, the thickness of the top semiconductor material layer within the semiconductor material layer 10 may be in a range from 100 nm to 1,000 nm, although lesser and greater thicknesses can also be employed.

The gate dielectric layer 50L, the semiconductor gate electrode material layer 52L, the silicon oxide capping layer 42, and the silicon nitride capping layer 44 can be sequentially deposited over the semiconductor substrate 8.

The gate dielectric layer 50L includes a dielectric material having a thickness suitable for operation of a high voltage field effect transistor. The gate dielectric layer 50L can be conformally formed on all physically exposed surfaces of the semiconductor material layer 10, for example, by thermal oxidation of the physically exposed surface portions of the semiconductor material layer 10. If the semiconductor material layer 10 includes single crystalline silicon, the gate dielectric layer can consist essentially of thermal silicon oxide. In one embodiment, the gate dielectric layer 50L may consist essentially of a semiconductor oxide of a material of the semiconductor substrate 8, and may have the same thickness throughout. The thickness of the gate dielectric layer 50L can be in a range from 6 nm to 100 nm, such as from 10 nm to 60 nm, although lesser and greater thicknesses can also be employed.

The semiconductor gate electrode material layer 52L includes a doped semiconductor material such as doped polysilicon. The semiconductor gate electrode material layer 52L can be deposited over the gate dielectric layer 50L. For example, the semiconductor gate electrode material layer 52L can be deposited by chemical vapor deposition (CVD). The thickness of the semiconductor gate electrode material layer 52L can be in a range from 30 nm to 300 nm, although lesser and greater thicknesses may also be employed.

The silicon oxide capping layer 42 comprises a silicon oxide material such as undoped silicate glass. The silicon oxide capping layer 42 may be deposited, for example, by chemical vapor deposition. The thickness of the silicon oxide capping layer 42 may be in a range from 10 nm to 100 nm, although lesser and greater thicknesses may also be employed.

The silicon nitride capping layer 44 comprises silicon nitride. The silicon nitride capping layer 44 may be deposited, for example, by chemical vapor deposition. The thickness of the silicon nitride capping layer 44 may be in a range from 30 nm to 300 nm, although lesser and greater thicknesses may also be employed.

Figure 2A:
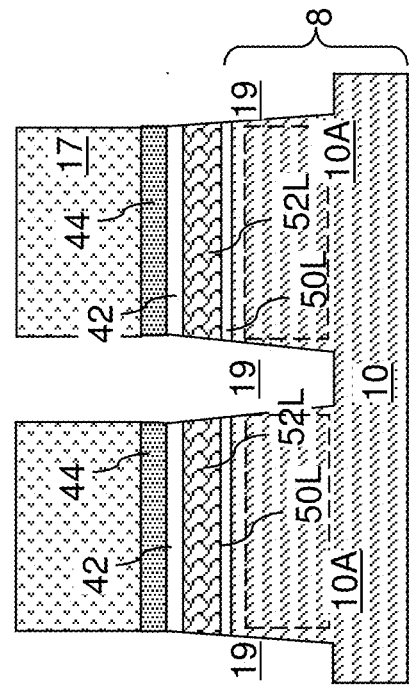
FIG. 2A is a vertical cross-sectional view of the first exemplary structure after formation of shallow trenches according to an embodiment of the present disclosure.

Referring to FIGS. 2A and 2B, a photoresist layer 17 can be applied over the first exemplary structure, and can be lithographically patterned into discrete photoresist material portions that overlie the area of a respective transistor active region 10A. Each transistor active region 10A includes the area of a respective combination of a source region, a channel region, and a drain region of a respective field effect transistor to be subsequently formed. The transistor active regions 10A are also referred to as semiconductor active regions.

An anisotropic etch process can be performed to etch shallow trenches 19 that vertically extend through the silicon nitride capping layer 44, the silicon oxide capping layer 42, the semiconductor gate electrode material layer 52L, and the gate dielectric layer 50L, and into an upper portion of the semiconductor material layer 10. The photoresist layer 17 can be employed as an etch mask layer during the anisotropic etch process. The depth of the shallow trenches 19, as measured from the horizontal plane including the top surface of the semiconductor material layer 10, can be in a range from 100 nm to 2,000 nm, such as from 200 nm to 1,000 nm, although lesser and greater depths may also be employed.

The shallow trenches 19 can be interconnected with each other. The shallow trenches 19 laterally surround each of the transistor active regions 10A. The transistor active regions 10A are portions of the semiconductor material layer 10 that are located above the horizontal plane including the bottom surfaces of the shallow trenches 19 and laterally surrounded by a continuous set of sidewalls of the shallow trenches 19. In other words, each unetched portion of the semiconductor material layer 10 laterally surrounded by the shallow trenches 19 constitutes a transistor active region 10A. The photoresist layer 17 can be subsequently removed, for example, by ashing.

Referring to FIGS. 3A and 3B, at least one dielectric fill material can be deposited in the shallow trenches 19 to form a dielectric fill material layer 20L. The at least one dielectric fill material may include undoped silicate glass. The at least one dielectric fill material may be deposited by a conformal deposition process such as a chemical vapor deposition process.

Referring to FIGS. 4A and 4B, a chemical mechanical planarization process can be performed to remove portions of the dielectric fill material layer 20L from above the horizontal plane including the top surfaces of the silicon nitride capping layer 44. Remaining portions of the dielectric fill material layer 20L constitute a shallow trench isolation structure 20. The shallow trench isolation structure 20 can be subsequently vertically recessed so that the top surface of the shallow trench isolation structure 20 are formed about the horizontal plane including the bottom surfaces of the silicon nitride capping layer 44.

Referring to FIGS. 5A and 5B, the silicon nitride capping layer 44 can be removed selective to the shallow trench isolation structure 20 and the silicon oxide capping layer 42. For example, a wet etch process employing hot phosphoric acid can be performed to remove the silicon nitride capping layer 44. Subsequently, an etch process that etches the silicon oxide material of the silicon oxide capping layer 42 can be performed to remove the silicon oxide capping layer 42 selective to the materials of the semiconductor gate electrode material layer 52L. In one embodiment, the etch process may comprise a wet etch process employing dilute hydrofluoric acid. The top surface of the shallow trench isolation structure 20 can be collaterally vertically recessed during the etch process. In one embodiment, the top surface of the shallow trench isolation structure 20 can be located about the height of the top surfaces of the semiconductor gate electrode material layer 52L. The shallow trench isolation structure 20 can be formed through the semiconductor gate electrode material layer 52L and the gate dielectric layer 50L and into an upper portion of the semiconductor substrate 8.

Generally, a shallow trench isolation structure 20 can be formed in an upper region of a semiconductor substrate 8 that has a doping of a first conductivity type. The shallow trench isolation structure 20 laterally surrounds a plurality of transistor active regions 10A that are patterned portions of the semiconductor substrate 8, have lengthwise edges that are parallel to a first horizontal direction hd1, and are laterally spaced apart along a second horizontal direction hd2 that is perpendicular to the first horizontal direction hd1. In one embodiment, the shallow trench isolation structure 20 laterally surrounds each of the semiconductor active regions 10A of at least two field effect transistors that are arranged along the second horizontal direction hd2. In one embodiment, the shallow trench isolation structure 20 can have a planar top surface located in a horizontal plane.

Referring to FIGS. 6A and 6B, a metallic gate electrode material layer 54L can be deposited directly on top surfaces of the semiconductor gate electrode material layer 52L. The metallic gate electrode material layer 54L comprises metallic material such as a transition metal, a conductive metallic nitride material (such as TiN, TaN, or WN), or metal silicide material. The metallic gate electrode material layer 54L may be deposited by physical vapor deposition and/or chemical vapor deposition. The metallic gate electrode material layer 54L can have a thickness in a range from 50 nm to 150 nm, although lesser and greater thicknesses may also be employed.

A gate cap dielectric layer 58L can be subsequently deposited over the metallic gate electrode material layer 54L. The gate cap dielectric layer 58L can include a passivation dielectric material such as silicon nitride. The gate cap dielectric layer 58L can be deposited, for example, by chemical vapor deposition. The thickness of the gate cap dielectric layer 58L can be in a range from 10 nm to 100 nm, such as from 20 nm to 60 nm, although lesser and greater thicknesses may also be employed.

Referring to FIGS. 7A-7D, a photoresist layer (not shown) can be applied over the gate cap dielectric layer 58L, and can be patterned into discrete photoresist material portions by lithographic exposure and development. Each patterned photoresist material portion can have a shape of a respective gate strip to be subsequently formed. In one embodiment, the transistor active regions 10A may be arranged as at least one row of transistor active regions 10A arranged along the second horizontal direction hd2. In one embodiment, the transistor active regions 10A may be arranged as multiple rows of transistor active regions 10A arranged along the second horizontal direction hd2. In this case, the illustrated portion of the first exemplary structure as shown in FIGS. 7A-7D corresponds to two neighboring transistor active regions 10A that are arranged along the second horizontal direction hd2. In one embodiment, the transistor active regions 10A may be arranged as a two-dimensional periodic array such as a two-dimensional periodic rectangular array.

Each patterned photoresist material portion can may have a respective rectangular horizontal cross-sectional shape having a respective pair of lengthwise sidewalls along the second horizontal direction hd2. In one embodiment, each patterned photoresist material portion can laterally extend along the second horizontal direction hd2 over a plurality of transistor active regions 10A, such as a row of transistor active regions 10A that are arranged along the second horizontal direction hd2.

An anisotropic etch process can be performed to transfer the pattern of the patterned photoresist material portions through the gate cap dielectric layer 58L, the metallic gate electrode material layer 54L, the semiconductor gate electrode material layer 52L, and the gate dielectric layer 50L. Unmasked areas of the shallow trench isolation structure 20 may be collaterally recessed during the anisotropic etch process.

A gate strip (50, 52, 54S, 58S) can be formed over each row of transistor active regions 10A that are arranged along the second horizontal direction hd2. Each gate strip (50, 52, 54S, 58S) comprises patterned portions of the gate cap dielectric layer 58L, the metallic gate electrode material layer 54L, the semiconductor gate electrode material layer 52L, and the gate dielectric layer 50L. For example, each gate strip (50, 52, 54S, 58S) includes a plurality of gate dielectrics 50 that are patterned portions of the gate dielectric layer 50L, a plurality of semiconductor gate electrode portions 52 that are patterned portions of the semiconductor gate electrode material layer 52L, a metallic gate electrode strip 54S that is a patterned portion of the metallic gate electrode material layer 54L, and a gate cap dielectric strip 58S that is a patterned portion of the gate cap dielectric layer 58L. A contiguous combination of the plurality of semiconductor gate electrode portions 52 and the metallic gate electrode strip 54A constitutes a gate electrode strip (52, 54S). The gate electrode strip (52, 54S) continuously extends as a single continuous structure over each transistor active region 10A within a row of transistor active regions 10A. Each gate electrode strip (52, 54S) can comprise a pair of lengthwise sidewalls that laterally extend along the second horizontal direction hd2, and laterally spaced apart along the first horizontal direction by a gate length GL. In one embodiment, each gate electrode strip (52, 54S) may comprise a plurality of surface segments, such as sidewalls of semiconductor gate electrode portions 52, that laterally extend along the first horizontal direction hd1 and contact a respective sidewall surface segment of the shallow trench isolation structure 20.

Referring to FIGS. 8A-8D, offset spacers 55 may be optionally formed on sidewalls of the gate strips (50, 52, 54S, 58S). The offset spacers 55 may be formed by conformal deposition of a thin dielectric liner and an anisotropic etch process that removes horizontally-extending portions of the thin dielectric liner, and/or may be formed by surface oxidation of the physically exposed surfaces of the semiconductor gate electrode portions 52. The lateral thickness of the offset spacer 55, if present, may be in a range from 0.3 nm to 20 nm, such as from 1 nm to 6 nm, although lesser and greater thicknesses may also be employed. The offset spacers 55 may comprise silicon oxide, silicon nitride or a silicon oxide/silicon nitride bilayer.

Electrical dopants of a second conductivity type can be implanted into unmasked portions of the semiconductor material layer 10 that are not masked by the gate strips (50, 52, 54S, 58S) to form source/drain extension regions (31, 39). The second conductivity type is the opposite of the first conductivity type. For example, if the first conductivity type is p-type, the second conductivity type is n-type, and vice versa. The source/drain extension regions (31, 39) may include, for example, source extension regions 31 and drain extension regions 39. Generally, each of the source/drain extension regions (31, 39) can have a doping of an opposite conductivity type than the conductivity type of a remaining portion of the transistor active region 10A on which the respective one of the source/drain extension regions (31, 39) is formed. For example, if a transistor active region 10A has a doping of a first conductivity type, the source/drain extension regions (31, 39) that are formed within surface regions of the transistor active region 10A have a doping of a second conductivity type that is the opposite of the first conductivity type. For example, if the first conductivity type is p-type, the second conductivity type is n-type, and vice versa. The atomic concentration of dopants in the source/drain extension regions (31, 39) may be in a range from $1.0 \times 10^{18}/cm^3$ to $1.0 \times 10^{20}/cm^3$, although lesser and greater dopant concentrations may also be employed. Thus, the extension regions (i.e., LDD regions) (31, 39) are implanted prior to separating the gate strips (50, 52, 54S, 58S) into gate electrodes. The gate strips block the LDD implant process from doping the edge regions of the transistor active regions 10A under the gate strips in the gate fringe region. The prevention of doping the gate fringe regions at the edge of each transistor active region 10A doping prevents or reduces a leakage current path through the gate fringe region and reduces the transistor leakage current.

Referring to FIGS. 9A-9D, a photoresist layer 47 can be applied over the first exemplary structure, and can be lithographically patterned to form openings 47A that straddle portions of the gate strips (50, 52, 54S, 58S) that overlie top surfaces of the shallow trench isolation structure 20. Generally, the patterned photoresist layer 47 can cover the entire area of each of the transistor active regions 10A, and includes rectangular openings 47A in areas (i.e., the gate fringe areas between the transistor active regions 10A) in which the gate strips (50, 52, 54S, 58S) are subsequently cut. In other words, the areas of the openings 47A in the patterned photoresist layer 47 correspond to the gate fringe areas from which portions of the gate strips (50, 52, 54S, 58S) are subsequently removed. In one embodiment, the patterned photoresist layer comprises a row of openings 47A arranged along the second horizontal direction hd2 and located within the gate fringe areas overlying the shallow trench isolation structure 20 and having an areal overlap with a respective portion of an underlying gate strip (50, 52, 54S, 58S). In one embodiment, a row of rectangular openings 47A can be formed in the patterned photoresist layer 47 over each gate strip (50, 52, 54S, 58S).

In one embodiment, each of the rectangular openings 47A in the patterned photoresist layer 47 can have a pair of first straight sidewalls and a pair of second straight sidewalls. The pair of first straight sidewalls can laterally extend along the first horizontal direction hd1 and having a greater length than the gate length GL (i.e., the lateral dimension along the first horizontal direction hd1) of the underlying gate strip (50, 52, 54S, 58S). The pair of second sidewalls can laterally extend along the second horizontal direction hd2, overlie and contact a respective portion of the shallow trench isolation structure 20, as shown in FIG. 9D. Thus, the second sidewalls do not have an areal overlap with the underlying gate strip (50, 52, 54S, 58S). The pair of second sidewalls of each opening 47A in the patterned photoresist layer 47 also does not have any areal overlap with any of the transistor active regions 10A.

A portion of the top surface shallow trench isolation structure 20 is exposed in the opening 47A, as shown in FIG. 9D. Specifically, a pair of rectangular top surface segments of the shallow trench isolation structure 20 can be physically exposed within the area of each opening 47A in the patterned photoresist layer 47. Further, a rectangular surface segment of the top surface of a gate cap dielectric strip 58S can be physically exposed within the area of each opening 47A in the patterned photoresist layer 47. The width of each rectangular opening 47A in the patterned photoresist layer 47 along the second horizontal direction hd2 can be less than the lateral spacing between a neighboring pair of transistor active regions 10A along the second horizontal direction hd2. The length of each rectangular opening 47A in the patterned photoresist layer 47 along the first horizontal direction hd1 can be greater than the gate length GL of an underlying gate strip (50, 52, 54S, 58S), which is the width of the underlying gate strip (50, 52, 54S, 58S) along the first horizontal direction hd1.

Referring to FIGS. 10A-10D, an anisotropic etch process can be performed to etch unmasked portions of each gate strip (50, 52, 54S, 58S). The etch process is performed after implantation of the extension regions (i.e., LDD regions) (31, 39) into the transistor active regions 10A. The pattern of rows of openings 47A in the patterned photoresist layer 47 can be transferred through the gate strips (50, 52, 54S, 58S) and into unmasked areas of the shallow trench isolation structure 20. Unmasked portions of the offset spacers 55 can be collaterally removed during the anisotropic etch process. Unmasked portions of the shallow trench isolation structure 20 can be collaterally vertically recessed to form via cavities 11. A pair of via cavities 11 that vertically extend into the shallow trench isolation structure 20 can be formed within each opening within the rows of openings in the patterned photoresist layer 47.

Each gate strip (50, 52, 54S, 58S) can be divided into the gate stacks (50, 52, 54, 58) by removing portions of the respective gate strip (50, 52, 54S, 58S) that are located within the gate fringe areas overlying the shallow trench isolation structure 20. Each gate stack (50, 52, 54, 58) includes a vertical stack of a gate dielectric 50, a semiconductor gate electrode portion 52, a metallic gate electrode portion 54, and a gate cap dielectric 58. Each metallic gate electrode portion 54 is a patterned portion of a respective metallic gate electrode strip 54S. Each gate cap dielectric 58 is a patterned portion of a gate cap dielectric strip 58S. Each of the gate dielectrics 50 is one of a plurality of gate dielectrics 50 within a respective one of the gate strips (50, 52, 54S, 58S). Each contiguous combination of a semiconductor gate electrode portion 52 and a metallic gate electrode portion 54 constitutes a gate electrode (52, 54). Thus, each of the gate electrodes (52, 54) is a patterned portion of a respective gate electrode strip (52, 54S).

Each gate stack (50, 52, 54, 58) is formed over a respective one of the transistor active regions 10A. Each gate stack comprises a gate dielectric 50 and a gate electrode (52, 54). In one embodiment, each of the gate stacks (50, 52, 54, 58) comprises a pair of peripheral regions PR located in the gate fringe region and having an areal overlap with the shallow trench isolation structure 20 in a plan view along a vertical direction that is perpendicular to a top surface of the semiconductor substrate 8.

A pair of via cavities 11 can be formed underneath each opening 47A in the patterned photoresist layer 47. The pair of via cavities 11 comprises a pair of proximal sidewalls 11P that are laterally spaced apart along the first horizontal direction hd1 by a first spacing S1, which is also referred to as a gate spacer inner sidewall spacing, i.e., the spacing between a pair of inner sidewalls of a gate spacer to be subsequently formed. In one embodiment, the pair of via cavities 11 also comprises a pair of distal sidewalls 11D that are laterally spaced apart along the first horizontal direction hd1 by a second spacing S2, which is referred to as a trench distal sidewall spacing.

Each region of the shallow trench isolation structure 20 that is located within an area located between a neighboring pair of gate dielectrics 50 is herein referred to as an inter-gate region. Each inter-gate region of the shallow trench isolation structure 20 comprises a pair of topmost horizontal surface segments THSS of the shallow trench isolation structure 20 that contacts a respective bottom surface segment of a neighboring pair of gate electrodes (52, 54), such as bottom surface segments of a neighboring pair of metallic gate electrode portions 54. Further, each inter-gate region of the shallow trench isolation structure 20 comprises an intermediate horizontal surface segment IHSS that is adjoined to the topmost horizontal surface segments by a pair of vertical surface segments and located between a respective pair of via cavities 11. The intermediate horizontal surface segment is physically exposed underneath an opening 47A in the patterned photoresist layer 47.

In one embodiment, the intermediate horizontal surface segment IHSS is located above the horizontal plane including a planar top surface of the shallow trench isolation structure 20 that is covered by the patterned photoresist layer 47. In one embodiment, bottom surfaces of the via cavities 11 are located below the horizontal plane including the planar top surface of the shallow trench isolation structure 20 that is covered by the patterned photoresist layer 47.

In one embodiment, each of the via cavities 11 comprises a pair of stepped proximal sidewalls having a respective horizontal step located between an upper vertical proximal sidewall segment and a lower vertical proximal sidewall segment. A pair of lower vertical proximal sidewall segments can be laterally spaced from each other by the first spacing S1. A pair of upper vertical proximal sidewall segments can be laterally spaced from each other by the gate length GL.

In one embodiment, each of the via cavities 11 comprises a pair of first sidewalls 111 that are parallel to the first horizontal direction hd1 and vertically coincident with widthwise sidewalls of a neighboring pair of gate electrodes (52, 54), and a pair of second sidewalls (such as a proximal sidewall 11P and a distal sidewall 11D) that are perpendicular to the first horizontal direction hd1 and adjoined to vertically-extending edges of the pair of first sidewalls 111. In one embodiment, each of the gate electrodes (52, 54) comprises a pair of lengthwise sidewalls that is perpendicular to the first horizontal direction hd1 and laterally spaced apart along the first horizontal direction hd1 by a gate length GL. In one embodiment, the pair of second sidewalls 11P of each via cavity 11 comprises a pair of sidewall segments (which are upper straight sidewall segments of a pair of stepped sidewalls 11P) that are laterally spaced apart along the first horizontal direction by the gate length GL.

In one embodiment, each of the gate electrodes (52, 54) comprises a pair of lengthwise sidewalls that are laterally spaced apart along the first horizontal direction hd1 by the gate length GL and laterally extend along the second horizontal direction hd2. A lateral spacing between a pair of horizontal steps 11H of the pair of stepped proximal sidewalls 11P over each inter-gate region of the shallow trench isolation structure 20 is the same as the gate length GL, as illustrated in FIG. 10D.

In one embodiment, each of the gate electrodes (52, 54) comprises a semiconductor gate electrode portion 52 contacting a top surface of a respective one of the gate dielectrics 50, and a metallic gate electrode portion 54 that overlies the semiconductor gate electrode portion 52. In one embodiment, the semiconductor gate electrode portion 52 contacts sidewalls of a pair of inter-gate regions of the shallow trench isolation structure 20. In one embodiment, the semiconductor gate electrode portion comprises a top surface located within a same horizontal plane as topmost surface segments of the pair of inter-gate regions of the shallow trench isolation structure 20. In one embodiment, the metallic gate electrode portion 54 contacts the topmost surface segments of the pair of inter-gate regions of the shallow trench isolation structure 20.

In one embodiment shown in FIG. 10B, lengthwise sidewalls of the metallic gate electrode portion 54 that are perpendicular to the first horizontal direction hd1 are vertically coincident with lengthwise sidewalls of the semiconductor gate electrode portion 52 within each gate electrode (52, 54). However, as shown in FIG. 10C, widthwise sidewalls of the metallic gate electrode portion 54 that are parallel to the first horizontal direction hd1 are laterally offset outward from widthwise sidewalls of the semiconductor gate electrode portion 52 within each gate electrode (52, 54).

Referring to FIGS. 11A-11D, the patterned photoresist layer 47 can be removed, for example, by ashing. A dielectric gate spacer material layer can be conformally deposited, and an anisotropic etch process can be performed to remove horizontally-extending portions of the dielectric gate spacer material layer. The dielectric gate spacer material layer includes a dielectric material such as silicon oxide and/or silicon nitride, and may be formed by at least one chemical vapor deposition process such as at least one low pressure chemical vapor deposition (LPCVD) process. Remaining portion of the dielectric gate spacer material layer comprise dielectric gate spacers 56 that laterally surround a respective one of the gate stacks (50, 52, 54, 58). In an illustrative example, each dielectric gate spacer 56 can have a width, as measured along the first horizontal direction hd1 over a transistor active region 10A between an inner sidewall and an outer sidewall, in a range from 5 nm to 100 nm, such as from 10 nm to 50 nm, although lesser and greater widths may also be employed.

According to an aspect of the present disclosure, the thickness of the dielectric gate spacer material layer can be greater than one half of the spacing between neighboring pairs of gate stacks (50, 52, 54, 58) that are laterally spaced apart along the second horizontal direction hd2. For example, the thickness of the dielectric gate spacer material layer can be greater than one half of the width of each opening 47A in the patterned photoresist layer 47 along the second horizontal direction hd2 as employed at the processing steps of FIGS. 9A-9D and 10A-10D. In this case, vertical growth surfaces of the dielectric gate spacer material layer merge to form a seam between each neighboring pair of gate stacks (50, 52, 54, 58) that are laterally spaced apart along the second horizontal direction hd2. After the anisotropic etch process that forms the dielectric gate spacers 56, neighboring pairs of dielectric gate spacers 56 arranged along the second horizontal direction hd2 contact each other at a vertical plane located midway between the neighboring pairs of dielectric gate spacers 56 and extending along the first horizontal direction hd2. All inter-gate regions of the shallow trench isolation structure 20 can be covered by the dielectric gate spacers 56.

Generally, each neighboring pair of dielectric gate spacers 56 that are laterally spaced along the second horizontal direction hd1 can contact each other along a respective vertical plane that is parallel to the first horizontal direction hd1. In one embodiment, outer widthwise sidewalls of a neighboring pair of dielectric gate spacers 56 contact each other at a vertical seam that laterally extends along the first horizontal direction hd1 above each inter-gate region of the shallow trench isolation structure 20.

Each of the via cavities 11 can be filled by downward-protruding portions of a respective pair of dielectric gate spacers 56. Each neighboring pair of the dielectric gate spacers 56 that are arranged along the second horizontal direction hd2 can be in contact with each other over a respective inter-gate region of the shallow trench isolation structure 20, which comprises a pair of via cavities 11 filled with downward-protruding portions of a respective neighboring pair of the dielectric gate spacers 56.

In one embodiment, each of the dielectric gate spacers 56 comprises a pair of inner lengthwise sidewalls that face toward a respective gate electrode (52, 54), laterally extend along a second horizontal direction hd2, and laterally spaced apart along the first horizontal direction hd1 by the first spacing S1, i.e., by the gate spacer 55 inner sidewall spacing. In one embodiment, each of the dielectric gate spacers 56 comprises a pair of outer lengthwise sidewalls that face away from the respective gate electrode (52, 54), laterally extend along the second horizontal direction hd2, and laterally spaced apart along the first horizontal direction by a third spacing S3, which is herein referred to as a gate spacer outer sidewall spacing. In one embodiment, the third spacing S3 (i.e., the gate spacer outer sidewall spacing) can be greater than the second spacing S2 (i.e., the trench distal sidewall spacing).

In one embodiment, each inter-gate region of the shallow trench isolation structure comprises a pair of sidewall segments that laterally extend along the first horizontal direction hd1, adjoined to a respective topmost surface segment of the inter-gate region of the shallow trench isolation structure 20, and contacted by a sidewall of a respective one of the dielectric gate spacers 56. In one embodiment, the dielectric gate spacer 56 can comprise four downward-protruding portions vertically extending into four via cavities 11 within the shallow trench isolation structure 20. In one embodiment, the shallow trench isolation structure 20 can have a planar top surface located in a horizontal plane and within areas that are not covered by the gate electrodes (52, 54) or by the dielectric gate spacers 56.

Thus, the dielectric offset spacers 55 are formed only on two sides of each of the gate electrodes (52, 54) which extend in the second horizontal direction hd2 and are absent on the other two sides of each of the gate electrodes (52, 54) which extend in the perpendicular first horizontal direction hd1. In contrast, gate dielectric spacers 56 laterally surround each of the gate electrodes (52, 54) on all four sides. Thus, the gate dielectric spacers 56 physically contact the dielectric offset spacers 55 located on two sides of each of the gate electrodes (52, 54) which extend in the second horizontal direction hd2, and the gate dielectric spacers 56 physically contact the other two sides of each of the gate electrodes (52, 54) which extend in the first horizontal direction hd1.

Referring to FIGS. 12A-12D, additional electrical dopants of the second conductivity type can be implanted into unmasked portions of the semiconductor material layer 10 that are not masked by the gate stacks (50, 52, 54, 58), and the dielectric gate spacers 56 to form deep source/drain regions (32, 38).

According to an aspect of the present disclosure, the gaps between neighboring pairs of gate electrodes (52, 54) that are laterally spaced apart along the second horizontal direction hd2 are filled with a pair of dielectric gate spacers 56. Thus, the additional electrical dopants of the second conductivity type are not implanted into portions of the transistor active regions 10A that are proximal to the widthwise edges of the metallic gate electrode portions 54 and the gate cap dielectrics 58 that are parallel to the first horizontal direction hd1. This characteristic enables reduction of the lateral spacing between neighboring pairs of semiconductor active regions 10A without concern for collateral implantation of dopants of the second conductivity type into peripheral portions of the semiconductor active regions 10A that are proximal to the widthwise edges of the metallic gate electrode portions 54 and the gate cap dielectrics 58 that are parallel to the first horizontal direction hd1.

The deep source/drain regions (32, 38) may include, for example, deep source regions 32 and deep drain regions 38. Generally, the atomic concentration of dopants in the deep source/drain region (32, 38) is greater than the atomic concentration of dopants in the source/drain extension regions (31, 39). As such, volumes of the source/drain extension regions (31, 39) that overlap with volumes of the deep source/drain region (32, 38) are incorporated into a respective one of the deep source/drain region (32, 38). In one embodiment, the atomic concentration of dopants in the deep source/drain regions (32, 38) may be in a range from $5.0 \times 10^{18}/cm^3$ to $2.0 \times 10^{21}/cm^3$, although lesser and greater dopant concentrations may also be employed.

Unimplanted portions of each transistor active region 10A constitutes a channel region 36. Each channel region 36 may have an atomic concentration of dopants of the first conductivity type in a range from $1.0 \times 10^{14}/cm^3$ to $1.0 \times 10^{18}/cm^3$, although lesser and greater dopant concentrations may also be employed. Each contiguous combination of a respective one of source/drain extension regions (31, 39) and a respective one of the deep source/drain region (32, 38) constitutes a source/drain region, which may be a source region (31, 32) including a combination of a source extension region 31 and a deep source region 32, or may be drain region (38, 39) including a combination of a drain extension region 39 and a deep drain region 38. Generally, a source region (32, 32) and a drain region (38, 39) can be formed in portions of each transistor active region 10A that are laterally spaced from each other by a respective channel region 36.

Referring to FIGS. 13A-13D, at least one dielectric liner (62, 64) can be optionally formed over the physically exposed surfaces of the first exemplary structure by at least one conformal deposition process. The at least one dielectric liner (62, 64) may comprise, for example, a stack of a silicon oxide liner 62 and a silicon nitride liner 64. A contact-level dielectric layer 80 can be deposited over the gate stacks (50, 52, 54, 58), the source/drain regions {(31, 32), (38, 39)}, the shallow trench isolation structure 20, and the optional at least one dielectric liner (62, 64). The contact-level dielectric layer 80 comprises a dielectric material such as silicon oxide. A planarization process such as a chemical mechanical planarization process can be optionally performed to planarize the top surface of the contact-level dielectric layer 80. The vertical distance between the top surface of the contact-level dielectric layer 80 and the top surfaces of the gate cap dielectrics 58 may be in a range from 50 nm to 500 nm, although lesser and greater vertical distances may also be employed.

Referring to FIGS. 14A-14C, contact via cavities can be formed through the contact-level dielectric layer 80, and can be filled with at least one conductive material such as at least one metallic material. Excess portions of the at least one conductive material can be removed from above the horizontal plane including the top surface of the contact-level dielectric layer 80 by a planarization process, which may include a recess etch process and/or a chemical mechanical planarization process. Each remaining portion of the at least one conductive material constitutes a contact via structure (82, 85, 88). The contact via structures (82, 85, 88) may comprise source contact via structures 82 contacting a respective one of the source regions (31, 32), drain contact via structures 88 contacting a respective one of the drain regions (38, 39), and gate contact via structures 85 contacting a respective one of the gate electrodes (52, 54).

Referring collectively to FIGS. 1A-14D and according to various embodiments of the present disclosure, a semiconductor structure comprises a first field effect transistor 100A, a second field effect transistor 100B and a shallow trench isolation structure 20. Each of the first and second field effect transistors (100A, 100B) comprises a semiconductor active region 10A including a source region (31, 32), a channel region 36, and a drain region (38, 39) arranged along a first horizontal direction hd1, a gate dielectric 50 contacting a top surface of the channel region 36, a gate electrode (52, 54) overlying the gate dielectric 50, and a dielectric gate spacer 56 laterally surrounding the gate electrode (52, 54). The shallow trench isolation 20 structure laterally surrounds each of the semiconductor active regions 10A of the first and second two field effect transistors (100A, 100B). The shallow trench isolation structure 20 has a planar top surface between two via cavities 11 extending in the first horizontal direction hd1 and located in an inter-gate region between the gate electrodes (52, 54) of the first and second field effect transistors (100A, 100B), and the dielectric gate spacers 56 of the first and the second field effect transistors (100A, 100B) contain downward-protruding portions which fill the two via cavities 11 in the shallow trench isolation structure 20.

In one embodiment, dielectric offset spacers 55 are located only on two sides of each of the gate electrodes (52, 54) which extend in a second horizontal direction hd2 which is perpendicular to the first horizontal direction hd1. The gate dielectric spacers 56 laterally surround each of the gate electrodes (52, 54) on all four sides. The gate dielectric spacers 56 physically contact the dielectric offset spacers 55 over the two sides of each of the gate electrodes (52, 54) which extend in the second horizontal direction h2, and the gate dielectric spacers 56 physically contact another two sides of each of the gate electrodes (52, 54) which extend in the first horizontal direction hd1.

In one embodiment, each of the dielectric gate spacers 56 comprises a pair of inner lengthwise sidewalls that face toward a respective gate electrode (52, 54), laterally extend along the second horizontal direction hd2, and laterally spaced apart along the first horizontal direction hd1 by a gate spacer inner sidewall spacing (such as the first spacing S1); and the pair of via cavities 11 comprises a pair of proximal sidewalls 11P that are laterally spaced apart along the first horizontal direction hd1 by the gate spacer inner sidewall spacing In one embodiment, each of the dielectric gate spacers 56 comprises a pair of outer lengthwise sidewalls that face away from the respective gate electrode (52, 54), laterally extend along the second horizontal direction hd2, and laterally spaced apart along the first horizontal direction hd1 by a gate spacer outer sidewall spacing (such as the third spacing S3); and the pair of via cavities 11 comprises a pair of distal sidewalls 11D that are laterally spaced apart along the first horizontal direction hd1 by a trench distal sidewall spacing (such as the second spacing S2) that is less than the gate spacer outer sidewall spacing (such as the third spacing S3).

In one embodiment, outer widthwise sidewalls of a neighboring pair of dielectric gate spacers 56 contact each other at a vertical seam that laterally extends along the first horizontal direction hd1 above each inter-gate region of the shallow trench isolation structure 20.

In one embodiment, each inter-gate region of the shallow trench isolation structure 20 comprises: a pair of topmost horizontal surface segments THSS contacting a respective bottom surface segment of a neighboring pair of gate electrodes (52, 54); and an intermediate horizontal surface segment IHSS that is adjoined to the topmost horizontal surface segments THSS by a pair of vertical surface segments and located between a respective pair of via cavities 11. In one embodiment, the intermediate horizontal surface segment IHSS is located above the planar top surface of the shallow trench isolation structure 20.

In one embodiment, bottom surfaces of the via cavities 11 are located below the planar top surface of the shallow trench isolation structure 20. In one embodiment, each of the via cavities 11 comprises a pair of stepped proximal sidewalls having a respective horizontal step located between an upper vertical proximal sidewall segment and a lower vertical proximal sidewall segment; each of the gate electrodes (52, 54) comprises a pair of lengthwise sidewalls that are laterally spaced apart along the first horizontal direction hd1 by a gate length GL; and a lateral spacing between a pair of horizontal steps of the pair of stepped proximal sidewalls over each inter-gate region of the shallow trench isolation structure 20 is the same as the gate length GL.

In one embodiment, each of the gate electrodes (52, 54) comprises: a semiconductor gate electrode portion 52 contacting a top surface of a respective one of the gate dielectrics 50; and a metallic gate electrode portion 54 that overlies the semiconductor gate electrode portion 52. In one embodiment, the semiconductor gate electrode portion 52 contacts sidewalls of a pair of inter-gate regions of the shallow trench isolation structure 20; the semiconductor gate electrode portion 52 comprises a top surface located within a same horizontal plane as topmost surface segments of the a pair of inter-gate regions of the shallow trench isolation structure 20; and the metallic gate electrode portion 54 contacts the topmost surface segments of the pair of inter-gate regions of the shallow trench isolation structure 20.

In one embodiment, lengthwise sidewalls of the metallic gate electrode portion 54 that are perpendicular to the first horizontal direction hd1 are vertically coincident with lengthwise sidewalls of the semiconductor gate electrode portion 52; widthwise sidewalls of the metallic gate electrode portion 54 that are parallel to the first horizontal direction hd1 are laterally offset outward from widthwise sidewalls of the semiconductor gate electrode portion 52; and each inter-gate region of the shallow trench isolation structure 20 comprises a pair of sidewall segments that laterally extend along the first horizontal direction hd1, adjoined to a respective topmost surface segment of the inter-gate region of the shallow trench isolation structure 20, and contacted by a sidewall of a respective one of the dielectric gate spacers 56.

In one embodiment, each dielectric gate spacer 56 within the first and second field effect transistors (100A, 100B) comprises four downward-protruding portions vertically extending into four via cavities 11 within the shallow trench isolation structure 20.

In one embodiment, each of the via cavities 11 comprises: a pair of first sidewalls 111 that are parallel to the first horizontal direction hd1 and vertically coincident with widthwise sidewalls of a neighboring pair of gate electrodes (52, 54); and a pair of second sidewalls (such as a proximal sidewall 11P and a distal sidewall 11D) that are perpendicular to the first horizontal direction hd1 and adjoined to vertically-extending edges of the pair of first sidewalls 111. In one embodiment, each of the gate electrodes (52, 54) comprises a pair of lengthwise sidewalls that is perpendicular to the first horizontal direction hd1 and laterally spaced apart along the first horizontal direction hd1 by a gate length GL; and the pair of second sidewalls comprises a pair of sidewall segments (such as upper sidewall segments of proximal sidewalls 11P) that are laterally spaced apart along the first horizontal direction hd1 by the gate length GL.

In another embodiment, a field effect transistor 100A comprises a semiconductor active region 10A including a source region (31, 32), a channel region 36, and a drain region (38, 39) arranged along a first horizontal direction hd1, a gate dielectric 50 contacting a top surface of the channel region 36, a gate electrode (52, 54) having four sides overlying the gate dielectric 50, a dielectric gate spacer 56 laterally surrounding the gate electrode (52, 54) on the four sides, and dielectric offset spacers 55 located only on two sides of the gate electrode (52, 54) which extend in a second horizontal direction hd2 which is perpendicular to the first horizontal direction hd1. The gate dielectric spacers 56 physically contact the dielectric offset spacers 55 over the two sides of the gate electrode (52, 54) which extend in the second horizontal direction hd2, and the gate dielectric spacers 56 physically contact another two sides of the gate electrode (52, 54) which extend in the first horizontal direction hd1.

In the above described first embodiment of the present disclosure, the gate strip is divided into the gate stacks before forming the dielectric gate spacer 56 and the deep source/drain regions (32, 38). However, in a second embodiment of the present disclosure, the gate strip is divided into the gate stacks after forming the dielectric gate spacer 56 and the deep source/drain regions (32, 38).

Referring to FIGS. 15A-15D, a second exemplary structure according to the second embodiment of the present disclosure can be derived from the first exemplary structure of FIGS. 8A-8D by forming a dielectric gate spacer 56 around each gate strip (50, 52, 54S, 58S) after performing the LDD ion implantation step shown in FIGS. 8A-8D. A dielectric gate spacer material layer can be conformally deposited on the dielectric offset spacers 55 located on the sidewalls of the gate strip, and an anisotropic etch process can be performed to remove horizontally-extending portions of the dielectric gate spacer material layer. The dielectric gate spacer material layer includes a dielectric material such as silicon oxide and/or silicon nitride, and may be formed by at least one chemical vapor deposition process such as at least one low pressure chemical vapor deposition (LPCVD) process. Remaining portion of the dielectric gate spacer material layer comprise dielectric gate spacers 56 that laterally surround a respective gate strip (50, 52, 54S, 58S). In an illustrative example, each dielectric gate spacer 56 can have a width, as measured along the first horizontal direction hd1 over a transistor active region 10A between an inner sidewall and an outer sidewall, in a range from 5 nm to 100 nm, such as from 10 nm to 50 nm, although lesser and greater widths may also be employed.

Generally, each gate strip (50, 52, 54S, 58S) can extend along the second horizontal direction hd2 over a plurality of semiconductor active regions (i.e., the transistor active regions 10A), and can comprise a plurality of gate dielectrics 50 and a gate electrode strip (52, 54S). The gate electrode strip (52, 54S) can comprise a plurality of semiconductor gate electrode portions 52 and a metallic gate electrode strip 54S. Each dielectric gate spacer 56 laterally surrounds a respective gate strip (50, 52, 54S, 58S), and laterally extends along the second horizonal direction hd2 over a plurality of semiconductor active regions 10A. Each dielectric gate spacer 56 can be formed over, and directly on, a plurality of source extension regions 31 that are arranged along the second horizontal direction hd2 and over, and directly on, a plurality of drain extension regions 39 that are arranged along the second horizontal direction hd2.

Referring to FIGS. 16A-16D, additional electrical dopants of the second conductivity type can be implanted into unmasked portions of the semiconductor material layer 10 that are not masked by a combination of the gate strips (50, 52, 54S, 58S) and the dielectric gate spacers 56 to form deep source/drain regions (32, 38). The deep source/drain regions (32, 38) may include, for example, deep source regions 32 and deep drain regions 38. Generally, the atomic concentration of dopants in the deep source/drain region (32, 38) is greater than the atomic concentration of dopants in the source/drain extension regions (31, 39). As such, volumes of the source/drain extension regions (31, 39) that overlap with volumes of the deep source/drain region (32, 38) are incorporated into a respective one of the deep source/drain region (32, 38). In one embodiment, the atomic concentration of dopants in the deep source/drain regions (32, 38) may be in a range from $5.0 \times 10^{18}/cm^3$ to $2.0 \times 10^{21}/cm^3$, although lesser and greater dopant concentrations may also be employed.

According to an aspect of the present disclosure, the gate strips (50, 52, 54S, 58S) cover the entire inter-gate region of the shallow trench isolation structure 20 located between a neighboring pair of transistor active regions 10A. Thus, the additional electrical dopants of the second conductivity type are not implanted into portions of the transistor active regions 10A that are proximal to the widthwise edges of gate electrodes to be subsequently patterned from the gate strips (50, 52, 54S, 58S). Thus, the lateral spacing between neighboring pairs of semiconductor active regions 10A may be reduced without collateral implantation of dopants of the second conductivity type into peripheral portions of the semiconductor active regions 10A that are proximal to the widthwise edges of the gate electrodes (i.e., in the gate fringe region) to be subsequently patterned from the gate strips (50, 52, 54S, 58S).

Unimplanted portions of each transistor active region 10A constitutes a channel region 36. Each channel region 36 may be in a range from $1.0 \times 10^{14}/cm^3$ to $1.0 \times 10^{18}/cm^3$, although lesser and greater dopant concentrations may also be employed. Each contiguous combination of a respective one of source/drain extension regions (31, 39) and a respective one of the deep source/drain region (32, 38) constitutes a source/drain region, which may be a source region (31, 32) including a combination of a source extension region 31 and a deep source region 32, or may be drain region (38, 39) including a combination of a drain extension region 39 and a deep drain region 38. Generally, a source region (32, 32) and a drain region (38, 39) can be formed in portions of each transistor active region 10A that are laterally spaced from each other by a respective channel region 36 in a plan view.

Referring to FIGS. 17A-17D, a photoresist layer 47 can be applied over the gate strips (50, 52, 54S, 58S), the dielectric gate spacers 56, and the plurality of semiconductor active regions (i.e., the transistor active regions 10A). The photoresist layer 47 can be lithographically patterned to form openings 47A that straddle portions of the gate strips (50, 52, 54S, 58S) that overlie top surfaces of the shallow trench isolation structure 20. The patterned photoresist layer 47 comprises at least one row of openings (which may comprise a plurality of rows of openings) 47A arranged along the second horizontal direction hd2 and located within the areas of the shallow trench isolation structure 20. In one embodiment, each opening 47A in the patterned photoresist layer 47 comprises a pair of first edges that straddle a respective underlying gate strip (50, 52, 54S, 58S) and a pair of second edges that overlie a respective dielectric gate spacer 56.

Generally, the patterned photoresist layer 47 can cover the entire area of each of the transistor active regions 10A that is not covered by the gate strips (50, 52, 54S, 58S) or the dielectric gate spacers 56. The patterned photoresist layer 47 includes rectangular openings 47A in areas in which the gate strips (50, 52, 54S, 58S) are subsequently cut. In other words, the areas of the openings 47A in the patterned photoresist layer 47 correspond to areas from which portions of the gate strips (50, 52, 54S, 58S) are subsequently removed. In one embodiment, the patterned photoresist layer 47 comprises a row of openings 47A arranged along the second horizontal direction hd1 and located within the areas of the shallow trench isolation structure 20 and having an areal overlap with a respective portion of an underlying gate strip (50, 52, 54S, 58S). In one embodiment, a row of rectangular openings 47A can be formed in the patterned photoresist layer 47 over each gate strip (50, 52, 54S, 58S).

In one embodiment, each of the rectangular openings 47A in the patterned photoresist layer 47 can have a pair of first straight sidewalls and a pair of second straight sidewalls. The pair of first straight sidewalls can laterally extend along the first horizontal direction hd1 and having a greater length than the gate length GL (i.e., the lateral dimension along the first horizontal direction hd1) of the underlying gate strip (50, 52, 54S, 58S). In one embodiment, the pair of first straight sidewalls can overlie a respective one of the transistor active regions 10A, i.e., can have an areal overlap with the respective one of the transistor active regions 10A in a plan view along a vertical direction that is perpendicular to the top surface of the semiconductor substrate 8. The pair of second sidewalls can laterally extend along the second horizontal direction hd2, overlie and contact a top surface of a respective dielectric gate spacer 56, and does not have an areal overlap with the underlying gate strip (50, 52, 54S, 58S). The pair of second sidewalls of each opening 47A in the patterned photoresist layer 47 may have an areal overlap with peripheral regions of a neighboring pair of transistor active regions 10A.

A top surface segment of a gate cap dielectric 58 and two segments of outer sidewalls of a dielectric gate spacer 56 can be physically exposed within the area of each opening 47A in the patterned photoresist layer 47. The width of each rectangular opening in the patterned photoresist layer 47 along the second horizontal direction hd2 can be greater than the lateral spacing between a neighboring pair of transistor active regions 10A along the second horizontal direction hd2, and can be less than the lateral spacing between a neighboring pair of gate dielectrics 50 that are laterally spaced along the second horizontal direction hd2. The openings 47A in the patterned photoresist layer 47 do not have any areal overlap with the gate dielectrics 50. The length of each rectangular opening 47A in the patterned photoresist layer 47 along the first horizontal direction hd1 can be greater than the gate length of an underlying gate strip (50, 52, 54S, 58S), which is the width of the underlying gate strip (50, 52, 54S, 58S) along the first horizontal direction hd1.

Referring to FIGS. 18A-18D, an anisotropic etch process can be performed to etch unmasked portions of the gate strips (50, 52, 54S, 58S) and the dielectric gate spacers 56. The pattern of rows of openings 47A in the patterned photoresist layer 47 can be transferred through the gate strips (50, 52, 54S, 58S) and into unmasked areas of the dielectric gate spacers 56. Unmasked portions of the offset spacers 55 can be collaterally vertically recessed during the anisotropic etch process. The shallow trench isolation structure 20 is masked by the patterned photoresist layer 47, and is not etched during the anisotropic etch process.

The pattern of the rows of openings in the patterned photoresist layer 47 can be transferred through the gate strips (50, 52, 54S, 58S) and into unmasked portions of the dielectric gate spacers 56 by the anisotropic etch process. Unmasked portions of the gate strips (50, 52, 54S, 58S) are removed by the anisotropic etch process, and remaining portions of the gate strips (50, 52, 54S, 58S) comprise a plurality of gate stacks (50, 52, 54, 58).

Each gate strip (50, 52, 54S, 58S) can be divided into the gate stacks (50, 52, 54, 58) by removing unmasked portions of the respective gate strip (50, 52, 54S, 58S). Each gate electrode strip (52, 54S) can be divided into a respective plurality of gate electrodes (52, 54) that are laterally spaced apart along the second horizontal direction hd2 and overlies a respective one of the plurality of semiconductor active regions 10A. Each gate stack (50, 52, 54, 58) includes a vertical stack of a gate dielectric 50, a semiconductor gate electrode portion 52, a metallic gate electrode portion 54, and a gate cap dielectric 58. Each metallic gate electrode portion 54 is a patterned portion of a respective metallic gate electrode strip 54S. Each gate cap dielectric 58 is a patterned portion of a gate cap dielectric strip 58S. Each of the gate dielectrics 50 is one of a plurality of gate dielectrics 50 within a respective one of the gate strips (50, 52, 54S, 58S). Each contiguous combination of a semiconductor gate electrode portion 52 and a metallic gate electrode portion 54 constitutes a gate electrode (52, 54). Thus, each of the gate electrodes (52, 54) is a patterned portion of a respective gate electrode strip (52, 54S).

Each gate stack (50, 52, 54, 58) is formed over a respective one of the transistor active regions 10A. Each gate stack comprises a gate dielectric 50 and a gate electrode (52, 54).

In one embodiment, the anisotropic etch process etches the materials of the gate strips (50, 52, 54S, 58S) at a higher etch rate than the material of the dielectric gate spacers 56. A pair of stepped sidewalls can be formed on each dielectric gate spacer 56 underneath each opening in the patterned photoresist layer 47.

Figure 18C:
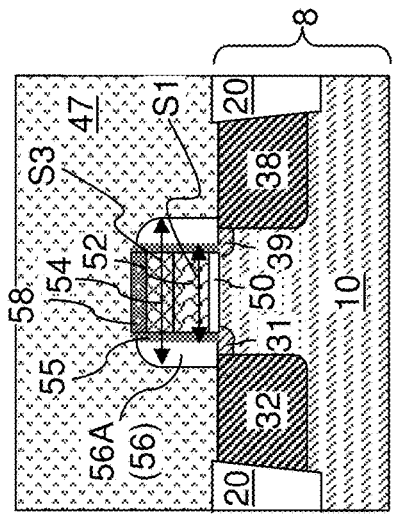
FIG. 18C is a vertical cross-sectional view of the second exemplary structure along the vertical plane C-C' of FIG. 18B.
Figure 18D:
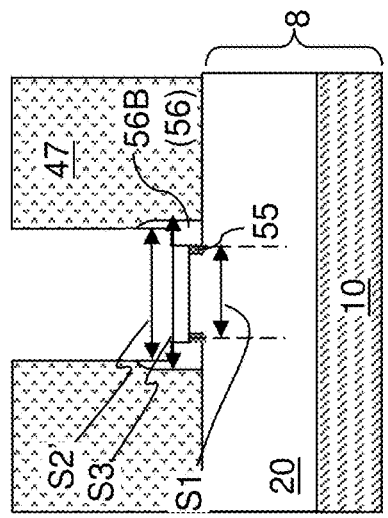
FIG. 18D is a vertical cross-sectional view of the second exemplary structure along the vertical plane D-D' of FIG. 18B.
Figure 18B:
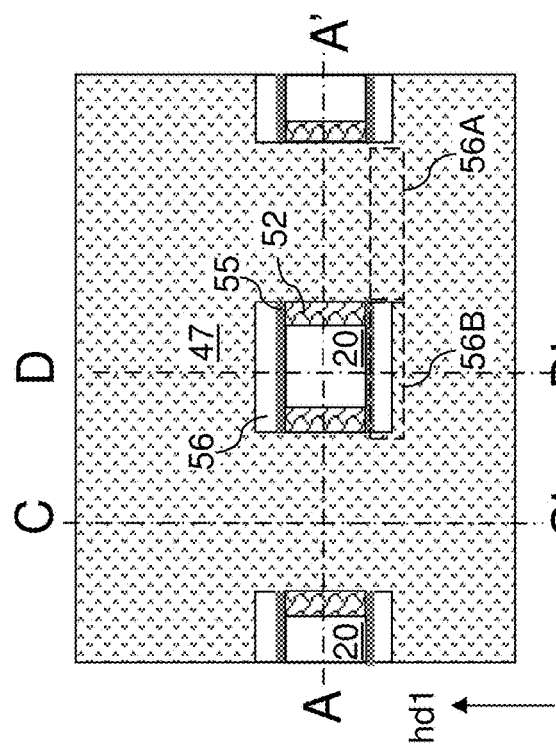
FIG. 18B is a top-down view of the second exemplary structure of FIG. 18A. The vertical plane A-A' is the plane of the vertical cross-section of FIG. 18A.
Figure 18A:
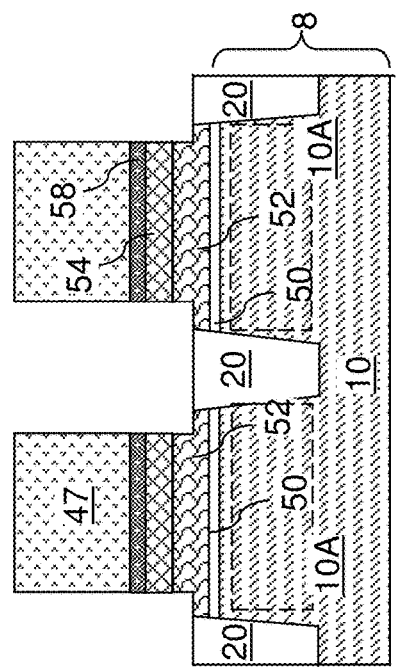
FIG. 18A is a vertical cross-sectional view of the second exemplary structure after patterning the gate strip into gate stacks according to an embodiment of the present disclosure.
Figure 19E:
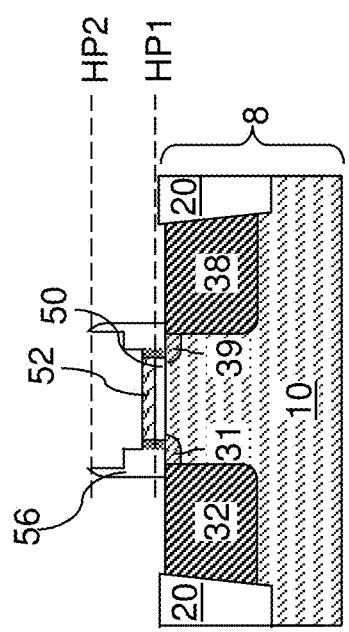
FIG. 19E is a vertical cross-sectional view of the second exemplary structure along the vertical plane E-E' of FIG. 19B.
Figure 23C:
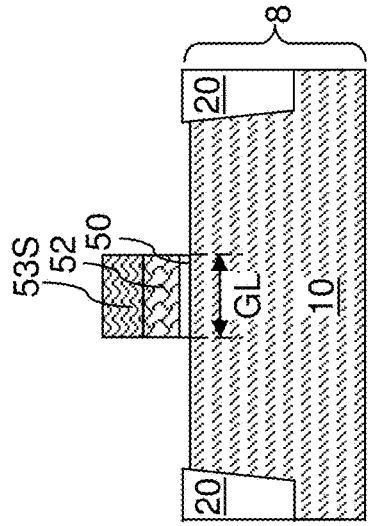
FIG. 23C is a vertical cross-sectional view of the third exemplary structure along the vertical plane C-C' of FIG. 23B.
Figure 23D:
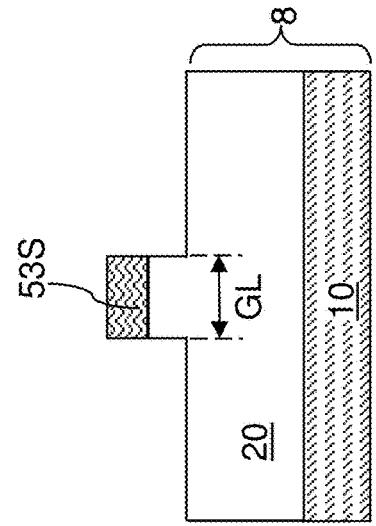
FIG. 23D is a vertical cross-sectional view of the third exemplary structure along the vertical plane D-D' of FIG. 23B.
Figure 23B:
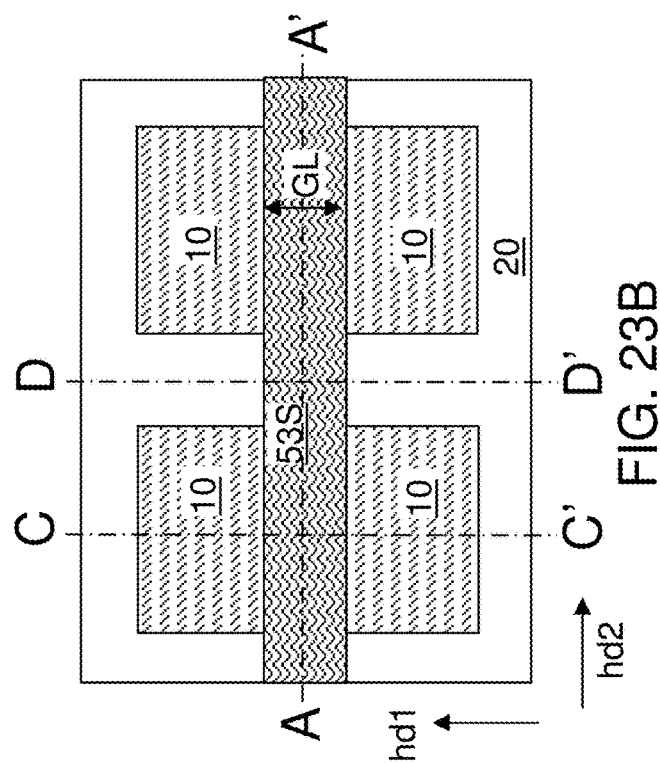
FIG. 23B is a top-down view of the third exemplary structure of FIG. 23A. The vertical plane A-A' is the plane of the vertical cross-section of FIG. 7A.
Figure 23A:
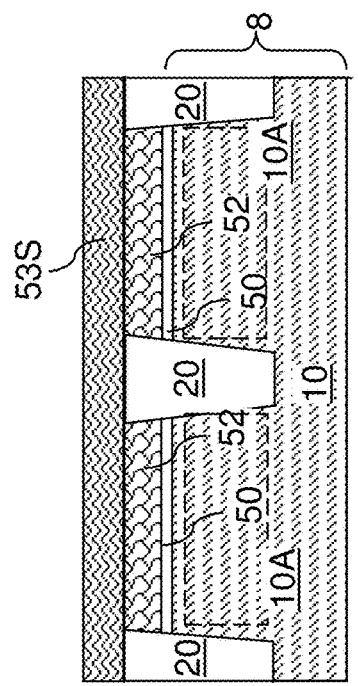
FIG. 23A is a vertical cross-sectional view of the third exemplary structure after formation of a gate strip according to an embodiment of the present disclosure.
Figure 24C:
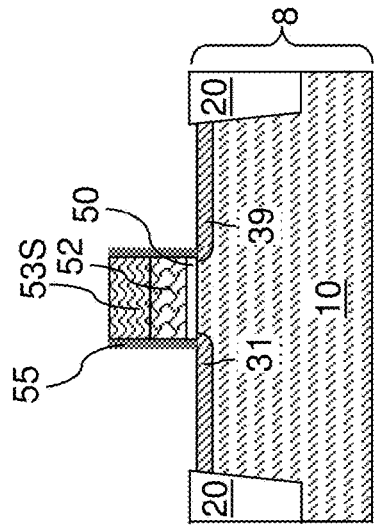
FIG. 24C is a vertical cross-sectional view of the third exemplary structure along the vertical plane C-C' of FIG. 24B.
Figure 24D:
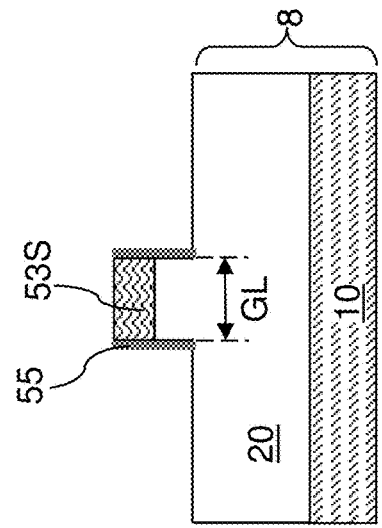
FIG. 24D is a vertical cross-sectional view of the third exemplary structure along the vertical plane D-D' of FIG. 24B.
Figure 24B:
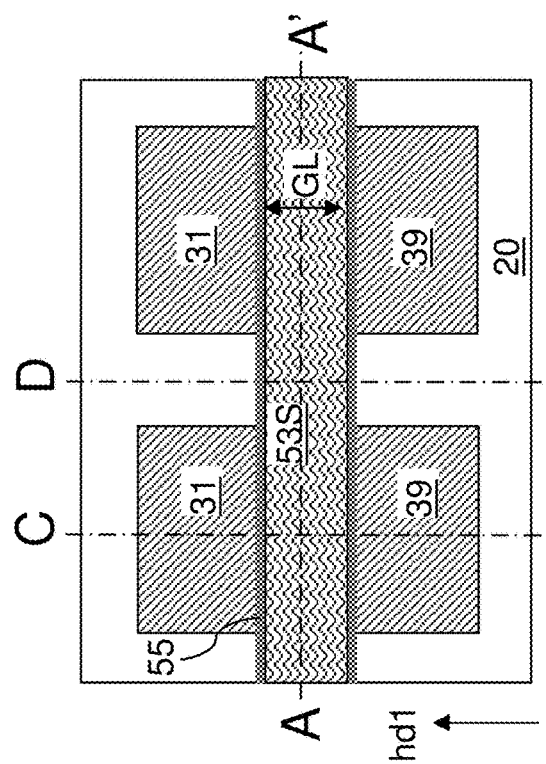
FIG. 24B is a top-down view of the third exemplary structure of FIG. 24A. The vertical plane A-A' is the plane of the vertical cross-section of FIG. 24A.
Figure 24A:
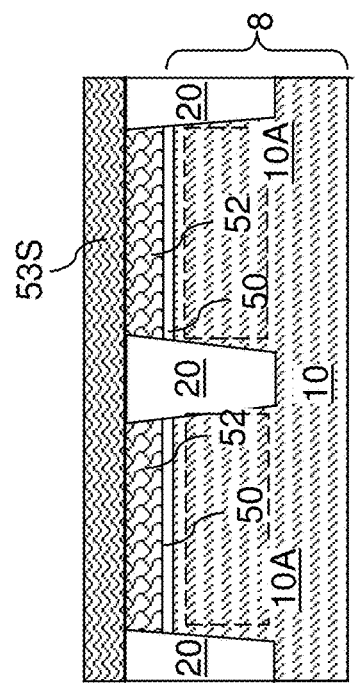
FIG. 24A is a vertical cross-sectional view of the third exemplary structure after formation of an offset spacer and source/drain extension regions according to an embodiment of the present disclosure.
Figure 25C:
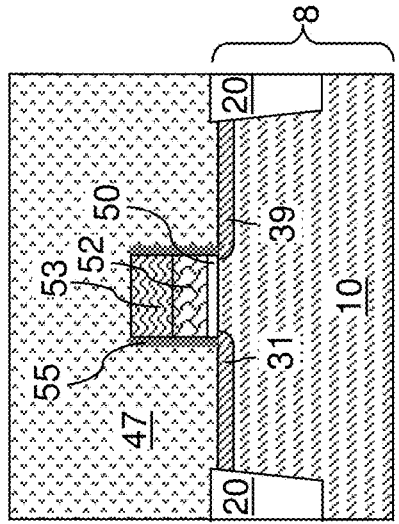
FIG. 25C is a vertical cross-sectional view of the third exemplary structure along the vertical plane C-C' of FIG. 25B.
Figure 25D:
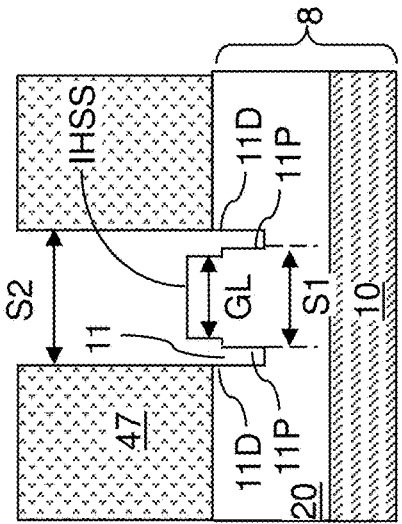
FIG. 25D is a vertical cross-sectional view of the third exemplary structure along the vertical plane D-D' of FIG. 25B.
Figure 25B:
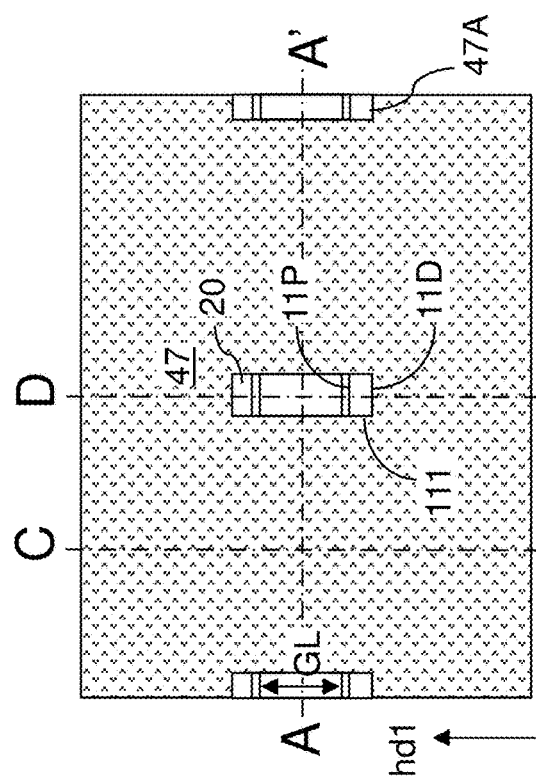
FIG. 25B is a top-down view of the third exemplary structure of FIG. 25A. The vertical plane A-A' is the plane of the vertical cross-section of FIG. 25A.
Figure 25A:
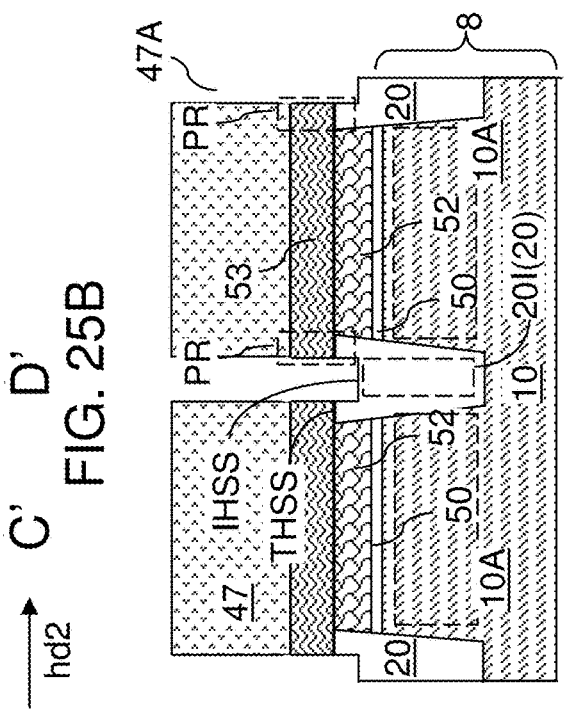
FIG. 25A is a vertical cross-sectional view of the third exemplary structure after patterning the gate strip into gate stacks according to an embodiment of the present disclosure.
Figure 26C:
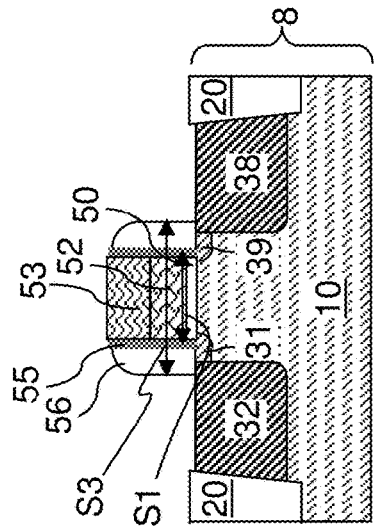
FIG. 26C is a vertical cross-sectional view of the third exemplary structure along the vertical plane C-C' of FIG. 26B.
Figure 26D:
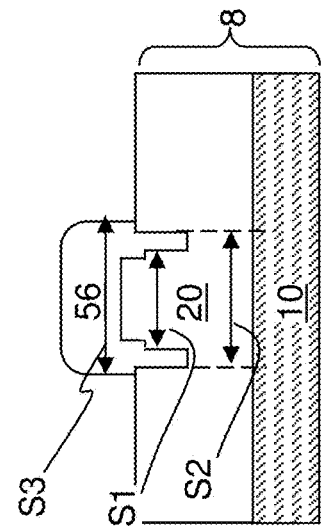
FIG. 26D is a vertical cross-sectional view of the third exemplary structure along the vertical plane D-D' of FIG. 26B.
Figure 26B:
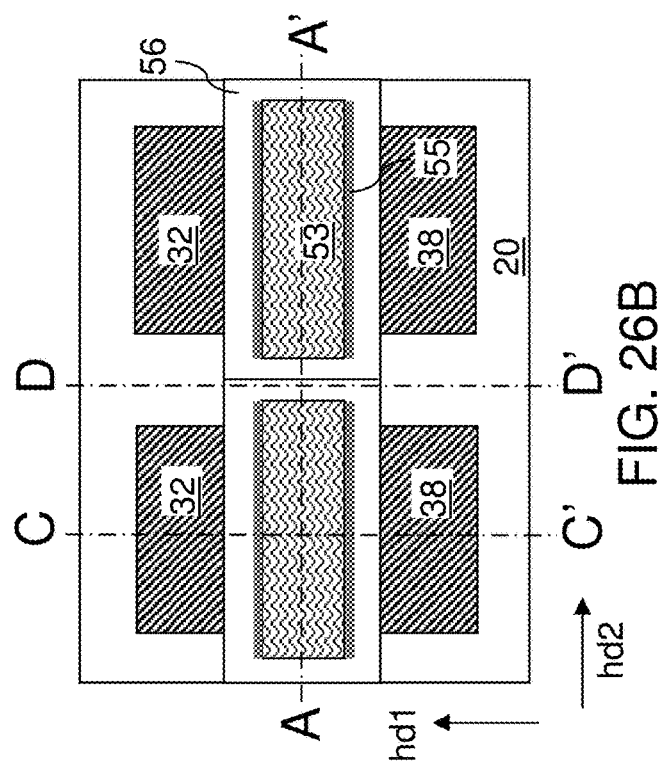
FIG. 26B is a top-down view of the third exemplary structure of FIG. 26A. The vertical plane A-A' is the plane of the vertical cross-section of FIG. 26A.
Figure 26A:
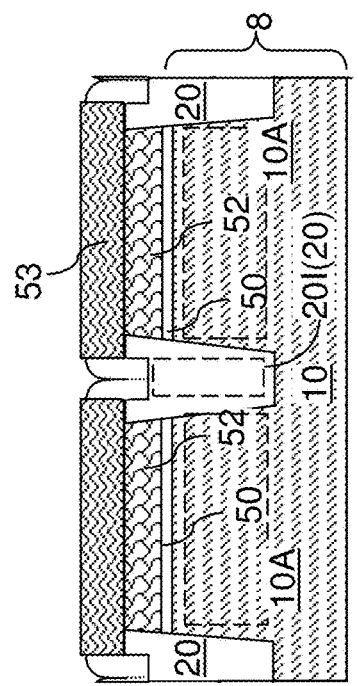
FIG. 26A is a vertical cross-sectional view of the third exemplary structure after formation of dielectric gate spacers according to an embodiment of the present disclosure.
Figure 27C:
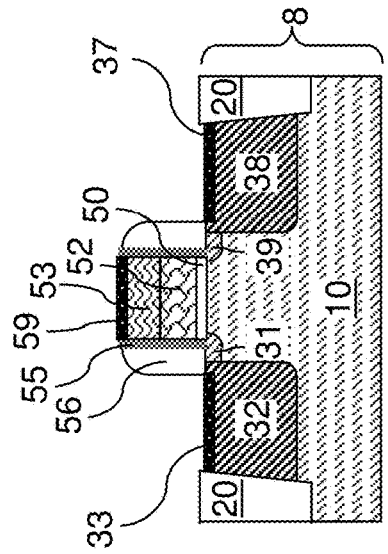
FIG. 27C is a vertical cross-sectional view of the third exemplary structure along the vertical plane C-C' of FIG. 27B.
Figure 27D:
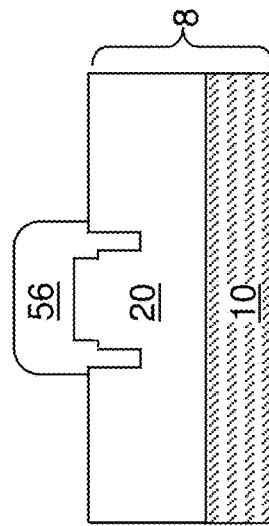
FIG. 27D is a vertical cross-sectional view of the third exemplary structure along the vertical plane D-D' of FIG. 27B.
Figure 27B:
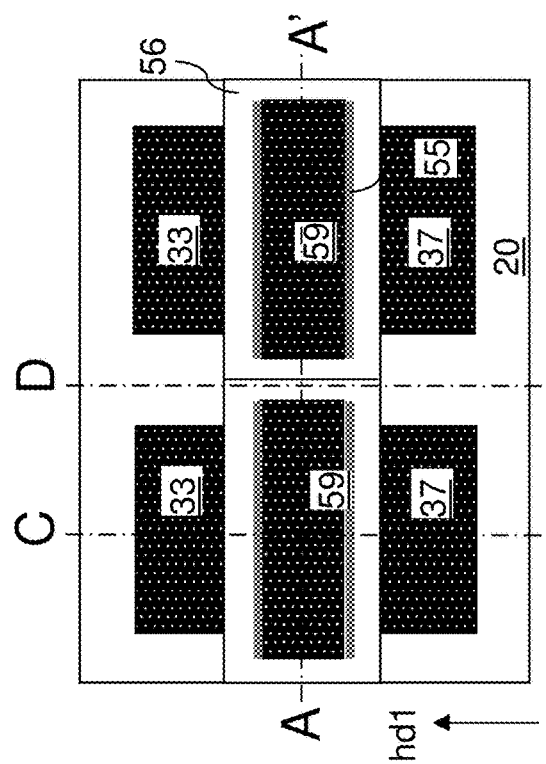
FIG. 27B is a top-down view of the third exemplary structure of FIG. 27A. The vertical plane A-A' is the plane of the vertical cross-section of FIG. 27A.
Figure 27A:
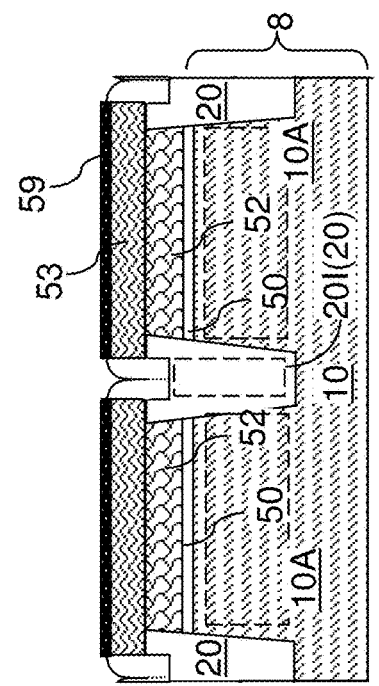
FIG. 27A is a vertical cross-sectional view of the third exemplary structure after formation of deep source/drain regions and silicide regions according to an embodiment of the present disclosure.

In one embodiment, each dielectric gate spacer 56 comprises over-active-region gate spacer portions 56A overlying the semiconductor active regions 10A, as shown in FIG. 18C. The over-active-region gate spacer portions 56A comprises straight inner sidewalls that are perpendicular to the first horizontal direction hd1 and laterally spaced apart by a first spacing S1, which is also referred to as a gate spacer inner sidewall spacing, i.e., the spacing between a pair of inner sidewalls of a dielectric gate spacer 56. In one embodiment, each dielectric gate spacer 56 also comprises inter-active-region gate spacer portions 56B overlying portions of the shallow trench isolation structure 20, as shown in FIG. 18D. The inter-active-region gate spacer portion 56B comprises stepped sidewalls including a lower straight sidewall segment 56L adjoined to, and located within same vertical planes as, a respective pair of straight inner sidewalls of neighboring over-active-region gate spacer portions 56A, an upper straight sidewall segment 56U that is laterally offset from the lower straight sidewall segment, and a connecting horizontal surface 56H that is adjoined to a top edge of the lower straight sidewall segment and to a bottom edge of the upper straight sidewall segment. A pair of upper straight sidewall segments 56U of two inter-active-region gate spacer portions 56B located within a same opening 47A in the patterned photoresist layer 47 can be laterally spaced apart from each other by a second spacing S2', which is herein referred to as a gate spacer upper inner sidewall segment spacing. A lateral distance between outer sidewalls of each dielectric gate spacer 56 along the first horizontal direction hd1 can be uniform, and is herein referred to as a third spacing S3, which is also referred to as a gate spacer outer sidewall spacing. The second spacing S2' can be less than the third spacing S3.

In one embodiment, the shallow trench isolation structure 20 can have a planar top surface located in a horizontal plane and at least within areas that are covered by the patterned photoresist layer 47 or by the dielectric gate spacers 56. The lower straight sidewall segments 56L of the inter-active-region gate spacer portions 56B can contact the planar top surface of the shallow trench isolation structure 20. In one embodiment, each of the upper straight sidewall segments 56U of the inter-active-region gate spacer portions 56B has a respective top edge that that is adjoined to a top edge of a respective segment of a concave outer sidewall of the inter-active-region gate spacer portions 56B of the dielectric gate spacers 56.

In one embodiment, the shallow trench isolation structure 20 comprises inter-gate regions located between a neighboring pair of semiconductor active regions 10A and within an area enclosed by an outer periphery of a respective dielectric gate spacer 56. A pair of the inter-active-region gate spacer portions 56B overlies each of the inter-gate regions. In one embodiment, upper straight sidewall segments 56U of the pair of inter-active-region gate spacer portions 56B are laterally spaced from each other along the first horizontal direction hd1 by a gate spacer upper inner sidewall segment spacing (such as the second spacing S2'). Lower straight sidewall segments 56L of the pair of inter-active-region gate spacer portions 56B are laterally spaced apart from each other along the first horizontal direction by a gate spacer inner sidewall spacing (such as the first spacing S1) that is less than the gate spacer upper inner sidewall segment spacing. In embodiments in which the offset spacers 55 are omitted, the gate spacer inner sidewall spacing (such as the first spacing S1) may be the same as the gate length. In one embodiment, a pair of straight inner sidewalls of each of the over-active-region gate spacer portions 56A can be laterally spaced apart along the first horizontal direction by the gate spacer inner sidewall spacing (such as the first spacing S1).

Referring to FIGS. 19A-19E, the patterned photoresist layer 47 can be removed, for example, by ashing. In one embodiment, the straight inner sidewalls of the over-active-region gate spacer portions 56A vertically extend at least from a first horizontal plane HP1 including bottom surfaces of the gate electrodes (52, 54) and at least to a second horizontal plane HP2 including top surfaces of the gate electrodes (52, 54). The entirety of the connecting surfaces of the over-active-region gate spacer portions 56A is located above the first horizonal plane HP1 and below the second horizontal plane HP2. In one embodiment, the straight inner sidewalls of the over-active-region gate spacer portions 56A contact top surfaces of the source regions (31, 32) and the drain regions (38, 39).

Referring to FIGS. 20A-20D, at least one dielectric material layer (62, 64, 80) can be deposited over the second exemplary structure. In one embodiment, the at least one dielectric material layer (62, 64, 80) comprises a vertical stack comprising at least one conformal dielectric liner (62, 64) and a contact-level dielectric layer 80 overlying the at least one conformal dielectric liner (62, 64). Each of the at least one dielectric liner (62, 64) can be deposited over the physically exposed surfaces of the gate stacks (50, 52, 54, 58), the dielectric gate spacers 56, the source regions (31, 32), and the drain regions (38, 39) by at least one conformal deposition process. The at least one dielectric liner (62, 64) may comprise, for example, a stack of a silicon oxide liner 62 and a silicon nitride liner 64. A contact-level dielectric layer 80 can be deposited over the gate stacks (50, 52, 54, 58), the source/drain regions {(31, 32), (38, 39)}, the shallow trench isolation structure 20, and the optional at least one dielectric liner (62, 64). The contact-level dielectric layer 80 comprises a dielectric material, such as silicon oxide. A planarization process such as a chemical mechanical planarization process can be optionally performed to planarize the top surface of the contact-level dielectric layer 80. The vertical distance between the top surface of the contact-level dielectric layer 80 and the top surfaces of the gate cap dielectrics 58 may be in a range from 50 nm to 500 nm, although lesser and greater vertical distances may also be employed. The contact via structures (82, 85, 88) are then formed through the contact-level dielectric layer 80 as described above.

Referring collectively to FIGS. 1A-8D and 15A-20D and according to the second embodiment of the present disclosure, a semiconductor structure comprises a first field effect transistor 200A and a second field effect transistor 200B and a shallow trench isolation structure 20. Each of the first and second field effect transistors (200A, 200B) comprises a semiconductor active region 10A including a source region (31, 32), a channel region 36, and a drain region (38, 39) arranged along a first horizontal direction hd1, a gate dielectric 50 contacting a top surface of the channel region 36, a gate electrode (52, 54) overlying the gate dielectric 50, and a pair of dielectric gate spacers 56 located on opposite sides of the gate electrode (52, 54). The shallow trench isolation 20 structure laterally surrounds each of the semiconductor active regions 10A of the first and second two field effect transistors (200A, 200B). Each of the pair of dielectric gate spacers 56 comprises over-active-region gate spacer portions 56A overlying the semiconductor active regions 10A and comprising straight inner sidewalls that are perpendicular to the first horizontal direction hd1, and inter-active-region gate spacer portions 56B overlying portions of the shallow trench isolation structure 20 and comprising stepped sidewalls including a lower straight sidewall segment 56L adjoined to a respective pair of straight inner sidewalls, an upper straight sidewall segment 56U that is laterally offset from the lower straight sidewall segment 56L, and a connecting surface 56H that is adjoined to a top edge of the lower straight sidewall segment 56L and to a bottom edge of the upper straight sidewall segment 56U.

In one embodiment, the straight inner sidewalls vertically extend at least from a first horizontal plane HP1 including bottom surfaces of the gate electrodes (52, 54) and at least to a second horizontal plane HP2 including top surfaces of the gate electrodes (52, 54). In one embodiment, the entirety of the connecting surface 56H is located above the first horizonal plane HP1 and below the second horizontal plane HP2. In one embodiment, the straight inner sidewalls contact top surfaces of the source regions (31, 32) and the drain regions (38, 39).

In one embodiment, the shallow trench isolation structure 20 has a planar top surface located in a horizontal plane and within areas that are not covered by the gate electrodes (52, 54); and the lower straight sidewall segments 56L contact the planar top surface of the shallow trench isolation structure 20.

In one embodiment, each of the straight inner sidewalls has a respective top edge that is adjoined to a top edge of a respective segment of a concave outer sidewall of the dielectric gate spacer 56; and each of the upper straight sidewall segments 56U has a respective top edge that that is adjoined to a top edge of a respective additional segment of the concave outer sidewall of the dielectric gate spacer 56.

In one embodiment, the shallow trench isolation structure 20 comprises inter-gate regions located between a neighboring pair of semiconductor active regions 10A and within an area enclosed by an outer periphery of the dielectric gate spacer 56; and a pair of inter-active-region gate spacer portions 56B overlies each of the inter-gate regions.

In one embodiment, upper straight sidewall segments 56U of the pair of inter-active-region gate spacer portions 56B are laterally spaced from each other along the first horizontal direction hd1 by a gate spacer upper inner sidewall segment spacing (such as a second spacing S2'); and lower straight sidewall segments 56L of the pair of inter-active-region gate spacer portions 56B are laterally spaced apart from each other along the first horizontal direction hd1 by a gate spacer inner sidewall spacing (such as a first spacing S1) that is less than the gate spacer upper inner sidewall segment spacing. In one embodiment, a pair of straight inner sidewalls of each of the over-active-region gate spacer portions 56A is laterally spaced apart along the first horizontal direction hd1 by the gate spacer inner sidewall spacing.

In one embodiment, the semiconductor structure comprises at least one dielectric material layer (62, 64, 80) overlying the gate electrodes (52, 54) and the dielectric gate spacer 56, wherein each of the gate electrodes (52, 54) comprises a respective widthwise sidewall that is parallel to the first horizontal direction hd1 and in direct contact with the at least one dielectric material layer (62, 64, 80) (such as the silicon oxide liner 62). In one embodiment, at least one of the gate electrodes (52, 54) comprises a pair of widthwise sidewalls that contact a respective sidewall of the at least one dielectric material layer (62, 64, 80) (such as the silicon oxide liner 62).

In one embodiment, the at least one dielectric material layer (62, 64, 80) comprises a vertical stack comprising at least one conformal dielectric liner (62, 64) and a contact-level dielectric layer 80 overlying the at least one conformal dielectric liner (62, 64); and the at least one conformal dielectric liner (62, 64) contacts top surfaces of the source regions (31, 32), the drain regions (38, 39), the shallow trench isolation structure 20, and each of the stepped sidewall of the inter-active-region gate spacer portions 56B. In one embodiment, the at least one conformal dielectric liner (62, 64) contacts an entirety of a concave outer sidewall of the dielectric gate spacer 56 that is adjoined to top edges of the straight inner sidewalls of the over-active-region gate spacer portions 56A and to top edges of the stepped sidewalls of the inter-active-region gate spacer portions 56B.

In one embodiment, each of the gate electrodes (52, 54) comprises a semiconductor gate electrode portion 52 contacting a top surface of a respective one of the gate dielectrics; and a metallic gate electrode portion 54 that overlies the semiconductor gate electrode portion 52 and having a first length along a second horizontal direction hd2 that is perpendicular to the first horizontal direction hd1. The semiconductor gate electrode portion 52 comprises an upper region having the first length and a lower region having a second length along the second horizontal direction hd2 that that is greater than the first length. The first length of the metallic gate electrode portion along the second horizontal direction hd2 is smaller than a length of the active region 10A in the second horizontal direction hd2, such that an edge of the metallic gate electrode portion 54 which extends along the first horizontal direction hd1 is located over the active region 10A.

In one embodiment, the semiconductor gate electrode portion 52 comprises: upper widthwise sidewalls that laterally extend along the first horizontal direction hd1 and vertically coincident with widthwise sidewalls of the metallic gate electrode portion 54; lower widthwise sidewalls that laterally extend along the second horizontal direction hd2 and contacting sidewall segments of the shallow trench isolation structure 20; and horizontal surface segments connecting an upper edge of a respective one of the lower widthwise sidewalls to a lower edge of a respective one of the upper widthwise sidewalls.

The various embodiments of the present disclosure can be employed to scale a row of field effect transistors, such as a two-dimensional array of field effect transistors, along the lengthwise direction of gate electrodes (52, 54), i.e., along the direction that is perpendicular to the direction of current flow in the channel region between the source and drain regions within each of the field effect transistors. Specifically, at least the LDD ion implantation process can be performed prior to dividing gate strips (50, 52, 54S, 58S) into gate electrodes, thereby preventing collateral implantation of electrical dopants in proximity to widthwise edges of gate electrodes (52, 54) to be subsequently patterned. This reduces or eliminates leakage current paths in the gate fringe area.

Referring to FIGS. 21A and 21B, a third exemplary structure according to a third embodiment of the present disclosure may be the same as the first exemplary structure illustrated in FIGS. 5A and 5B. In this third embodiment, the semiconductor gate electrode material layer 52L is hereafter referred to as a first semiconductor gate electrode material layer 52L. Generally, a shallow trench isolation structure 20 can be formed in an upper region of a semiconductor substrate 8 that has a doping of a first conductivity type. The shallow trench isolation structure 20 laterally surrounds a plurality of semiconductor active regions that are patterned portions of the semiconductor substrate 8.

Referring to FIGS. 22A and 22B, a second semiconductor gate electrode material layer 53L can be formed over the first semiconductor gate electrode material layers 52L. The second semiconductor gate electrode material layer 53L includes a doped semiconductor material, such as doped polysilicon or doped amorphous silicon. The second semiconductor gate electrode material layer 53L has a doping of a same conductivity type as the first semiconductor gate electrode material layer 52L, and may, or may not, include a same semiconductor material as the first semiconductor gate electrode material layer 52L. In one embodiment, the second semiconductor gate electrode material layer 53L can be deposited by chemical vapor deposition (CVD). The thickness of the second semiconductor gate electrode material layer 53L can be in a range from 30 nm to 300 nm, although lesser and greater thicknesses may also be employed.

Referring to FIGS. 23A-23D, a photoresist layer (not shown) can be applied over the second semiconductor gate electrode material layer 53L, and can be patterned into discrete photoresist material portions by lithographic exposure and development. Each patterned photoresist material portion can have a shape of a respective gate strip to be subsequently formed. In one embodiment, the transistor active regions 10A may be arranged as at least one row of transistor active regions 10A arranged along the second horizontal direction hd2. In one embodiment, the transistor active regions 10A may be arranged as multiple rows of transistor active regions 10A arranged along the second horizontal direction hd2. In this case, the illustrated portion of the first exemplary structure as shown in FIGS. 23A-23D corresponds to two neighboring transistor active regions 10A that are arranged along the second horizontal direction hd2. In one embodiment, the transistor active regions 10A may be arranged as a two-dimensional periodic array such as a two-dimensional periodic rectangular array.

Each patterned photoresist material portion can may have a respective rectangular horizontal cross-sectional shape having a respective pair of lengthwise sidewalls along the second horizontal direction hd2. In one embodiment, each patterned photoresist material portion can laterally extend along the second horizontal direction hd2 over a plurality of transistor active regions 10A, such as a row of transistor active regions 10A that are arranged along the second horizontal direction hd2.

An anisotropic etch process can be performed to transfer the pattern of the patterned photoresist material portions through the second semiconductor gate electrode material layer 53L, the first semiconductor gate electrode material layer 52L, and the gate dielectric layer 50L. Unmasked areas of the shallow trench isolation structure 20 may be collaterally recessed during the anisotropic etch process.

A gate strip (50, 52, 53S) can be formed over each row of transistor active regions 10A that are arranged along the second horizontal direction hd2. Each gate strip (50, 52, 53S) comprises patterned portions of the second semiconductor gate electrode material layer 53L, the first semiconductor gate electrode material layer 52L, and the gate dielectric layer 50L. For example, each gate strip (50, 52, 53S) includes a plurality of gate dielectrics 50 that are patterned portions of the gate dielectric layer SOL, a plurality of lower semiconductor gate electrode sub-portions 52 that are patterned portions of the first semiconductor gate electrode material layer 52L, and a second semiconductor gate electrode strip 53S that is a patterned portion of the second semiconductor gate electrode material layer 53L. A contiguous combination of the plurality of lower semiconductor gate electrode sub-portions 52 and the metallic gate electrode strip 53A constitutes a gate electrode strip (52, 53S). The gate electrode strip (52, 53S) continuously extends as a single continuous structure over each transistor active region 10A within a row of transistor active regions 10A. Each gate electrode strip (52, 53S) can comprise a pair of lengthwise sidewalls that laterally extend along the second horizontal direction hd2, and laterally spaced apart along the first horizontal direction by a gate length GL. In one embodiment, each gate electrode strip (52, 53S) may comprise a plurality of surface segments, such as sidewalls of lower semiconductor gate electrode sub-portions 52, that laterally extend along the first horizontal direction hd1 and contact a respective sidewall surface segment of the shallow trench isolation structure 20.

Referring to FIGS. 24A-24D, offset spacers 55 may be optionally formed on sidewalls of the gate strips (50, 52, 53S). The offset spacers 55 may be formed by conformal deposition of a thin dielectric liner and an anisotropic etch process that removes horizontally-extending portions of the thin dielectric liner, and/or may be formed by surface oxidation of the physically exposed surfaces of the lower semiconductor gate electrode sub-portions 52. The lateral thickness of the offset spacer 55, if present, may be in a range from 0.3 nm to 20 nm, such as from 1 nm to 6 nm, although lesser and greater thicknesses may also be employed. The offset spacers 55 may comprise silicon oxide, silicon nitride or a silicon oxide/silicon nitride bilayer.

Electrical dopants of a second conductivity type can be implanted into unmasked portions of the semiconductor material layer 10 that are not masked by the gate strips (50, 52, 53S) to form source/drain extension regions (31, 39). The second conductivity type is the opposite of the first conductivity type. For example, if the first conductivity type is p-type, the second conductivity type is n-type, and vice versa. The source/drain extension regions (31, 39) may include, for example, source extension regions 31 and drain extension regions 39. Generally, each of the source/drain extension regions (31, 39) can have a doping of an opposite conductivity type than the conductivity type of a remaining portion of the transistor active region 10A on which the respective one of the source/drain extension regions (31, 39) is formed. For example, if a transistor active region 10A has a doping of a first conductivity type, the source/drain extension regions (31, 39) that are formed within surface regions of the transistor active region 10A have a doping of a second conductivity type that is the opposite of the first conductivity type. For example, if the first conductivity type is p-type, the second conductivity type is n-type, and vice versa. The atomic concentration of dopants in the source/drain extension regions (31, 39) may be in a range from $1.0 \times 10^{18}/cm^3$ to $1.0 \times 10^{20}/cm^3$, although lesser and greater dopant concentrations may also be employed. Thus, the extension regions (i.e., LDD regions) (31, 39) are implanted prior to separating the gate strips (50, 52, 53S) into gate electrodes. The gate strips block the LDD implant process from doping the edge regions of the transistor active regions 10A under the gate strips in the gate fringe region. The prevention of doping the gate fringe regions at the edge of each transistor active region 10A doping prevents or reduces a leakage current path through the gate fringe region and reduces the transistor leakage current.

Referring to FIGS. 25A-25D, a photoresist layer 47 can be applied over the first exemplary structure, and can be lithographically patterned to form openings 47A that straddle portions of the gate strips (50, 52, 53S) that overlie top surfaces of the shallow trench isolation structure 20. Generally, the patterned photoresist layer 47 can cover the entire area of each of the transistor active regions 10A, and includes rectangular openings 47A in areas (i.e., the gate fringe areas between the transistor active regions 10A) in which the gate strips (50, 52, 53S) are subsequently cut. In other words, the areas of the openings 47A in the patterned photoresist layer 47 correspond to the gate fringe areas from which portions of the gate strips (50, 52, 53S) are subsequently removed. In one embodiment, the patterned photoresist layer comprises a row of openings 47A arranged along the second horizontal direction hd2 and located within the gate fringe areas overlying the shallow trench isolation structure 20 and having an areal overlap with a respective portion of an underlying gate strip (50, 52, 53S). In one embodiment, a row of rectangular openings 47A can be formed in the patterned photoresist layer 47 over each gate strip (50, 52, 53S).

In one embodiment, each of the rectangular openings 47A in the patterned photoresist layer 47 can have a pair of first straight sidewalls and a pair of second straight sidewalls. The pair of first straight sidewalls can laterally extend along the first horizontal direction hd1 and having a greater length than the gate length GL (i.e., the lateral dimension along the first horizontal direction hd1) of the underlying gate strip (50, 52, 53S). The pair of second sidewalls can laterally extend along the second horizontal direction hd2, overlie and contact a respective portion of the shallow trench isolation structure 20, as shown in FIG. 9D. Thus, the second sidewalls do not have an areal overlap with the underlying gate strip (50, 52, 53S). The pair of second sidewalls of each opening 47A in the patterned photoresist layer 47 also does not have any areal overlap with any of the transistor active regions 10A.

A portion of the top surface shallow trench isolation structure 20 is exposed in the opening 47A. Specifically, a pair of rectangular top surface segments of the shallow trench isolation structure 20 can be physically exposed within the area of each opening 47A in the patterned photoresist layer 47. Further, a rectangular surface segment of the top surface of a second semiconductor gate electrode strip 53S can be physically exposed within the area of each opening 47A in the patterned photoresist layer 47. The width of each rectangular opening 47A in the patterned photoresist layer 47 along the second horizontal direction hd2 can be less than the lateral spacing between a neighboring pair of transistor active regions 10A along the second horizontal direction hd2. The length of each rectangular opening 47A in the patterned photoresist layer 47 along the first horizontal direction hd1 can be greater than the gate length GL of an underlying gate strip (50, 52, 53S), which is the width of the underlying gate strip (50, 52, 53S) along the first horizontal direction hd1.

An anisotropic etch process can be performed to etch unmasked portions of each gate strip (50, 52, 53S). The etch process is performed after implantation of the extension regions (i.e., LDD regions) (31, 39) into the transistor active regions 10A. The pattern of rows of openings 47A in the patterned photoresist layer 47 can be transferred through the gate strips (50, 52, 53S) and into unmasked areas of the shallow trench isolation structure 20. Unmasked portions of the offset spacers 55 can be collaterally removed during the anisotropic etch process. Unmasked portions of the shallow trench isolation structure 20 can be collaterally vertically recessed to form via cavities 11. A pair of via cavities 11 that vertically extend into the shallow trench isolation structure 20 can be formed within each opening within the rows of openings in the patterned photoresist layer 47.

Each gate strip (50, 52, 53S) can be divided into the gate stacks (50, 52, 53) by removing portions of the respective gate strip (50, 52, 53S) that are located within the gate fringe areas overlying the shallow trench isolation structure 20. Each gate stack (50, 52, 53) includes a vertical stack of a gate dielectric 50, a lower semiconductor gate electrode sub-portion 52, and a upper semiconductor gate electrode sub-portion 53. Each upper semiconductor gate electrode sub-portion 53 is a patterned portion of a respective second semiconductor gate electrode strip 53S. Each of the gate dielectrics 50 is one of a plurality of gate dielectrics 50 within a respective one of the gate strips (50, 52, 53S). Each contiguous combination of a lower semiconductor gate electrode sub-portion 52 and a upper semiconductor gate electrode sub-portion 53 constitutes a semiconductor gate electrode portion, which is a gate electrode (52, 53). Thus, each of the gate electrodes (52, 53) is a patterned portion of a respective gate electrode strip (52, 53S).

Each gate stack (50, 52, 53) is formed over a respective one of the transistor active regions 10A. Each gate stack comprises a gate dielectric 50 and a gate electrode (52, 53). In one embodiment, each of the gate stacks (50, 52, 53) comprises a pair of peripheral regions PR located in the gate fringe region and having an areal overlap with the shallow trench isolation structure 20 in a plan view along a vertical direction that is perpendicular to a top surface of the semiconductor substrate 8.

A pair of via cavities 11 can be formed underneath each opening 47A in the patterned photoresist layer 47. The pair of via cavities 11 comprises a pair of proximal sidewalls 11P that are laterally spaced apart along the first horizontal direction hd1 by a first spacing S1, which is also referred to as a gate spacer inner sidewall spacing, i.e., the spacing between a pair of inner sidewalls of a gate spacer to be subsequently formed. In one embodiment, the pair of via cavities 11 also comprises a pair of distal sidewalls 11D that are laterally spaced apart along the first horizontal direction hd1 by a second spacing S2, which is referred to as a trench distal sidewall spacing.

Each region of the shallow trench isolation structure 20 that is located within an area located between a neighboring pair of gate dielectrics 50 is herein referred to as an inter-gate region. Each inter-gate region of the shallow trench isolation structure 20 comprises a pair of topmost horizontal surface segments THSS of the shallow trench isolation structure 20 that contacts a respective bottom surface segment of a neighboring pair of gate electrodes (52, 53), such as bottom surface segments of a neighboring pair of upper semiconductor gate electrode sub-portions 53. Further, each inter-gate region of the shallow trench isolation structure 20 comprises an intermediate horizontal surface segment IHSS that is adjoined to the topmost horizontal surface segments by a pair of vertical surface segments and located between a respective pair of via cavities 11. The intermediate horizontal surface segment is physically exposed underneath an opening 47A in the patterned photoresist layer 47.

In one embodiment, the intermediate horizontal surface segment IHSS is located above the horizontal plane including a planar top surface of the shallow trench isolation structure 20 that is covered by the patterned photoresist layer 47. In one embodiment, bottom surfaces of the via cavities 11 are located below the horizontal plane including the planar top surface of the shallow trench isolation structure 20 that is covered by the patterned photoresist layer 47.

In one embodiment, each of the via cavities 11 comprises a pair of stepped proximal sidewalls having a respective horizontal step located between an upper vertical proximal sidewall segment and a lower vertical proximal sidewall segment. A pair of lower vertical proximal sidewall segments can be laterally spaced from each other by the first spacing S1. A pair of upper vertical proximal sidewall segments can be laterally spaced from each other by the gate length GL.

In one embodiment, each of the via cavities 11 comprises a pair of first sidewalls 111 that are parallel to the first horizontal direction hd1 and vertically coincident with widthwise sidewalls of a neighboring pair of gate electrodes (52, 53), and a pair of second sidewalls (such as a proximal sidewall 11P and a distal sidewall 11D) that are perpendicular to the first horizontal direction hd1 and adjoined to vertically-extending edges of the pair of first sidewalls 111. In one embodiment, each of the gate electrodes (52, 53) comprises a pair of lengthwise sidewalls that is perpendicular to the first horizontal direction hd1 and laterally spaced apart along the first horizontal direction hd1 by a gate length GL. In one embodiment, the pair of second sidewalls 11P of each via cavity 11 comprises a pair of sidewall segments (which are upper straight sidewall segments of a pair of stepped sidewalls 11P) that are laterally spaced apart along the first horizontal direction by the gate length GL.

In one embodiment, each of the gate electrodes (52, 53) comprises a pair of lengthwise sidewalls that are laterally spaced apart along the first horizontal direction hd1 by the gate length GL and laterally extend along the second horizontal direction hd2. A lateral spacing between a pair of horizontal steps 11H of the pair of stepped proximal sidewalls 11P over each inter-gate region of the shallow trench isolation structure 20 is the same as the gate length GL.

In one embodiment, each of the gate electrodes (52, 53) comprises a lower semiconductor gate electrode sub-portion 52 contacting a top surface of a respective one of the gate dielectrics 50, and an upper semiconductor gate electrode sub-portion 53 that overlies the lower semiconductor gate electrode sub-portion 52. In one embodiment, the lower semiconductor gate electrode sub-portion 52 contacts sidewalls of a pair of inter-gate regions of the shallow trench isolation structure 20. In one embodiment, the semiconductor gate electrode portion comprises a top surface located within a same horizontal plane as topmost surface segments of the pair of inter-gate regions of the shallow trench isolation structure 20. In one embodiment, the upper semiconductor gate electrode sub-portion 53 contacts the topmost surface segments of the pair of inter-gate regions of the shallow trench isolation structure 20.

In one embodiment, lengthwise sidewalls of the upper semiconductor gate electrode sub-portion 53 that are perpendicular to the first horizontal direction hd1 are vertically coincident with lengthwise sidewalls of the lower semiconductor gate electrode sub-portion 52 within each gate electrode (52, 53). Widthwise sidewalls of the upper semiconductor gate electrode sub-portion 53 that are parallel to the first horizontal direction hd1 are laterally offset outward from widthwise sidewalls of the lower semiconductor gate electrode sub-portion 52 within each gate electrode (52, 53).

Generally, each the gate strip (50, 52, 53S) can be divided into the gate stacks (50, 52, 53) by removing portions of the gate strip (50, 52, 53S) that are overlie the inter-electrode regions 20I of the shallow trench isolation structure 20 after forming the source/drain extension regions (31, 39) and prior to formation of deep source/drain regions.

Referring to FIGS. 26A-26D, the patterned photoresist layer 47 can be removed, for example, by ashing. A dielectric gate spacer material layer can be conformally deposited, and an anisotropic etch process can be performed to remove horizontally-extending portions of the dielectric gate spacer material layer. The dielectric gate spacer material layer includes a dielectric material such as silicon oxide and/or silicon nitride, and may be formed by at least one chemical vapor deposition process such as at least one low pressure chemical vapor deposition (LPCVD) process. Remaining portion of the dielectric gate spacer material layer comprise dielectric gate spacers 56 that laterally surround a respective one of the gate stacks (50, 52, 53). In an illustrative example, each dielectric gate spacer 56 can have a width, as measured along the first horizontal direction hd1 over a transistor active region 10A between an inner sidewall and an outer sidewall, in a range from 5 nm to 100 nm, such as from 10 nm to 50 nm, although lesser and greater widths may also be employed.

According to an aspect of the present disclosure, the thickness of the dielectric gate spacer material layer can be greater than one half of the spacing between neighboring pairs of gate stacks (50, 52, 53) that are laterally spaced apart along the second horizontal direction hd2. For example, the thickness of the dielectric gate spacer material layer can be greater than one half of the width of each opening 47A in the patterned photoresist layer 47 along the second horizontal direction hd2 as employed at the processing steps of FIGS. 25A-25D. In this case, vertical growth surfaces of the dielectric gate spacer material layer merge to form a seam between each neighboring pair of gate stacks (50, 52, 53) that are laterally spaced apart along the second horizontal direction hd2. After the anisotropic etch process that forms the dielectric gate spacers 56, neighboring pairs of dielectric gate spacers 56 arranged along the second horizontal direction hd2 contact each other at a vertical plane located midway between the neighboring pairs of dielectric gate spacers 56 and extending along the first horizontal direction hd2. All inter-gate regions of the shallow trench isolation structure 20 can be covered by the dielectric gate spacers 56.

Generally, each neighboring pair of dielectric gate spacers 56 that are laterally spaced along the second horizontal direction hd1 can contact each other along a respective vertical plane that is parallel to the first horizontal direction hd1. In one embodiment, outer widthwise sidewalls of a neighboring pair of dielectric gate spacers 56 contact each other at a vertical seam that laterally extends along the first horizontal direction hd1 above each inter-gate region of the shallow trench isolation structure 20.

Each of the via cavities 11 can be filled by downward-protruding portions of a respective pair of dielectric gate spacers 56. Each neighboring pair of the dielectric gate spacers 56 that are arranged along the second horizontal direction hd2 can be in contact with each other over a respective inter-gate region of the shallow trench isolation structure 20, which comprises a pair of via cavities 11 filled with downward-protruding portions of a respective neighboring pair of the dielectric gate spacers 56.

In one embodiment, each of the dielectric gate spacers 56 comprises a pair of inner lengthwise sidewalls that face toward a respective gate electrode (52, 53), laterally extend along a second horizontal direction hd2, and laterally spaced apart along the first horizontal direction hd1 by the first spacing S1, i.e., by the gate spacer 55 inner sidewall spacing. In one embodiment, each of the dielectric gate spacers 56 comprises a pair of outer lengthwise sidewalls that face away from the respective gate electrode (52, 53), laterally extend along the second horizontal direction hd2, and laterally spaced apart along the first horizontal direction by a third spacing S3, which is herein referred to as a gate spacer outer sidewall spacing. In one embodiment, the third spacing S3 (i.e., the gate spacer outer sidewall spacing) can be greater than the second spacing S2 (i.e., the trench distal sidewall spacing).

In one embodiment, each inter-gate region of the shallow trench isolation structure comprises a pair of sidewall segments that laterally extend along the first horizontal direction hd1, adjoined to a respective topmost surface segment of the inter-gate region of the shallow trench isolation structure 20, and contacted by a sidewall of a respective one of the dielectric gate spacers 56. In one embodiment, the dielectric gate spacer 56 can comprise four downward-protruding portions vertically extending into four via cavities 11 within the shallow trench isolation structure 20. In one embodiment, the shallow trench isolation structure 20 can have a planar top surface located in a horizontal plane and within areas that are not covered by the gate electrodes (52, 53) or by the dielectric gate spacers 56.

Thus, the dielectric offset spacers 55 are formed only on two sides of each of the gate electrodes (52, 53) which extend in the second horizontal direction hd2 and are absent on the other two sides of each of the gate electrodes (52, 53) which extend in the perpendicular first horizontal direction hd1. In contrast, gate dielectric spacers 56 laterally surround each of the gate electrodes (52, 53) on all four sides. Thus, the gate dielectric spacers 56 physically contact the dielectric offset spacers 55 located on two sides of each of the gate electrodes (52, 53) which extend in the second horizontal direction hd2, and the gate dielectric spacers 56 physically contact the other two sides of each of the gate electrodes (52, 53) which extend in the first horizontal direction hd1.

Referring to FIGS. 27A-27D, additional electrical dopants of the second conductivity type can be implanted into unmasked portions of the semiconductor material layer 10 that are not masked by the gate stacks (50, 52, 53), and the dielectric gate spacers 56 to form deep source/drain regions (32, 38).

According to an aspect of the present disclosure, the gaps between neighboring pairs of gate electrodes (52, 53) that are laterally spaced apart along the second horizontal direction hd2 are filled with a pair of dielectric gate spacers 56. Thus, the additional electrical dopants of the second conductivity type are not implanted into portions of the transistor active regions 10A that are proximal to the widthwise edges of the upper semiconductor gate electrode sub-portions 53 that are parallel to the first horizontal direction hd1. This characteristic enables reduction of the lateral spacing between neighboring pairs of semiconductor active regions 10A without concern for collateral implantation of dopants of the second conductivity type into peripheral portions of the semiconductor active regions 10A that are proximal to the widthwise edges of the upper semiconductor gate electrode sub-portions 53 that are parallel to the first horizontal direction hd1.

The deep source/drain regions (32, 38) may include, for example, deep source regions 32 and deep drain regions 38. Generally, the atomic concentration of dopants in the deep source/drain region (32, 38) is greater than the atomic concentration of dopants in the source/drain extension regions (31, 39). As such, volumes of the source/drain extension regions (31, 39) that overlap with volumes of the deep source/drain region (32, 38) are incorporated into a respective one of the deep source/drain region (32, 38). In one embodiment, the atomic concentration of dopants in the deep source/drain regions (32, 38) may be in a range from $5.0 \times 10^{18}/cm^3$ to $2.0 \times 10^{21}/cm^3$, although lesser and greater dopant concentrations may also be employed.

Unimplanted portions of each transistor active region 10A constitutes a channel region 36. Each channel region 36 may have an atomic concentration of dopants of the first conductivity type in a range from $1.0 \times 10^{14}/cm^3$ to $1.0 \times 10^{18}/cm^3$, although lesser and greater dopant concentrations may also be employed. Each contiguous combination of a respective one of source/drain extension regions (31, 39) and a respective one of the deep source/drain region (32, 38) constitutes a source/drain region, which may be a source region (31, 32) including a combination of a source extension region 31 and a deep source region 32, or may be drain region (38, 39) including a combination of a drain extension region 39 and a deep drain region 38. Generally, a source region (32, 32) and a drain region (38, 39) can be formed in portions of each transistor active region 10A that are laterally spaced from each other by a respective channel region 36.

Generally, a plurality of transistor active regions 10A can have a doping of a first conductivity type, source extension regions 31 and drain extension regions 39 can be formed in upper portions of the plurality of transistor active regions 10A by implanting dopants of a second conductivity type that is the opposite of the first conductivity type, and deep source/drain regions (32, 38) can be formed by implanting additional dopants of the second conductivity type into portions of the plurality of semiconductor active regions 10A without implanting the additional dopants of the second conductivity type into the inter-electrode regions 20I of the shallow trench isolation structure 20. In one embodiment, the dielectric gate spacers 56 prevent implantation of the additional dopants of the second conductivity type into the inter-electrode regions 20I of the shallow trench isolation structure 20.

A metal layer can be deposited over the third exemplary structure. The metal layer comprises, and/or consists essentially of, a metal that forms a silicide with the semiconductor (e.g., silicon) materials of the transistor active regions 10A and the upper semiconductor gate electrode sub-portions 53. For example, the semiconductor materials of the transistor active regions 10A and the upper semiconductor gate electrode sub-portions 53 may include amorphous silicon, polysilicon, or a silicon-germanium alloy, and the metal layer can comprise, and/or can consist essentially of a silicide forming metal, such as at least one metal selected from tungsten, titanium, tantalum, cobalt, molybdenum, platinum, and/or nickel. The metal layer may be deposited by physical vapor deposition or chemical vapor deposition. The thickness of horizontally-extending portions of the metal layer may be in a range from 6 nm to 60 nm, such as from 12 nm to 30 nm, although lesser and greater thicknesses may also be employed.

A thermal or flash lamp anneal process can be performed to induce a reaction between the metal layer and the underlying semiconductor material portions to form metal silicide regions using the silicide process. Surface portions of the upper semiconductor gate electrode sub-portions 53 (which are surface portions of the semiconductor gate electrode portions (52, 53)) are converted into gate silicide regions 59 by reacting with the metal. Surface portions of the deep source/drain regions (32, 38) are converted into source/drain silicide regions (33, 37) by reacting with the metal. Unreacted portions of the metal layer can be removed selective to the silicide materials of the gate silicide regions 59 and the source/drain silicide regions (33, 37). Each of the silicide materials of the gate silicide regions 59 and the source/drain silicide regions (33, 37) may have a thickness in a range from 2 nm to 60 nm, such as from 4 nm to 30 nm, although lesser and greater thicknesses may also be employed.

Referring to FIGS. 28A-28D, at least one dielectric liner (62, 64) can be optionally formed over the physically exposed surfaces of the first exemplary structure by at least one conformal deposition process. The at least one dielectric liner (62, 64) may comprise, for example, a stack of a silicon oxide liner 62 and a silicon nitride liner 64. A contact-level dielectric layer 80 can be deposited over the gate stacks (50, 52, 53), the source/drain regions {(31, 32), (38, 39)}, the shallow trench isolation structure 20, and the optional at least one dielectric liner (62, 64). The contact-level dielectric layer 80 comprises a dielectric material such as silicon oxide. A planarization process such as a chemical mechanical planarization process can be optionally performed to planarize the top surface of the contact-level dielectric layer 80. The vertical distance between the top surface of the contact-level dielectric layer 80 and the top surfaces of the gate electrodes (52, 53, 59) may be in a range from 50 nm to 500 nm, although lesser and greater vertical distances may also be employed.

Referring to FIGS. 29A-29D, contact via cavities can be formed through the contact-level dielectric layer 80, and can be filled with at least one conductive material such as at least one metallic material. Excess portions of the at least one conductive material can be removed from above the horizontal plane including the top surface of the contact-level dielectric layer 80 by a planarization process, which may include a recess etch process and/or a chemical mechanical planarization process. Each remaining portion of the at least one conductive material constitutes a contact via structure (82, 85, 88). The contact via structures (82, 85, 88) may comprise source contact via structures 82 contacting a respective one of the source silicide regions 33, drain contact via structures 88 contacting a respective one of the drain silicide regions 37, and gate contact via structures 85 contacting a respective one of the gate silicide regions 59.

Figure 29E:
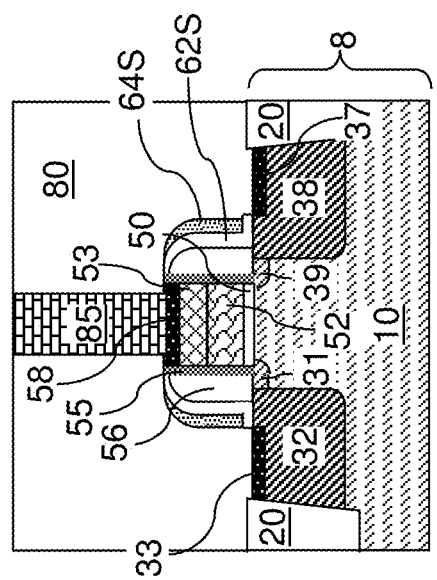
FIG. 29E is a vertical cross-sectional view of an alternative third exemplary structure after formation of contact via structures according to an alternative embodiment of the present disclosure.
Figure 32C:
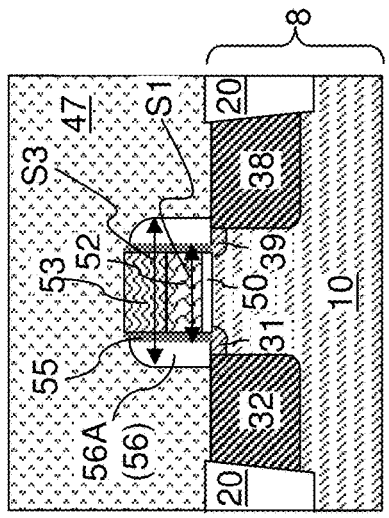
FIG. 32C is a vertical cross-sectional view of the fourth exemplary structure along the vertical plane C-C' of FIG. 32B.
Figure 32D:
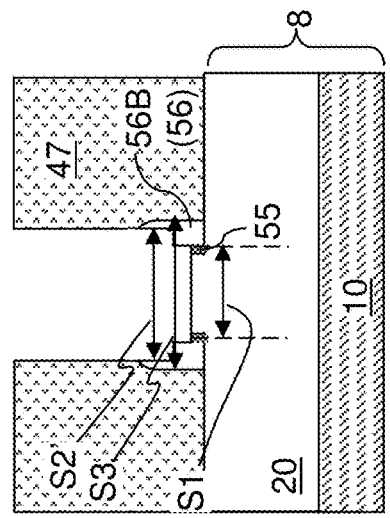
FIG. 32D is a vertical cross-sectional view of the fourth exemplary structure along the vertical plane D-D' of FIG. 32B.
Figure 32B:
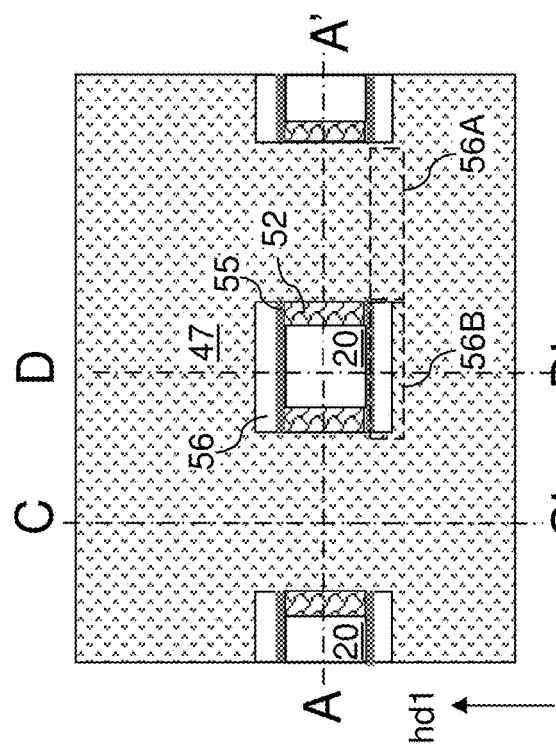
FIG. 32B is a top-down view of the fourth exemplary structure of FIG. 32A. The vertical plane A-A' is the plane of the vertical cross-section of FIG. 32A.
Figure 32A:
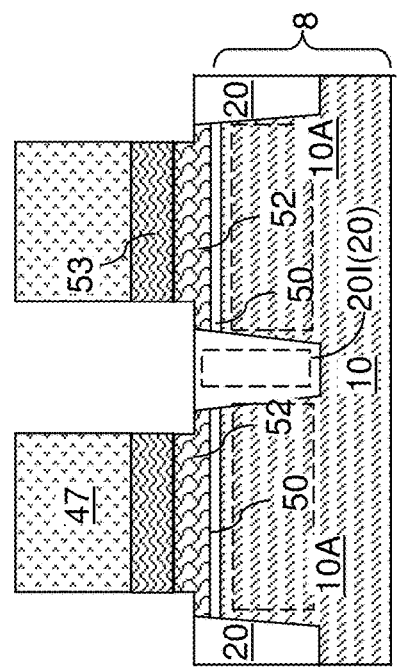
FIG. 32A is a vertical cross-sectional view of the fourth exemplary structure after patterning the gate strip into gate stacks according to an embodiment of the present disclosure.
Figure 33B:
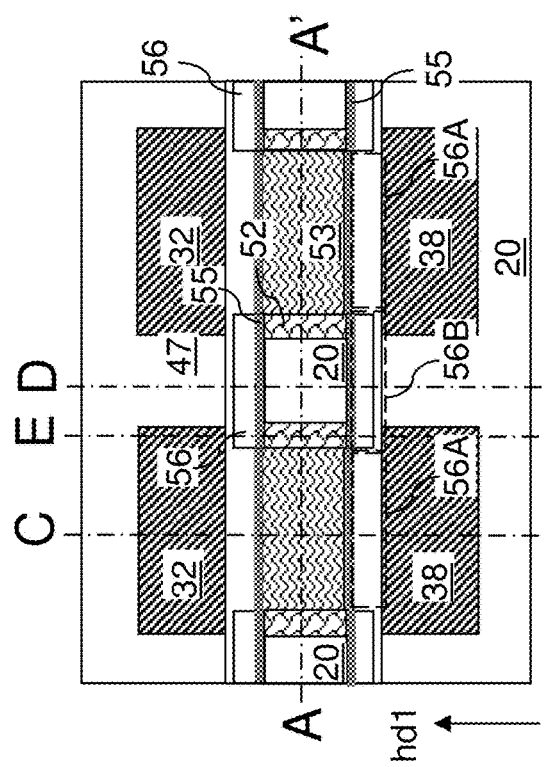
FIG. 33B is a top-down view of the fourth exemplary structure of FIG. 33A. The vertical plane A-A' is the plane of the vertical cross-section of FIG. 33A.
Figure 33C:
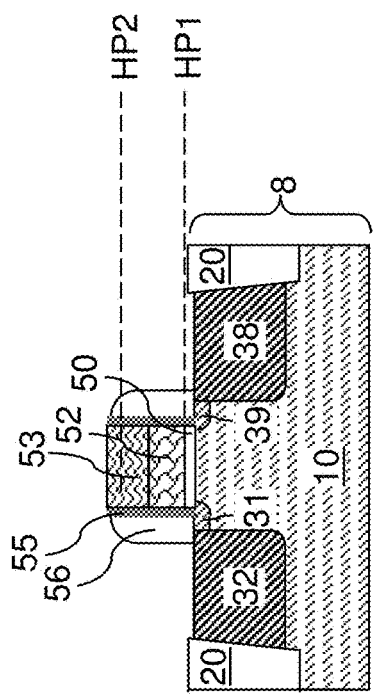
FIG. 33C is a vertical cross-sectional view of the fourth exemplary structure along the vertical plane C-C' of FIG. 33B.
Figure 33A:
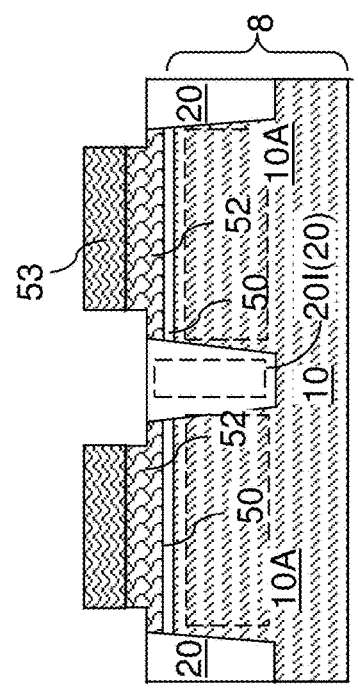
FIG. 33A is a vertical cross-sectional view of the fourth exemplary structure after removal of the photoresist layer according to an embodiment of the present disclosure.
Figure 33D:
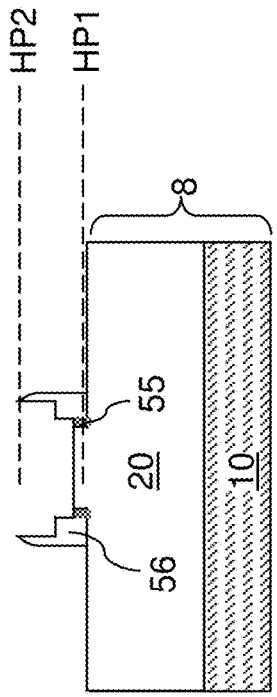
FIG. 33D is a vertical cross-sectional view of the fourth exemplary structure along the vertical plane D-D' of FIG. 33B.
Figure 33E:
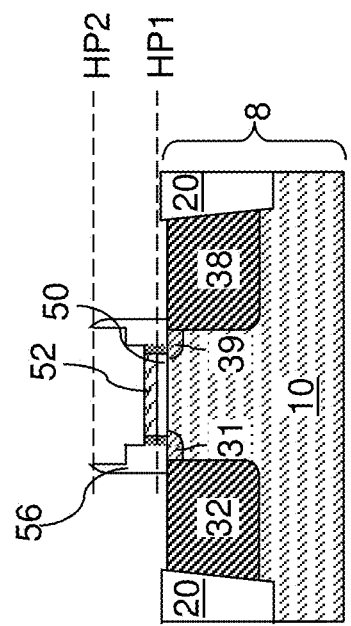
FIG. 33E is a vertical cross-sectional view of the fourth exemplary structure along the vertical plane E-E' of FIG. 33B.
Figure 34C:
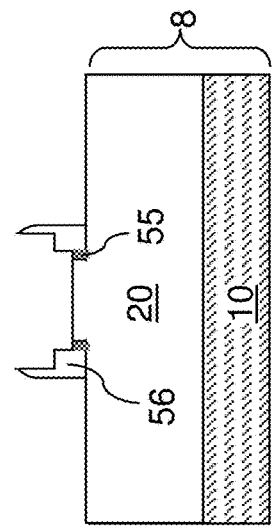
Figure 34D:
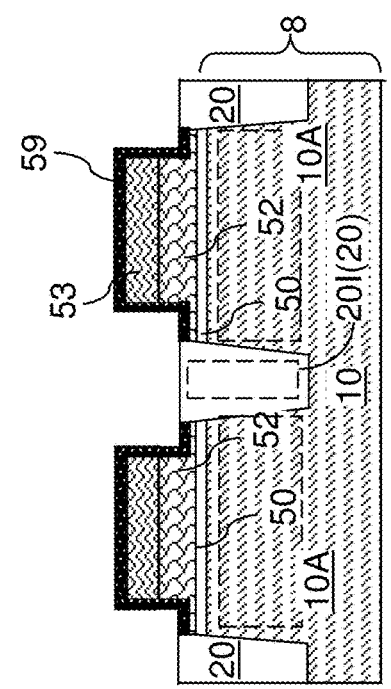
Figure 34B:
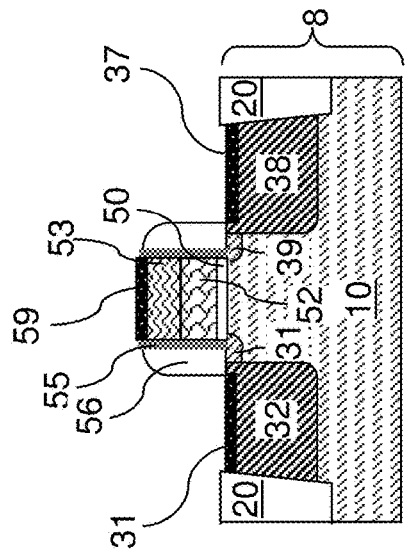
Figure 34A:
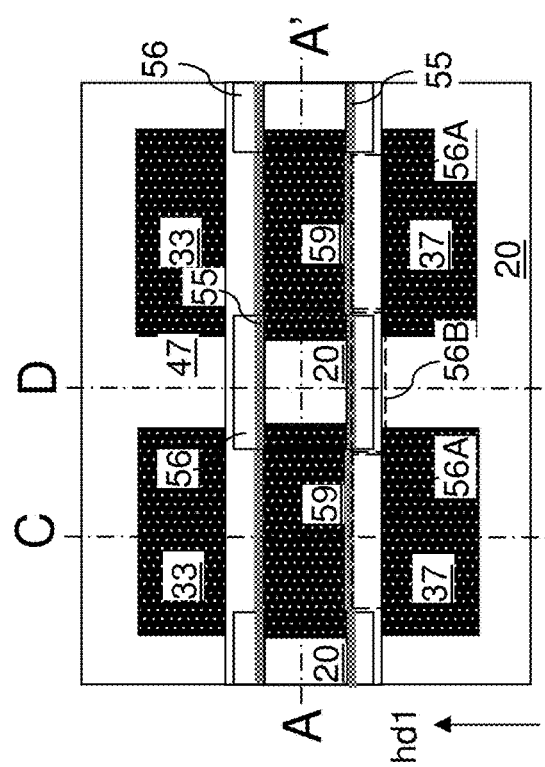

FIG. 29E illustrates an alternative configuration of the alternative third exemplary structure of the third embodiment. In this alternative configuration, the at least one dielectric liner (62, 64) shown in FIGS. 28A-28D is deposited prior to depositing the metal layer which forms the silicide regions (33, 37, 59) by the salicide process. An anisotropic sidewall spacer etch process is used to etch the at least one dielectric liner (62, 64) to form additional sidewalls spacers (62S, 64S) on the side of the gate electrode (52, 53). After forming the additional sidewall spacers (62S 64S), the metal layer is deposited over the alternative third exemplary structure, including over the additional sidewall spacers (62S 64S). The salicide process anneal is then conducted to form the silicide regions (33, 37, 59) of the alternative third exemplary structure, as described above with respect to FIGS. 27A-27D.

Referring collectively to FIGS. 21A-29E and related drawings and according to the third embodiment of the present disclosure, a semiconductor structure is provided, which comprises: first and second field effect transistors (200A, 200B), wherein each of the first and second field effect transistors (200A, 200B) comprises: a semiconductor active region 10A including a source region (31, 32), a channel region, and a drain region (38. 39) arranged along a first horizontal direction hd1; a gate dielectric 50 contacting a top surface of the channel region; a gate electrode (52, 53, 59) overlying the gate dielectric 50 and comprising a semiconductor gate electrode portion (52, 53) and a gate silicide region 59; and a dielectric gate spacer 56 laterally surrounding the gate electrode (52, 53, 59); and a shallow trench isolation structure 20 which laterally surrounds each of the semiconductor active regions 10A of the first and second two field effect transistors (200A, 200B), wherein the shallow trench isolation structure 20 comprises two via cavities 11 (as illustrated in FIGS. 25A-25D) that are laterally spaced apart along the first horizontal direction hd1; and the dielectric gate spacers 56 of the first and the second field effect transistors (200A, 200B) contain downward-protruding portions which fill the two via cavities 11 in the shallow trench isolation structure 20.

In one embodiment, the two via cavities 11 are connected by a planar top surface (such as an intermediate horizontal surface segment IHSS) of the shallow trench isolation structure 20, and are located in an inter-gate region 20I between the gate electrodes (52, 53, 59) of the first and second field effect transistors (200A, 200B).

In one embodiment, each of the first and second field effect transistors comprises: a source silicide region 33 in contact with a respective source region (31, 32); and a drain silicide region 37 in contact with a respective drain region (28, 29).

In one embodiment, each of the source silicide regions 33 and the drain silicide regions 37 of the first and second field effect transistors (200A, 200B) contact a sidewall of a respective one of the dielectric gate spacers 56.

In one embodiment, each semiconductor gate electrode portion (52, 53) of the first and second field effect transistors (200A, 200B) comprises: a lower semiconductor gate electrode sub-portion 52 contacting a top surface of a respective one of the gate dielectrics 50; and an upper semiconductor gate electrode sub-portion 53 that overlies the lower semiconductor gate electrode portion 52 and contacting a respective top surface segment of the shallow trench isolation structure 20.

In one embodiment, each inter-gate region 20I of the shallow trench isolation structure 20 comprises: a pair of topmost horizontal surface segments THSS contacting a respective bottom surface segment of a neighboring pair of gate electrodes (52, 53, 59); and an intermediate horizontal surface segment IHSS that is adjoined to the topmost horizontal surface segments THSS by a pair of vertical surface segments and located between a respective pair of via cavities.

In one embodiment, the intermediate horizontal surface segment IHSS is located above a planar top surface of the shallow trench isolation structure 20 that connects upper edges of the two cavities 11.

Referring to FIGS. 30A-30D, a fourth exemplary structure according to an embodiment of the present disclosure can be derived from the third exemplary structure of FIGS. 24A-24D by forming a dielectric gate spacer 56 around each gate strip (50, 52, 53S) after performing the LDD ion implantation step shown in FIGS. 24A-24D. A dielectric gate spacer material layer can be conformally deposited on the dielectric offset spacers 55 located on the sidewalls of the gate strip, and an anisotropic etch process can be performed to remove horizontally-extending portions of the dielectric gate spacer material layer. The dielectric gate spacer material layer includes a dielectric material such as silicon oxide and/or silicon nitride, and may be formed by at least one chemical vapor deposition process such as at least one low pressure chemical vapor deposition (LPCVD) process. Remaining portion of the dielectric gate spacer material layer comprise dielectric gate spacers 56 that laterally surround a respective gate strip (50, 52, 53S). In an illustrative example, each dielectric gate spacer 56 can have a width, as measured along the first horizontal direction hd1 over a transistor active region 10A between an inner sidewall and an outer sidewall, in a range from 5 nm to 100 nm, such as from 10 nm to 50 nm, although lesser and greater widths may also be employed.

Generally, each gate strip (50, 52, 53S) can extend along the second horizontal direction hd2 over a plurality of semiconductor active regions (i.e., the transistor active regions 10A), and can comprise a plurality of gate dielectrics 50 and a gate electrode strip (52, 53S). The gate electrode strip (52, 53S) can comprise a plurality of first semiconductor gate electrode portions 52 and a second semiconductor gate electrode strip 53S. Each dielectric gate spacer 56 laterally surrounds a respective gate strip (50, 52, 53S), and laterally extends along the second horizonal direction hd2 over a plurality of semiconductor active regions 10A. Each dielectric gate spacer 56 can be formed over, and directly on, a plurality of source extension regions 31 that are arranged along the second horizontal direction hd2 and over, and directly on, a plurality of drain extension regions 39 that are arranged along the second horizontal direction hd2.

Referring to FIGS. 31A-31D, additional electrical dopants of the second conductivity type can be implanted into unmasked portions of the semiconductor material layer 10 that are not masked by a combination of the gate strips (50, 52, 53S) and the dielectric gate spacers 56 to form deep source/drain regions (32, 38). The deep source/drain regions (32, 38) may include, for example, deep source regions 32 and deep drain regions 38. Generally, the atomic concentration of dopants in the deep source/drain region (32, 38) is greater than the atomic concentration of dopants in the source/drain extension regions (31, 39). As such, volumes of the source/drain extension regions (31, 39) that overlap with volumes of the deep source/drain region (32, 38) are incorporated into a respective one of the deep source/drain region (32, 38). In one embodiment, the atomic concentration of dopants in the deep source/drain regions (32, 38) may be in a range from $5.0 \times 10^{18}/cm^3$ to $2.0 \times 10^{21}/cm^3$, although lesser and greater dopant concentrations may also be employed.

According to an aspect of the present disclosure, the gate strips (50, 52, 53S) cover the entire inter-gate region of the shallow trench isolation structure 20 located between a neighboring pair of transistor active regions 10A. Thus, the additional electrical dopants of the second conductivity type are not implanted into portions of the transistor active regions 10A that are proximal to the widthwise edges of gate electrodes to be subsequently patterned from the gate strips (50, 52, 53S). Thus, the lateral spacing between neighboring pairs of semiconductor active regions 10A may be reduced without collateral implantation of dopants of the second conductivity type into peripheral portions of the semiconductor active regions 10A that are proximal to the widthwise edges of the gate electrodes (i.e., in the gate fringe region) to be subsequently patterned from the gate strips (50, 52, 53S).

Unimplanted portions of each transistor active region 10A constitutes a channel region 36. Each channel region 36 may be in a range from $1.0\times10^{14}/cm^3$ to $1.0\times10^{18}/cm^3$, although lesser and greater dopant concentrations may also be employed. Each contiguous combination of a respective one of source/drain extension regions (31, 39) and a respective one of the deep source/drain region (32, 38) constitutes a source/drain region, which may be a source region (31, 32) including a combination of a source extension region 31 and a deep source region 32, or may be drain region (38, 39) including a combination of a drain extension region 39 and a deep drain region 38. Generally, a source region (32, 32) and a drain region (38, 39) can be formed in portions of each transistor active region 10A that are laterally spaced from each other by a respective channel region 36 in a plan view.

Referring to FIGS. 32A-32D, a photoresist layer 47 can be applied over the gate strips (50, 52, 53S), the dielectric gate spacers 56, and the plurality of semiconductor active regions (i.e., the transistor active regions 10A). The photoresist layer 47 can be lithographically patterned to form openings 47A that straddle portions of the gate strips (50, 52, 53S) that overlie top surfaces of the shallow trench isolation structure 20. The patterned photoresist layer 47 comprises at least one row of openings (which may comprise a plurality of rows of openings) 47A arranged along the second horizontal direction hd2 and located within the areas of the shallow trench isolation structure 20. In one embodiment, each opening 47A in the patterned photoresist layer 47 comprises a pair of first edges that straddle a respective underlying gate strip (50, 52, 53S) and a pair of second edges that overlie a respective dielectric gate spacer 56.

Generally, the patterned photoresist layer 47 can cover the entire area of each of the transistor active regions 10A that is not covered by the gate strips (50, 52, 53S) or the dielectric gate spacers 56. The patterned photoresist layer 47 includes rectangular openings 47A in areas in which the gate strips (50, 52, 53S) are subsequently cut. In other words, the areas of the openings 47A in the patterned photoresist layer 47 correspond to areas from which portions of the gate strips (50, 52, 53S) are subsequently removed. In one embodiment, the patterned photoresist layer 47 comprises a row of openings 47A arranged along the second horizontal direction hd1 and located within the areas of the shallow trench isolation structure 20 and having an areal overlap with a respective portion of an underlying gate strip (50, 52, 53S). In one embodiment, a row of rectangular openings 47A can be formed in the patterned photoresist layer 47 over each gate strip (50, 52, 53S).

In one embodiment, each of the rectangular openings 47A in the patterned photoresist layer 47 can have a pair of first straight sidewalls and a pair of second straight sidewalls. The pair of first straight sidewalls can laterally extend along the first horizontal direction hd1 and having a greater length than the gate length GL (i.e., the lateral dimension along the first horizontal direction hd1) of the underlying gate strip (50, 52, 53S). In one embodiment, the pair of first straight sidewalls can overlie a respective one of the transistor active regions 10A, i.e., can have an areal overlap with the respective one of the transistor active regions 10A in a plan view along a vertical direction that is perpendicular to the top surface of the semiconductor substrate 8. The pair of second sidewalls can laterally extend along the second horizontal direction hd2, overlie and contact a top surface of a respective dielectric gate spacer 56, and does not have an areal overlap with the underlying gate strip (50, 52, 53S). The pair of second sidewalls of each opening 47A in the patterned photoresist layer 47 may have an areal overlap with peripheral regions of a neighboring pair of transistor active regions 10A.

A top surface segment of a second semiconductor gate electrode strip 53S and two segments of outer sidewalls of a dielectric gate spacer 56 can be physically exposed within the area of each opening 47A in the patterned photoresist layer 47. The width of each rectangular opening in the patterned photoresist layer 47 along the second horizontal direction hd2 can be greater than the lateral spacing between a neighboring pair of transistor active regions 10A along the second horizontal direction hd2, and can be less than the lateral spacing between a neighboring pair of gate dielectrics 50 that are laterally spaced along the second horizontal direction hd2. The openings 47A in the patterned photoresist layer 47 do not have any areal overlap with the gate dielectrics 50. The length of each rectangular opening 47A in the patterned photoresist layer 47 along the first horizontal direction hd1 can be greater than the gate length of an underlying gate strip (50, 52, 53S), which is the width of the underlying gate strip (50, 52, 53S) along the first horizontal direction hd1.

An anisotropic etch process can be performed to etch unmasked portions of the gate strips (50, 52, 53S) and the dielectric gate spacers 56. The pattern of rows of openings 47A in the patterned photoresist layer 47 can be transferred through the gate strips (50, 52, 53S) and into unmasked areas of the dielectric gate spacers 56. Unmasked portions of the offset spacers 55 can be collaterally vertically recessed during the anisotropic etch process. The shallow trench isolation structure 20 is masked by the patterned photoresist layer 47, and is not etched during the anisotropic etch process.

The pattern of the rows of openings in the patterned photoresist layer 47 can be transferred through the gate strips (50, 52, 53S) and into unmasked portions of the dielectric gate spacers 56 by the anisotropic etch process. Unmasked portions of the gate strips (50, 52, 53S) are removed by the anisotropic etch process, and remaining portions of the gate strips (50, 52, 53S) comprise a plurality of gate stacks (50, 52, 53).

Each gate strip (50, 52, 53S) can be divided into the gate stacks (50, 52, 53) by removing unmasked portions of the respective gate strip (50, 52, 53S). Each gate electrode strip (52, 53S) can be divided into a respective plurality of gate electrodes (52, 53) that are laterally spaced apart along the second horizontal direction hd2 and overlies a respective one of the plurality of semiconductor active regions 10A. Each gate stack (50, 52, 53) includes a vertical stack of a gate dielectric 50, a first semiconductor gate electrode portion 52, and a second semiconductor gate electrode portion 53. Each second semiconductor gate electrode portion 53 is a patterned portion of a respective second semiconductor gate electrode strip 53S. Each of the gate dielectrics 50 is one of a plurality of gate dielectrics 50 within a respective one of the gate strips (50, 52, 53S). Each contiguous combination of a first semiconductor gate electrode portion 52 and a second semiconductor gate electrode portion 53 constitutes a gate electrode (52, 53). Thus, each of the gate electrodes (52, 53) is a patterned portion of a respective gate electrode strip (52, 53S).

Each gate stack (50, 52, 53) is formed over a respective one of the transistor active regions 10A. Each gate stack comprises a gate dielectric 50 and a gate electrode (52, 53).

In one embodiment, the anisotropic etch process etches the materials of the gate strips (50, 52, 53S) at a higher etch rate than the material of the dielectric gate spacers 56. A pair of stepped sidewalls can be formed on each dielectric gate spacer 56 underneath each opening in the patterned photoresist layer 47.

In one embodiment, each dielectric gate spacer 56 comprises over-active-region gate spacer portions 56A overlying the semiconductor active regions 10A, as shown in FIG. 18C. The over-active-region gate spacer portions 56A comprises straight inner sidewalls that are perpendicular to the first horizontal direction hd1 and laterally spaced apart by a first spacing S1, which is also referred to as a gate spacer inner sidewall spacing, i.e., the spacing between a pair of inner sidewalls of a dielectric gate spacer 56. In one embodiment, each dielectric gate spacer 56 also comprises inter-active-region gate spacer portions 56B overlying portions of the shallow trench isolation structure 20. The inter-active-region gate spacer portion 56B comprises stepped sidewalls including a lower straight sidewall segment 56L adjoined to, and located within same vertical planes as, a respective pair of straight inner sidewalls of neighboring over-active-region gate spacer portions 56A, an upper straight sidewall segment 56U that is laterally offset from the lower straight sidewall segment, and a connecting horizontal surface 56H that is adjoined to a top edge of the lower straight sidewall segment and to a bottom edge of the upper straight sidewall segment. A pair of upper straight sidewall segments 56U of two inter-active-region gate spacer portions 56B located within a same opening 47A in the patterned photoresist layer 47 can be laterally spaced apart from each other by a second spacing S2', which is herein referred to as a gate spacer upper inner sidewall segment spacing. A lateral distance between outer sidewalls of each dielectric gate spacer 56 along the first horizontal direction hd1 can be uniform, and is herein referred to as a third spacing S3, which is also referred to as a gate spacer outer sidewall spacing. The second spacing S2' can be less than the third spacing S3.

In one embodiment, the shallow trench isolation structure 20 can have a planar top surface located in a horizontal plane and at least within areas that are covered by the patterned photoresist layer 47 or by the dielectric gate spacers 56. The lower straight sidewall segments 56L of the inter-active-region gate spacer portions 56B can contact the planar top surface of the shallow trench isolation structure 20. In one embodiment, each of the upper straight sidewall segments 56U of the inter-active-region gate spacer portions 56B has a respective top edge that that is adjoined to a top edge of a respective segment of a concave outer sidewall of the inter-active-region gate spacer portions 56B of the dielectric gate spacers 56.

In one embodiment, the shallow trench isolation structure 20 comprises inter-gate regions located between a neighboring pair of semiconductor active regions 10A and within an area enclosed by an outer periphery of a respective dielectric gate spacer 56. A pair of the inter-active-region gate spacer portions 56B overlies each of the inter-gate regions. In one embodiment, upper straight sidewall segments 56U of the pair of inter-active-region gate spacer portions 56B are laterally spaced from each other along the first horizontal direction hd1 by a gate spacer upper inner sidewall segment spacing (such as the second spacing S2'). Lower straight sidewall segments 56L of the pair of inter-active-region gate spacer portions 56B are laterally spaced apart from each other along the first horizontal direction by a gate spacer inner sidewall spacing (such as the first spacing S1) that is less than the gate spacer upper inner sidewall segment spacing. In embodiments in which the offset spacers 55 are omitted, the gate spacer inner sidewall spacing (such as the first spacing S1) may be the same as the gate length. In one embodiment, a pair of straight inner sidewalls of each of the over-active-region gate spacer portions 56A can be laterally spaced apart along the first horizontal direction by the gate spacer inner sidewall spacing (such as the first spacing S1).

Generally, each gate strip (50, 52, 53S) can be divided into the gate stacks (50, 52, 53) by removing portions of the gate strip (50, 52, 53S) that are overlie the inter-electrode regions 20I of the shallow trench isolation structure 20 after forming the source/drain extension regions (31,39) and after forming the deep source/drain regions (32, 38).

Referring to FIGS. 33A-33E, the patterned photoresist layer 47 can be removed, for example, by ashing. In one embodiment, the straight inner sidewalls of the over-active-region gate spacer portions 56A vertically extend at least from a first horizontal plane HP1 including bottom surfaces of the gate electrodes (52, 53) and at least to a second horizontal plane HP2 including top surfaces of the gate electrodes (52, 53). The entirety of the connecting surfaces of the over-active-region gate spacer portions 56A is located above the first horizonal plane HP1 and below the second horizontal plane HP2. In one embodiment, the straight inner sidewalls of the over-active-region gate spacer portions 56A contact top surfaces of the source regions (31, 32) and the drain regions (38, 39).

Referring to FIGS. 34A-34D, a metal layer can be deposited over the fourth exemplary structure. The metal layer comprises, and/or consists essentially of, a metal that forms a silicide with the semiconductor materials of the transistor active regions 10A and the upper semiconductor gate electrode sub-portions 53. For example, the semiconductor materials of the transistor active regions 10A and the upper semiconductor gate electrode sub-portions 53 may include amorphous silicon, polysilicon, or a silicon-germanium alloy, and the metal layer can comprise, and/or can consist essentially of, at least one metal selected from tungsten, titanium, tantalum, cobalt, molybdenum, platinum, and/or nickel. The metal layer may be deposited by physical vapor deposition or chemical vapor deposition. The thickness of horizontally-extending portions of the metal layer may be in a range from 6 nm to 60 nm, such as from 12 nm to 30 nm, although lesser and greater thicknesses may also be employed.

A thermal or flash lamp anneal process can be performed to induce a reaction between the metal layer and the underlying semiconductor material portions by silicide process. Surface portions of the upper semiconductor gate electrode sub-portions 53 (which are surface portions of the semiconductor gate electrode portions (52, 53)) are converted into gate silicide regions 59 by reacting with the metal. Surface portions of the deep source/drain regions (32, 38) are converted into source/drain silicide regions (33, 37) by reacting with the metal. Unreacted portions of the metal layer can be removed selective to the silicide materials of the gate silicide regions 59 and the source/drain silicide regions (33, 37). Each of the silicide materials of the gate silicide regions 59 and the source/drain silicide regions (33, 37) may have a thickness in a range from 2 nm to 60 nm, such as from 4 nm to 30 nm, although lesser and greater thicknesses may also be employed.

In one embodiment, a gate silicide region 59 can comprise a first horizontally-extending portion contacting a top surface of an underlying upper semiconductor gate electrode sub-portion 53, a pair of vertically-extending portions contacting a respective sidewall segment of the underlying upper semiconductor gate electrode sub-portion 53 and a respective sidewall segment of an underlying lower semiconductor gate electrode sub-portion 52, and a pair of second horizontally-extending portions contacting recessed horizontal surfaces of the underlying lower semiconductor gate electrode sub-portion 52.

Referring to FIGS. 35A-35D, at least one dielectric material layer (62, 64, 80) can be deposited over the second exemplary structure. In one embodiment, the at least one dielectric material layer (62, 64, 80) comprises a vertical stack comprising at least one conformal dielectric liner (62, 64) and a contact-level dielectric layer 80 overlying the at least one conformal dielectric liner (62, 64). Each of the at least one dielectric liner (62, 64) can be deposited over the physically exposed surfaces of the gate stacks (50, 52, 53), the dielectric gate spacers 56, the source regions (31, 32), and the drain regions (38, 39) by at least one conformal deposition process. The at least one dielectric liner (62, 64) may comprise, for example, a stack of a silicon oxide liner 62 and a silicon nitride liner 64. A contact-level dielectric layer 80 can be deposited over the gate stacks (50, 52, 53), the source/drain regions {(31, 32), (38, 39)}, the shallow trench isolation structure 20, and the optional at least one dielectric liner (62, 64). The contact-level dielectric layer 80 comprises a dielectric material, such as silicon oxide. A planarization process such as a chemical mechanical planarization process can be optionally performed to planarize the top surface of the contact-level dielectric layer 80. The vertical distance between the top surface of the contact-level dielectric layer 80 and the top surfaces of the gate electrodes (52, 53, 59) may be in a range from 50 nm to 500 nm, although lesser and greater vertical distances may also be employed. The contact via structures (82, 85, 88) are then formed through the contact-level dielectric layer 80 as described above.

Figure 35E:
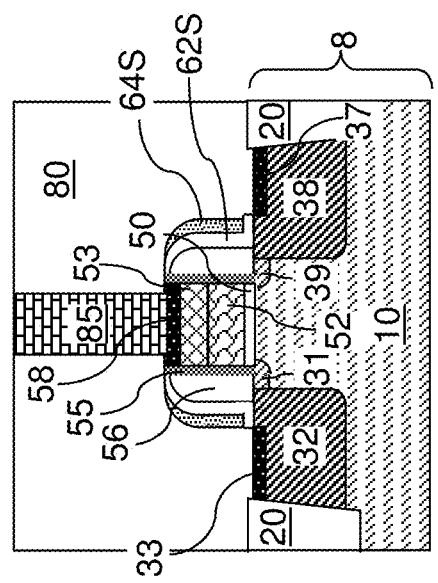

FIG. 35E illustrates an alternative configuration of the alternative third exemplary structure of the third embodiment. In this alternative configuration, the at least one dielectric liner (62, 64) shown in FIGS. 35A-35D is deposited prior to depositing the metal layer which forms the silicide regions (33, 37, 59) by the salicide process. An anisotropic sidewall spacer etch process is used to etch the at least one dielectric liner (62, 64) to form additional sidewalls spacers (62S, 64S) on the side of the gate electrode (52, 53). After forming the additional sidewall spacers (62S 64S), the metal layer is deposited over the alternative third exemplary structure, including over the additional sidewall spacers (62S 64S). The salicide process anneal is then conducted to form the silicide regions (33, 37, 59) of the alternative third exemplary structure, as described above with respect to FIGS. 34A-34D.

Referring to FIGS. 30A-35E and related drawings and according to the fourth embodiment of the present disclosure, a semiconductor structure is provided, which comprises: first and second field effect transistors (200A, 200B), wherein each of the first and second field effect transistors (200A, 200B) comprises: a semiconductor active region 10A including a source region (31, 32), a channel region, and a drain region (38, 39) arranged along a first horizontal direction hd1; a gate dielectric 50 contacting a top surface of the channel region; a gate electrode (52, 53, 59) overlying the gate dielectric 50 and comprising a semiconductor gate electrode portion (52, 53) and a gate silicide region 59; a pair of dielectric gate spacers 56 located on opposite sides of the gate electrode (52, 53, 59); and a shallow trench isolation structure 20 which laterally surrounds each of the semiconductor active regions 10A of the first and second two field effect transistors (200A, 200B), wherein each of the pair of dielectric gate spacers 56 comprises: over-active-region gate spacer portions 56A overlying the semiconductor active regions 10A; and inter-active-region gate spacer portions 56B overlying portions of the shallow trench isolation structure 20 and comprising stepped sidewalls.

In one embodiment, each of the stepped sidewalls includes: a lower straight sidewall segment 56L adjoined to a respective pair of straight inner sidewalls; an upper straight sidewall segment 56U that is laterally offset from the lower straight sidewall segment 56L; and a connecting surface 56H that is adjoined to a top edge of the lower straight sidewall segment 56L and to a bottom edge of the upper straight sidewall segment 56U.

In one embodiment, the shallow trench isolation structure 20 has a planar top surface located in a horizontal plane and within areas that are not covered by the gate electrodes (52, 53, 59); and the lower straight sidewall segments 56L contact the planar top surface of the shallow trench isolation structure 20.

In one embodiment, the over-active-region gate spacer portions 56B comprise straight inner sidewalls that are perpendicular to the first horizontal direction hd1. In one embodiment, the straight inner sidewalls vertically extend at least from a first horizontal plane including bottom surfaces of the gate electrodes (52, 53, 59) and at least to a second horizontal plane including top surfaces of the gate electrodes (52, 53, 59).

In one embodiment, each of the first and second field effect transistors (200A, 200B) comprises: a source silicide region 33 in contact with a respective source region (31, 32); and a drain silicide region 37 in contact with a respective drain region (38, 39).

In one embodiment, each of the source silicide regions 33 and the drain silicide regions 37 of the first and second field effect transistors (200A, 200B) contact a sidewall of a respective one of the pair of dielectric gate spacers 56.

In one embodiment, the shallow trench isolation structure 20 comprises inter-gate regions 20I located between a neighboring pair of semiconductor active regions 10A and within an area enclosed by an outer periphery of the pair of dielectric gate spacers 56; and a pair of inter-active-region gate spacer portions 56B among the inter-active-region gate spacer portions 56B overlies each of the inter-gate regions 20I.

The various embodiments of the present disclosure can be employed to provide semiconductor structures including a plurality of field effect transistors having a reduced lateral spacing between neighboring pairs of semiconductor active regions 10A, and thus, having a high transistor density. Furthermore, the silicide regions reduce the gate, source and drain resistivity.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
    first and second field effect transistors, wherein each of the first and second field effect transistors comprises:
        a semiconductor active region including a source region, a channel region, and a drain region arranged along a first horizontal direction;
        a gate dielectric contacting a top surface of the channel region;
        a gate electrode overlying the gate dielectric and comprising a semiconductor gate electrode portion and a gate silicide region; and
        a dielectric gate spacer laterally surrounding the gate electrode; and
    a shallow trench isolation structure which laterally surrounds each of the semiconductor active regions of the first and second two field effect transistors,
    wherein the shallow trench isolation structure comprises two via cavities that are laterally spaced apart along the first horizontal direction; and
    the dielectric gate spacers of the first and the second field effect transistors contain downward-protruding portions which fill the two via cavities in the shallow trench isolation structure.

2. The semiconductor structure of claim 1, wherein the two via cavities are connected by a planar top surface of the shallow trench isolation structure, and are located in an inter-gate region between the gate electrodes of the first and second field effect transistors.

3. The semiconductor structure of claim 1, wherein each of the first and second field effect transistors comprises:
    a source silicide region in contact with a respective source region; and
    a drain silicide region in contact with a respective drain region.

4. The semiconductor structure of claim 3, wherein each of the source silicide regions and the drain silicide regions of the first and second field effect transistors contact a sidewall of a respective one of the dielectric gate spacers.

5. The semiconductor structure of claim 1, wherein each semiconductor gate electrode portion of the first and second field effect transistors comprises:
    a lower semiconductor gate electrode sub-portion contacting a top surface of a respective one of the gate dielectrics; and
    an upper semiconductor gate electrode sub-portion that overlies the lower semiconductor gate electrode portion and contacting a respective top surface segment of the shallow trench isolation structure.

6. The semiconductor structure of claim 1, wherein each inter-gate region of the shallow trench isolation structure comprises:
    a pair of topmost horizontal surface segments contacting a respective bottom surface segment of a neighboring pair of gate electrodes; and
    an intermediate horizontal surface segment that is adjoined to the topmost horizontal surface segments by a pair of vertical surface segments and located between a respective pair of via cavities.

7. The semiconductor structure of claim 6, wherein the intermediate horizontal surface segment is located above a planar top surface of the shallow trench isolation structure that connects upper edges of the two cavities.

8. A semiconductor structure comprising:
    first and second field effect transistors, wherein each of the first and second field effect transistors comprises:
        a semiconductor active region including a source region, a channel region, and a drain region arranged along a first horizontal direction;
        a gate dielectric contacting a top surface of the channel region;
        a gate electrode overlying the gate dielectric and comprising a semiconductor gate electrode portion and a gate silicide region; and
        a pair of dielectric gate spacers located on opposite sides of the gate electrode; and
    a shallow trench isolation structure which laterally surrounds each of the semiconductor active regions of the first and second two field effect transistors,
    wherein each of the pair of dielectric gate spacers comprises:
        over-active-region gate spacer portions overlying the semiconductor active regions; and
        inter-active-region gate spacer portions overlying portions of the shallow trench isolation structure and comprising stepped sidewalls.

9. The semiconductor structure of claim 8, wherein each of the stepped sidewalls includes:
    a lower straight sidewall segment adjoined to a respective pair of straight inner sidewalls;
    an upper straight sidewall segment that is laterally offset from the lower straight sidewall segment; and
    a connecting surface that is adjoined to a top edge of the lower straight sidewall segment and to a bottom edge of the upper straight sidewall segment.

10. The semiconductor structure of claim 9, wherein:
    the shallow trench isolation structure has a planar top surface located in a horizontal plane and within areas that are not covered by the gate electrodes; and
    the lower straight sidewall segments contact the planar top surface of the shallow trench isolation structure.

11. The semiconductor structure of claim 8, wherein the over-active-region gate spacer portions comprise straight inner sidewalls that are perpendicular to the first horizontal direction.

12. The semiconductor structure of claim 11, wherein the straight inner sidewalls vertically extend at least from a first horizontal plane including bottom surfaces of the gate electrodes and at least to a second horizontal plane including top surfaces of the gate electrodes.

13. The semiconductor structure of claim 8, wherein each of the first and second field effect transistors comprises:
    a source silicide region in contact with a respective source region; and
    a drain silicide region in contact with a respective drain region.

14. The semiconductor structure of claim 13, wherein each of the source silicide regions and the drain silicide regions of the first and second field effect transistors contact a sidewall of a respective one of the pair of dielectric gate spacers.

15. The semiconductor structure of claim 8, wherein:

the shallow trench isolation structure comprises inter-gate regions located between a neighboring pair of semiconductor active regions and within an area enclosed by an outer periphery of the pair of dielectric gate spacers; and a pair of inter-active-region gate spacer portions among the inter-active-region gate spacer portions overlies each of the inter-gate regions.

16. A method of forming a semiconductor device, comprising:

forming a shallow trench isolation structure in an upper region of a semiconductor substrate that has a doping of a first conductivity type, wherein the shallow trench isolation structure laterally surrounds a plurality of semiconductor active regions that are patterned portions of the semiconductor substrate;

forming a gate strip comprising a vertical stack of a plurality of gate dielectrics and a gate electrode strip over the plurality of semiconductor active regions, wherein the gate strip continuously extends as a single continuous structure over each of the plurality of semiconductor active regions and covers inter-electrode regions of the shallow trench isolation structure;

forming source/drain extension regions by implanting dopants of a second conductivity type into surface portions of the plurality of semiconductor active regions that are not masked by the gate strip after formation of the gate strip;

forming deep source/drain regions by implanting additional dopants of the second conductivity type into portions of the plurality of semiconductor active regions without implanting the additional dopants of the second conductivity type into the inter-electrode regions of the shallow trench isolation structure; and dividing the gate strip into the gate stacks by removing portions of the gate strip that are overlie the inter-electrode regions of the shallow trench isolation structure after forming the source/drain extension regions and prior to or after forming the deep source/drain regions.

17. The method of claim 16, wherein the portions of the gate strip that are overlie the inter-electrode regions of the shallow trench isolation structure are removed prior to forming the deep source/drain regions.

18. The method of claim 17, further comprising forming dielectric gate spacers around the gate electrodes and over the inter-electrode regions of the shallow trench isolation structure, wherein the dielectric gate spacers prevent implantation of the additional dopants of the second conductivity type into the inter-electrode regions of the shallow trench isolation structure.

19. The method of claim 16, wherein the portions of the gate strip that are overlie the inter-electrode regions of the shallow trench isolation structure are removed after forming the deep source/drain regions.

20. The method of claim 16, wherein:

each of the gate stacks comprises a respective gate dielectric and a respective semiconductor gate electrode portion; and the method further comprises converting a surface portion of each of the semiconductor gate electrode portions into a respective gate silicide region by reacting the surface portion of each of the semiconductor gate electrode portions with a metal.

* * * * *